(12) United States Patent
Guillorn et al.

(10) Patent No.: US 10,074,575 B1
(45) Date of Patent: Sep. 11, 2018

(54) INTEGRATING AND ISOLATING NFET AND PFET NANOSHEET TRANSISTORS ON A SUBSTRATE

(71) Applicant: International Business Machines Corporation, Armonk, NY (US)

(72) Inventors: Michael A. Guillorn, Cold Springs, NY (US); Nicolas J. Loubet, Guilderland, NY (US); Muthumanickam Sankarapandian, Niskayuna, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/629,306

(22) Filed: Jun. 21, 2017

(51) Int. Cl.
| | |
|---|---|
| H01L 21/8238 | (2006.01) |
| H01L 21/02 | (2006.01) |
| H01L 29/06 | (2006.01) |
| H01L 29/423 | (2006.01) |
| H01L 29/786 | (2006.01) |
| H01L 27/092 | (2006.01) |

(52) U.S. Cl.
CPC ........ *H01L 21/823878* (2013.01); *H01L 21/02532* (2013.01); *H01L 21/02603* (2013.01); *H01L 21/823821* (2013.01); *H01L 27/092* (2013.01); *H01L 29/0649* (2013.01); *H01L 29/0673* (2013.01); *H01L 29/42392* (2013.01); *H01L 29/78651* (2013.01); *H01L 29/78684* (2013.01); *H01L 29/78696* (2013.01)

(58) Field of Classification Search
CPC ....... H01L 21/823878; H01L 21/02532; H01L 21/02603; H01L 21/823821; H01L 27/092; H01L 29/0649; H01L 29/0673; H01L 29/42392; H01L 29/78651; H01L 29/78684; H01L 29/78696
See application file for complete search history.

(56) References Cited

U.S. PATENT DOCUMENTS

| | | |
|---|---|---|
| 7,190,007 B2 | 3/2007 | Breitwisch et al. |
| 8,183,104 B2 | 5/2012 | Hobbs et al. |
| 8,513,125 B2 | 8/2013 | Saracco et al. |

(Continued)

FOREIGN PATENT DOCUMENTS

JP          5373718 B2     12/2013

*Primary Examiner* — Karen Kusumakar
(74) *Attorney, Agent, or Firm* — Cantor Colburn LLP; Vazken Alexanian

(57) ABSTRACT

Embodiments of the invention are directed to methods of fabricating nanosheet channel field effect transistors. An example method includes forming a first sacrificial nanosheet and forming a first nanosheet stack over the first sacrificial nanosheet, wherein the first nanosheet stack includes alternating channel nanosheets and sacrificial nano sheets. The method further includes exposing a surface area of the first sacrificial nanosheet and exposing surface areas of the alternating channel nanosheets and sacrificial nanosheets, wherein the exposed surface area of the first sacrificial nanosheet is greater than each of the exposed surface areas of the alternating channel nanosheets and sacrificial nanosheets. The method further includes applying an etchant to the exposed surface areas, wherein the etchant is selective based at least in part on the amount of surface area to which the etchant is applied.

19 Claims, 40 Drawing Sheets

(56) References Cited

U.S. PATENT DOCUMENTS

| | | | |
|---|---|---|---|
| 8,796,772 | B2 | 8/2014 | Yeh et al. |
| 9,330,984 | B1 | 5/2016 | Leobandung et al. |
| 9,349,861 | B1 | 5/2016 | Cheng et al. |
| 9,356,046 | B2 | 5/2016 | Cheng et al. |
| 9,741,792 | B2 * | 8/2017 | Cheng ................. H01L 29/0673 |
| 2014/0225065 | A1 * | 8/2014 | Rachmady ........ H01L 29/42392 257/24 |
| 2015/0102454 | A1 | 4/2015 | Cheng et al. |
| 2015/0340381 | A1 | 11/2015 | Ramachandran et al. |
| 2016/0118472 | A1 | 4/2016 | Qi |
| 2016/0133528 | A1 | 5/2016 | Cheng et al. |
| 2016/0141395 | A1 | 5/2016 | Cheng et al. |

* cited by examiner

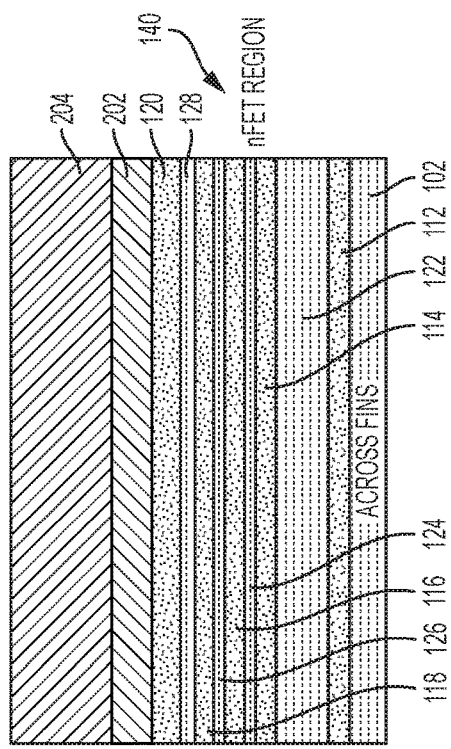
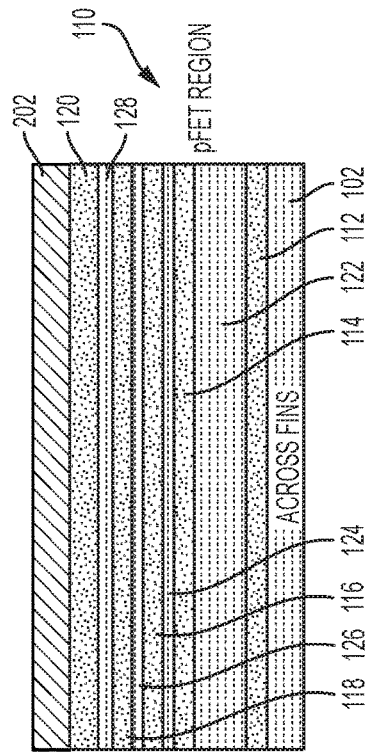
FIG. 2A  FIG. 2B
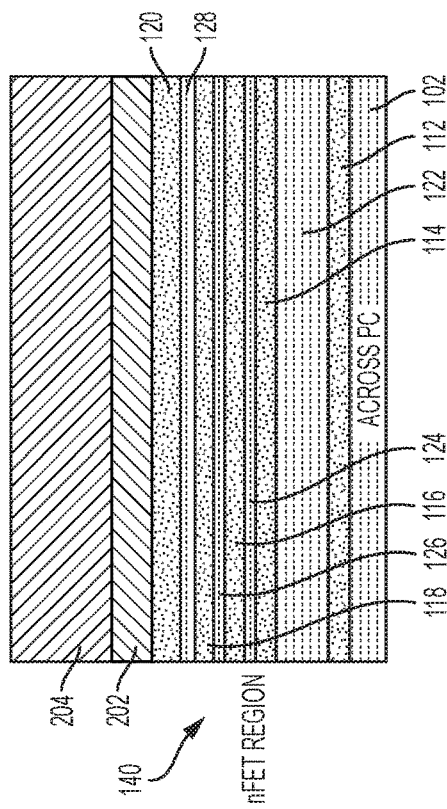
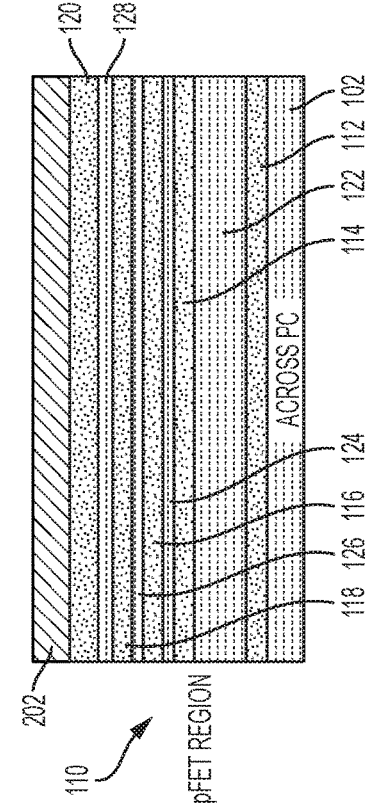
FIG. 2C  FIG. 2D

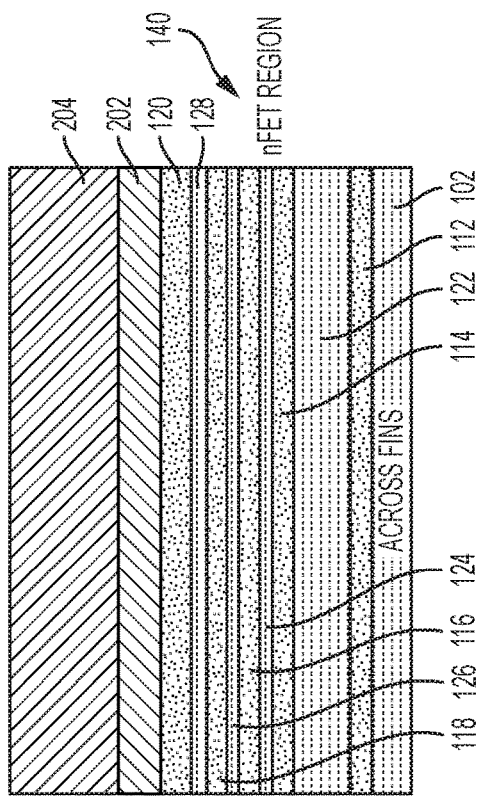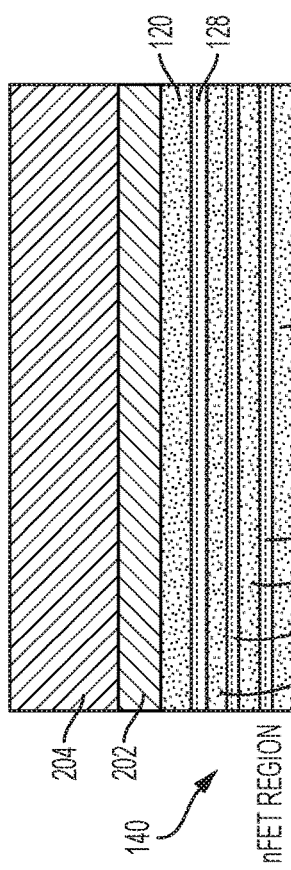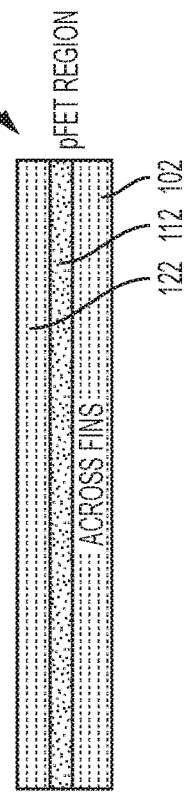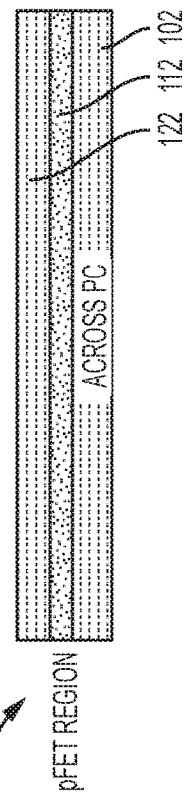
FIG. 3A
FIG. 3B
FIG. 3C
FIG. 3D

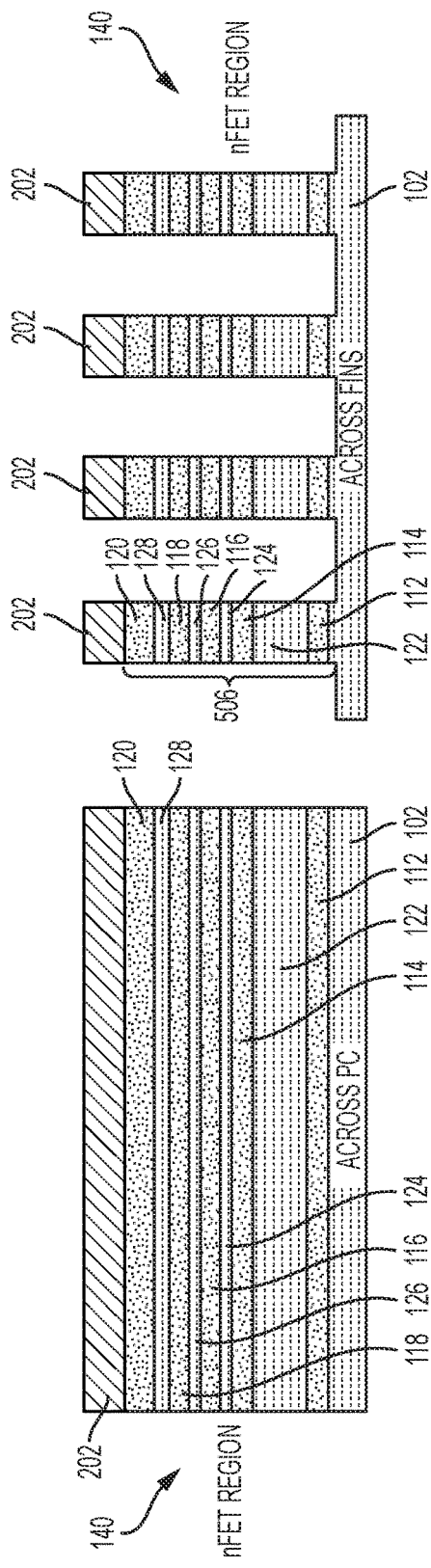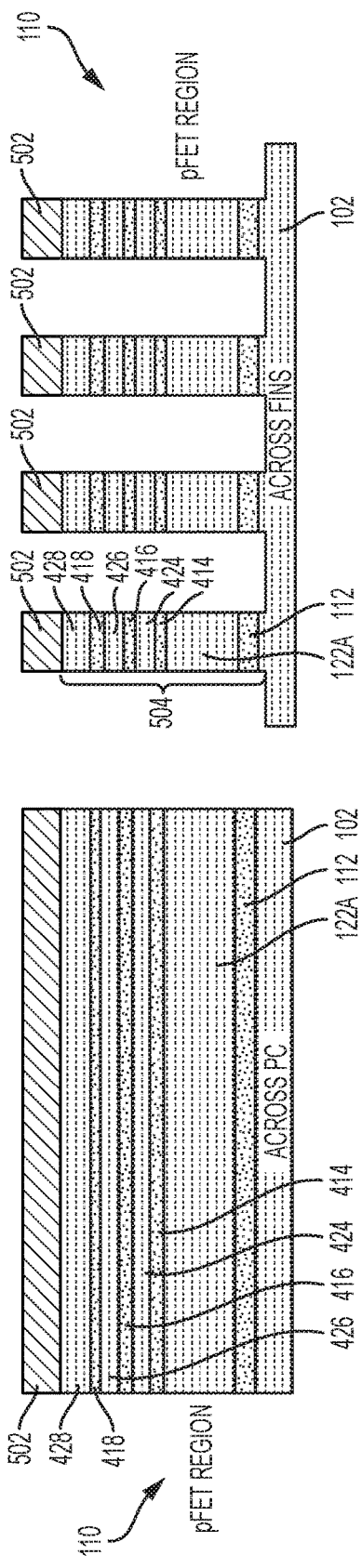

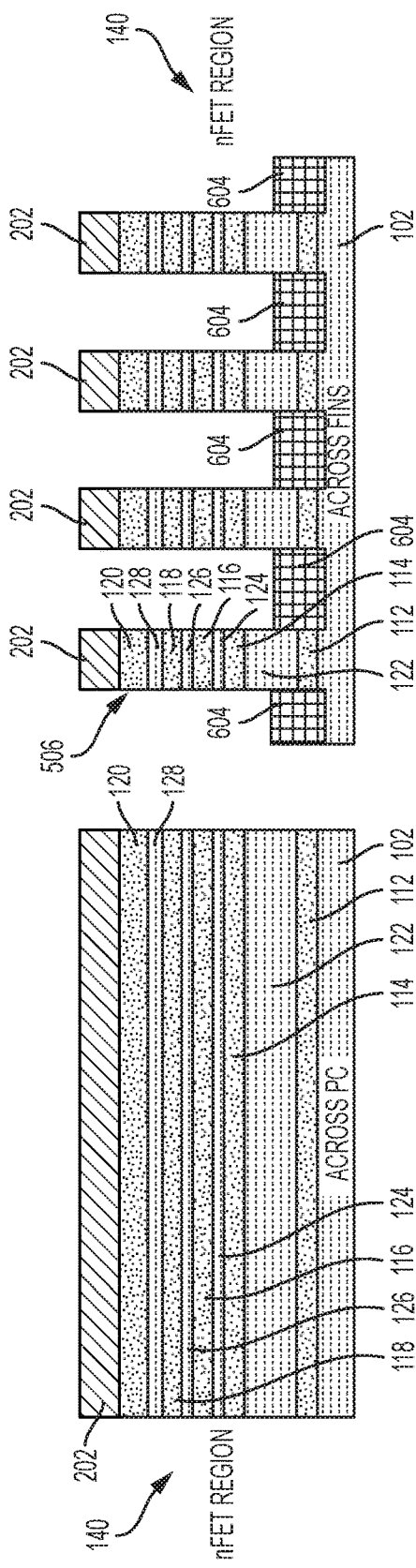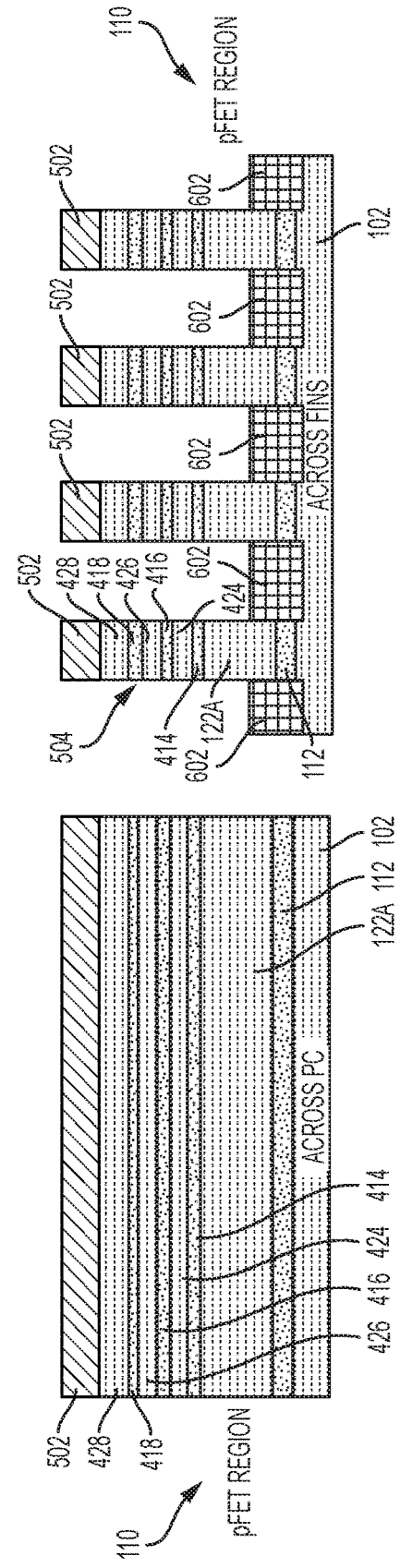

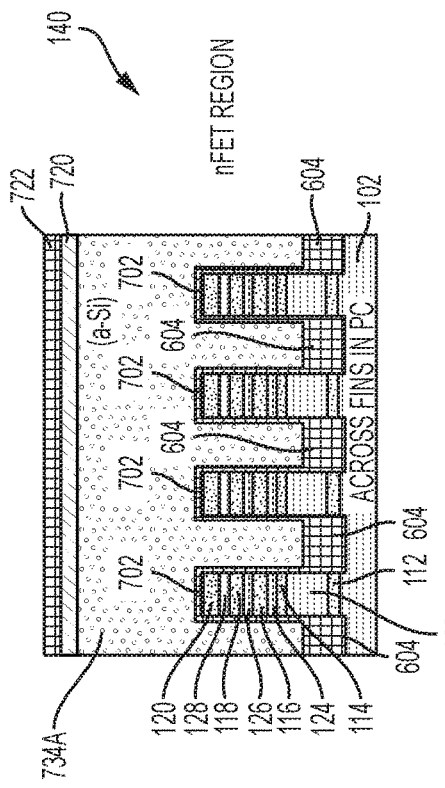
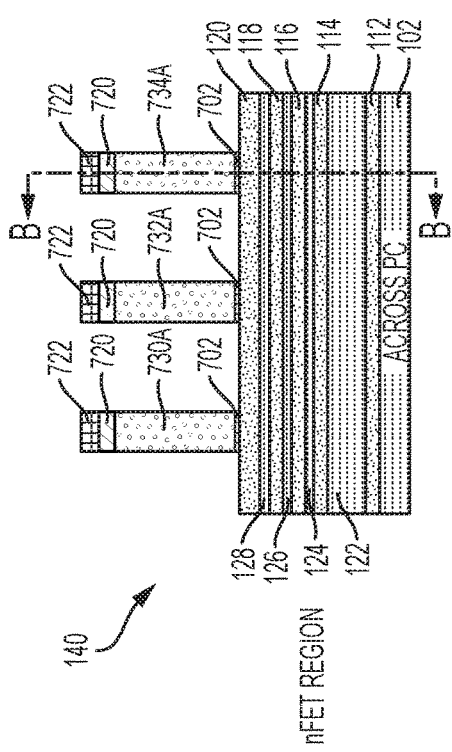
FIG. 7A
FIG. 7B
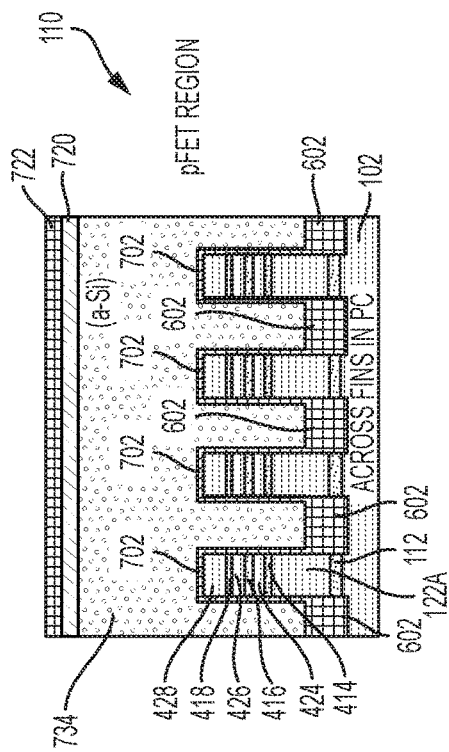
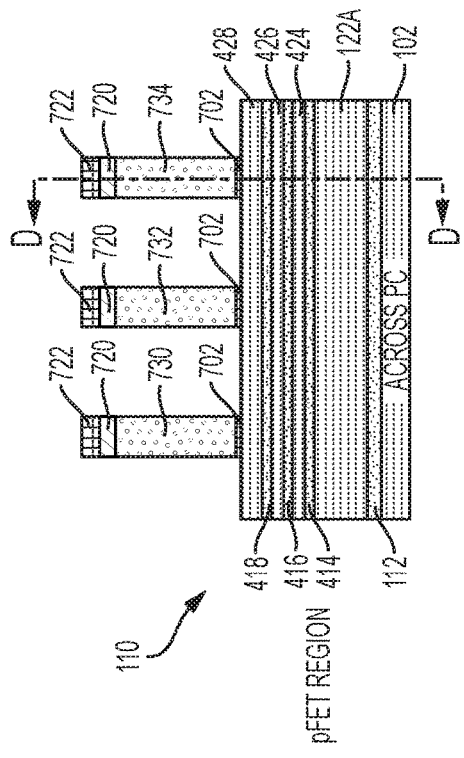
FIG. 7C
FIG. 7D

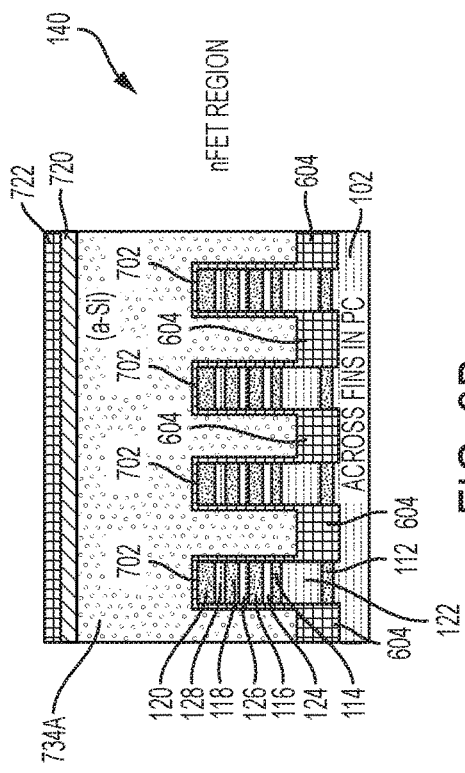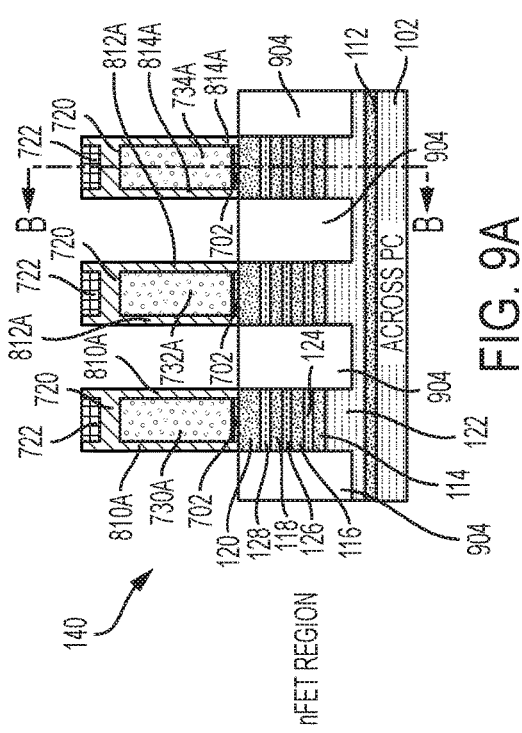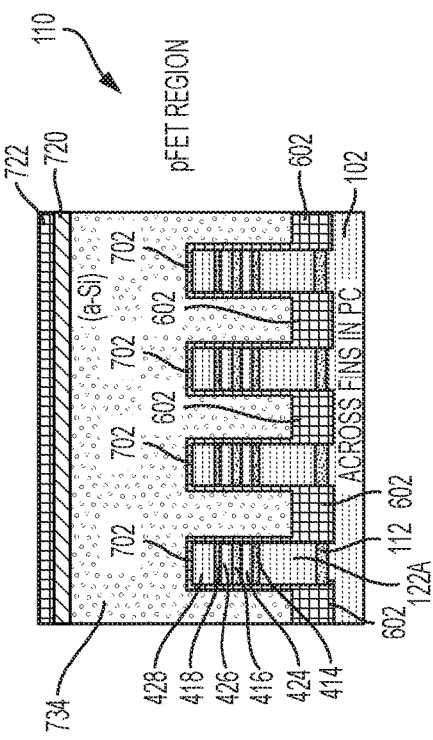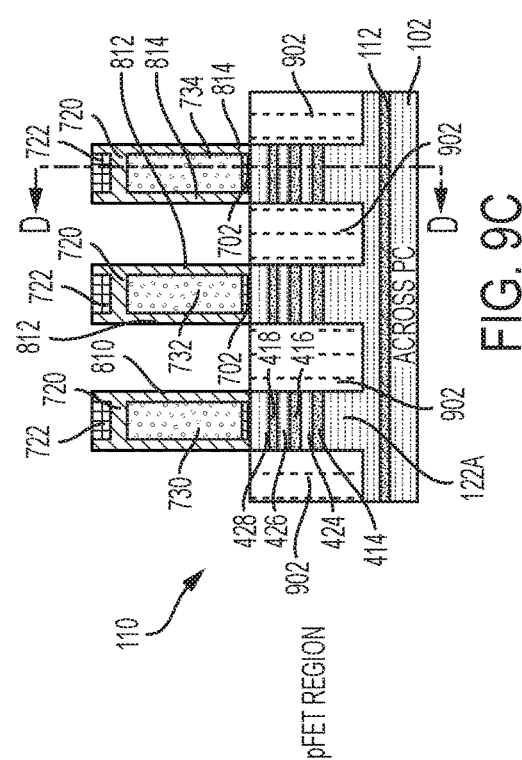

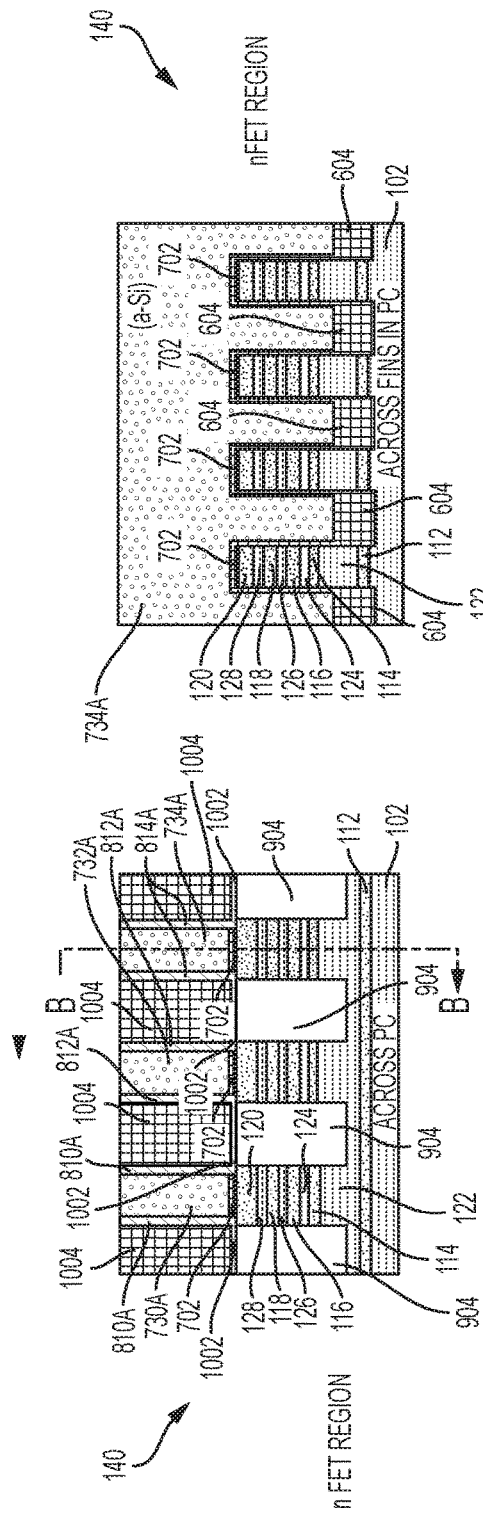
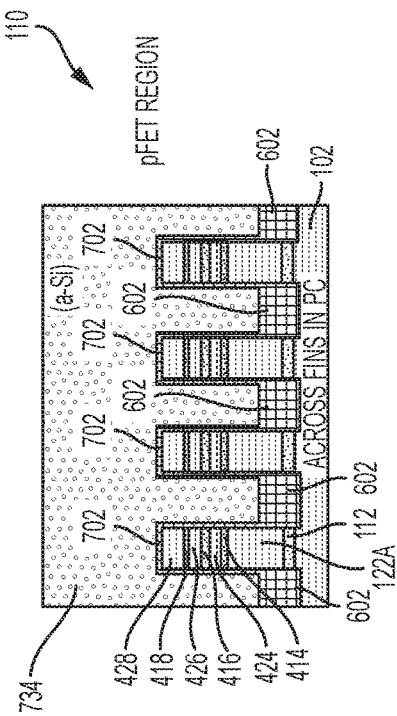
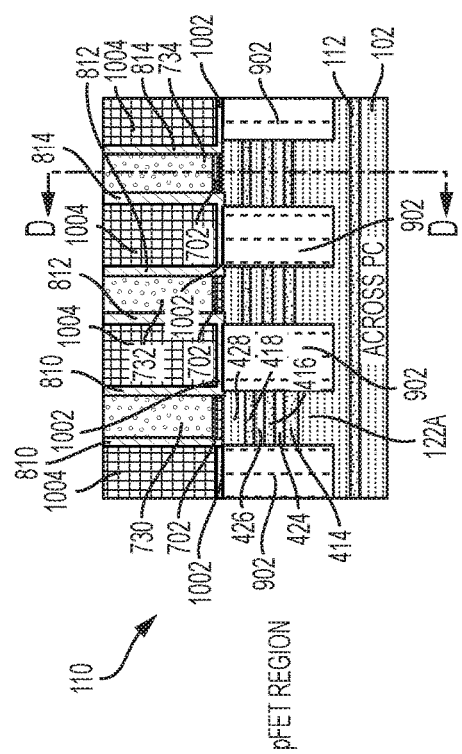
FIG. 10A
FIG. 10B
FIG. 10C
FIG. 10D

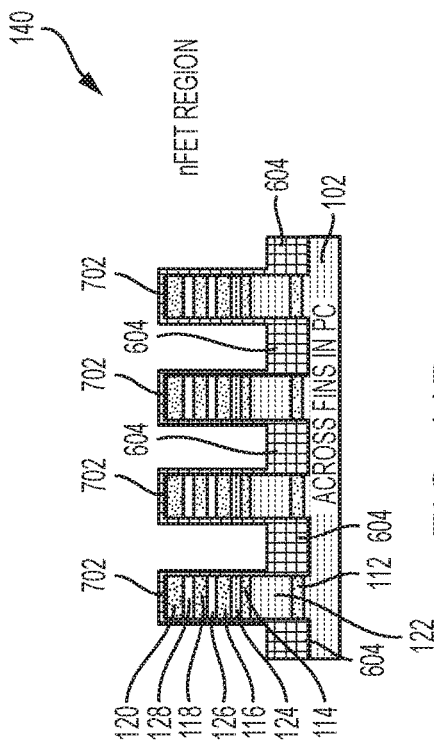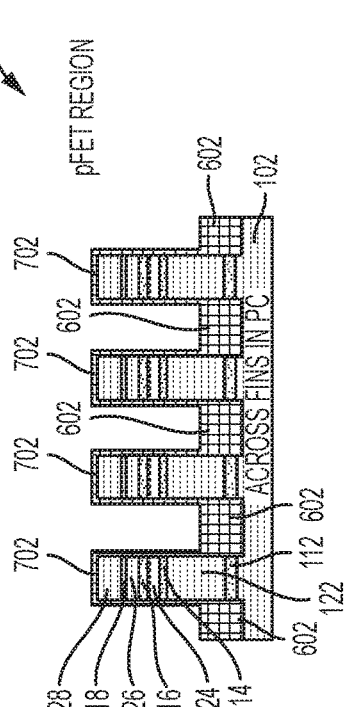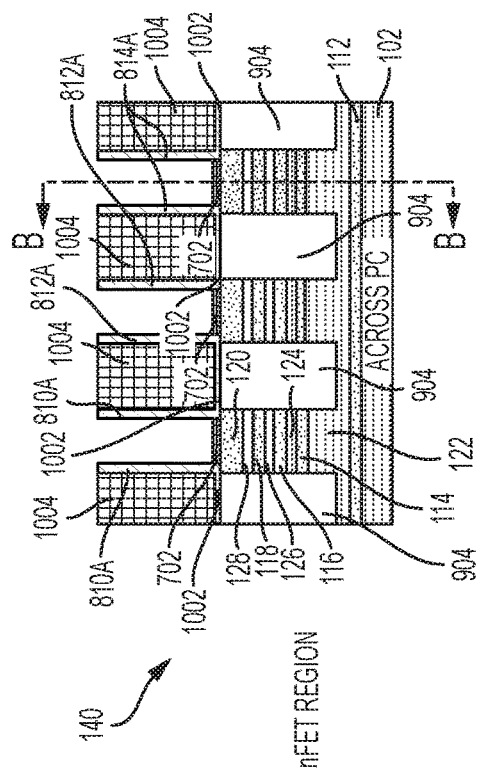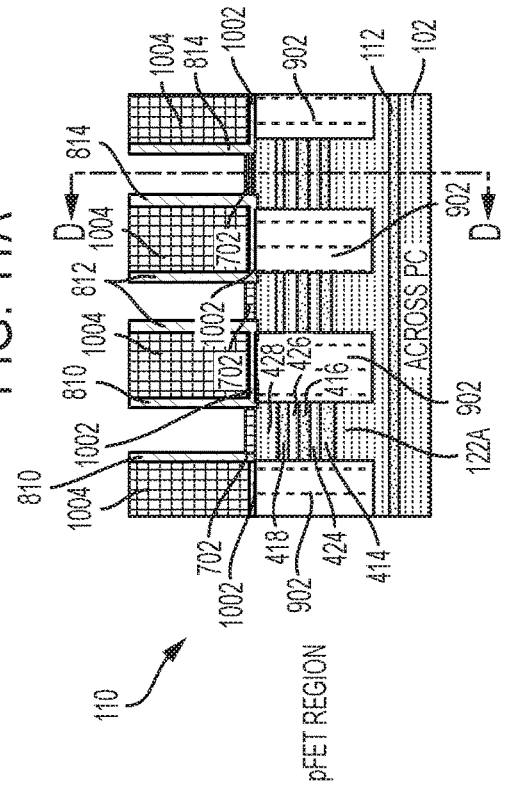

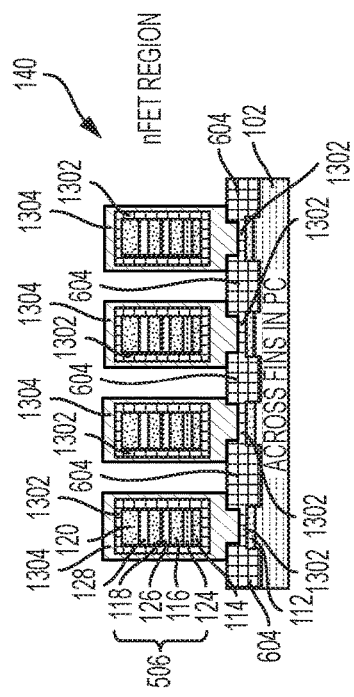
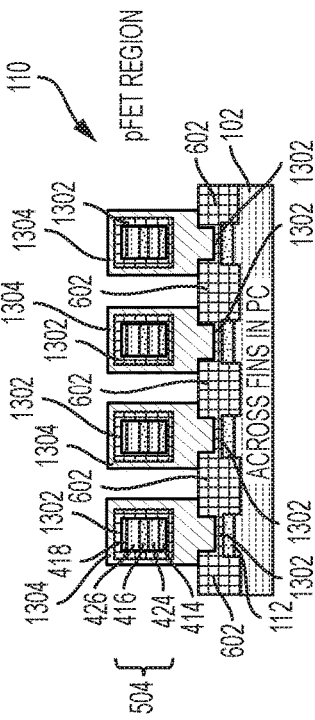
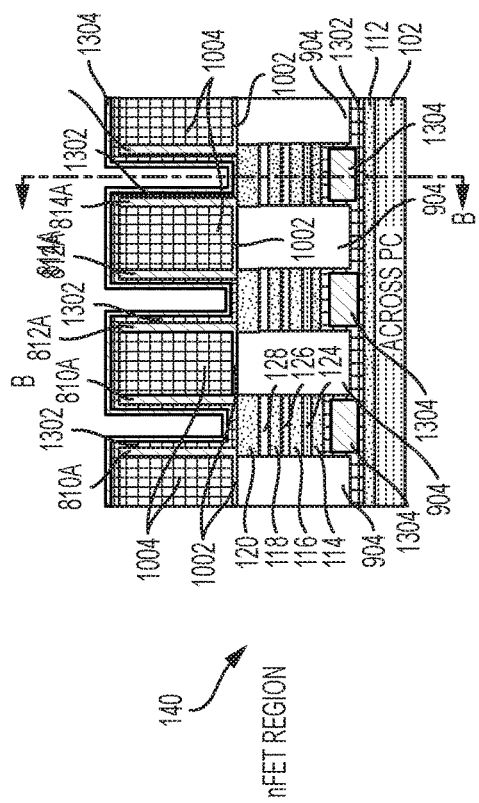
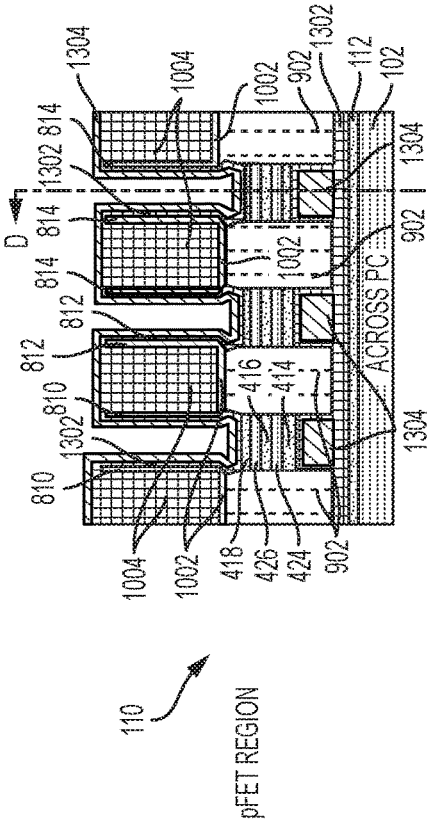
FIG. 13A
FIG. 13B
FIG. 13C
FIG. 13D

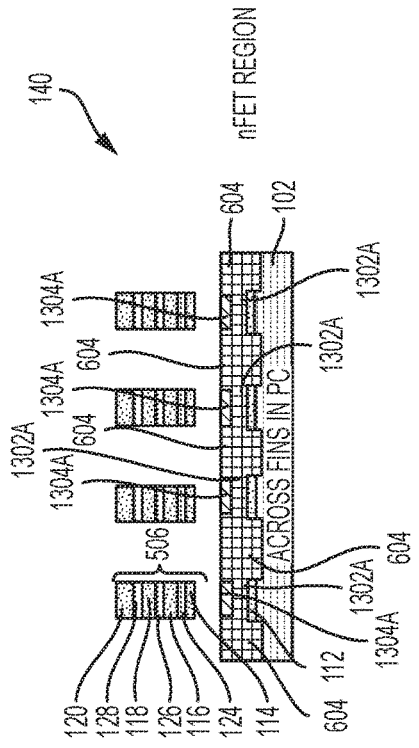
FIG. 14A
FIG. 14B
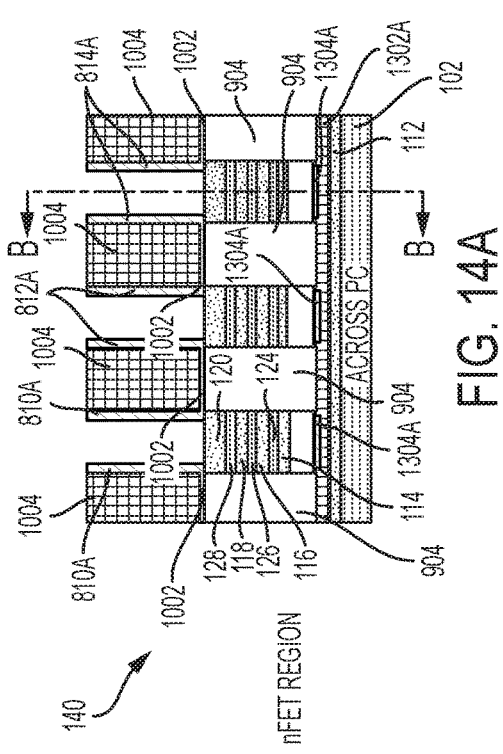
FIG. 14C
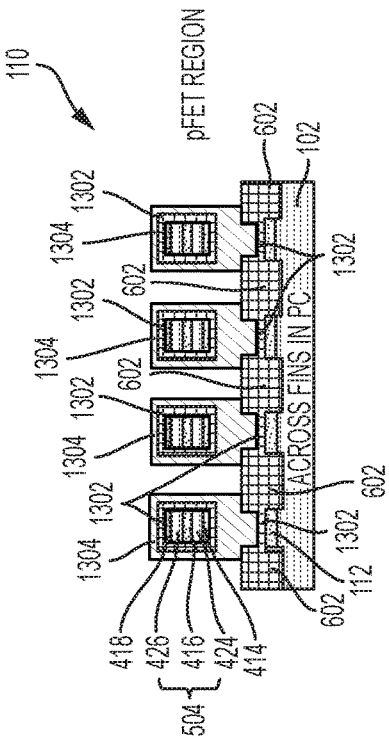
FIG. 14D
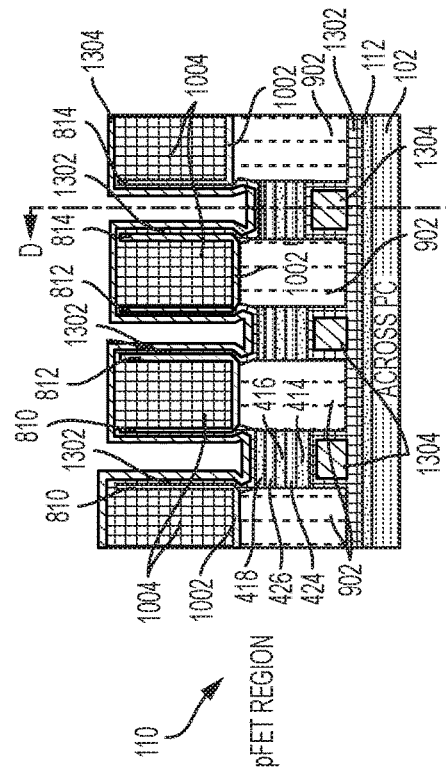

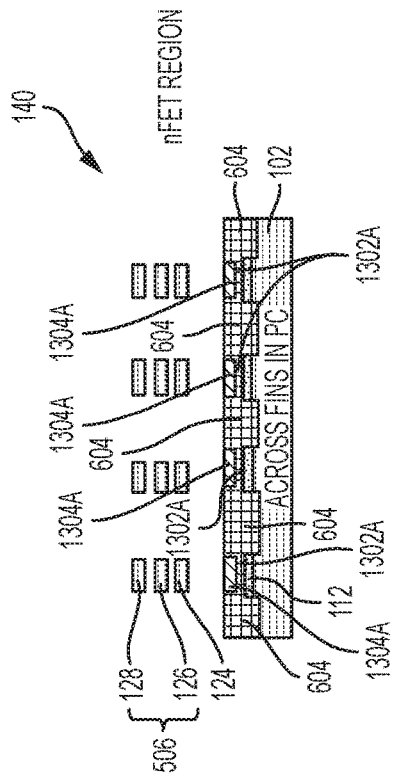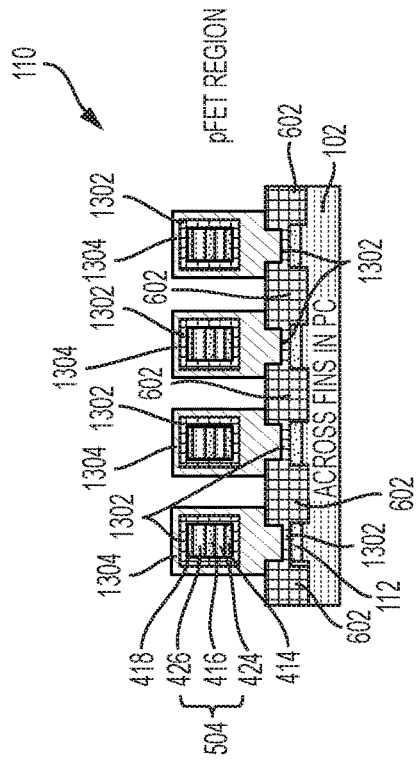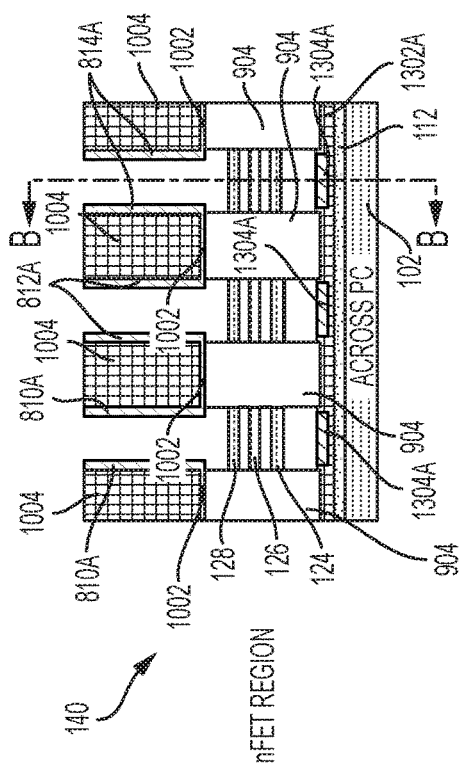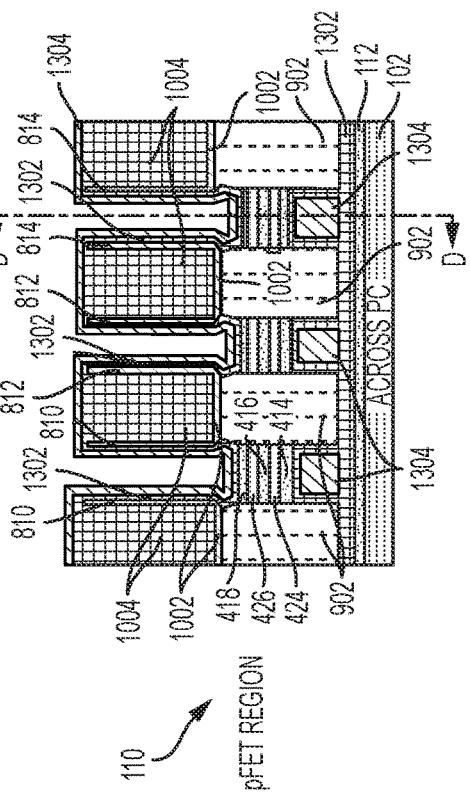

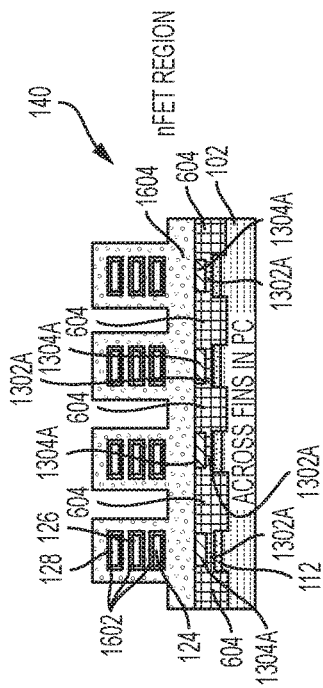
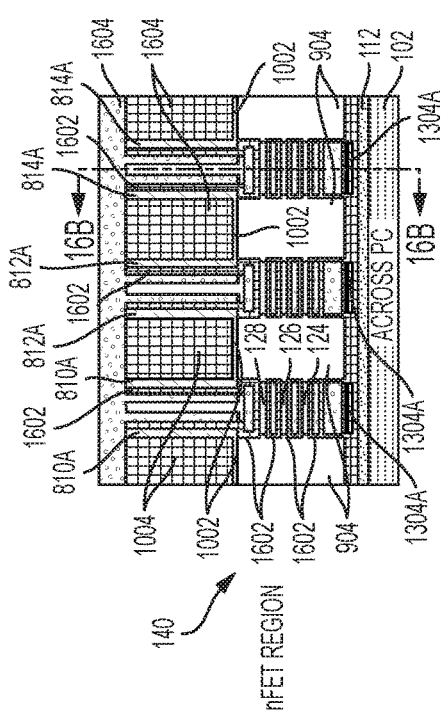
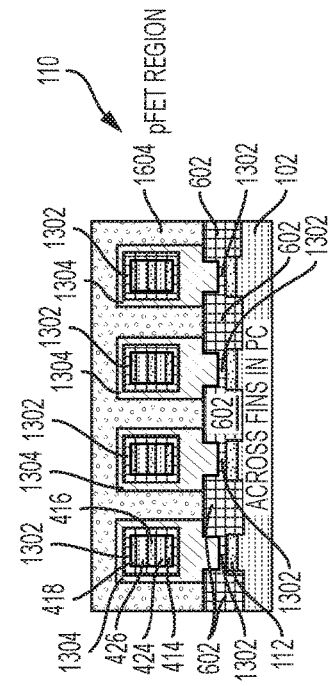
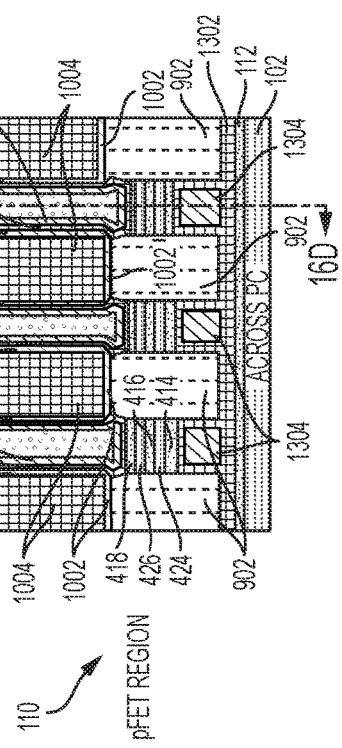

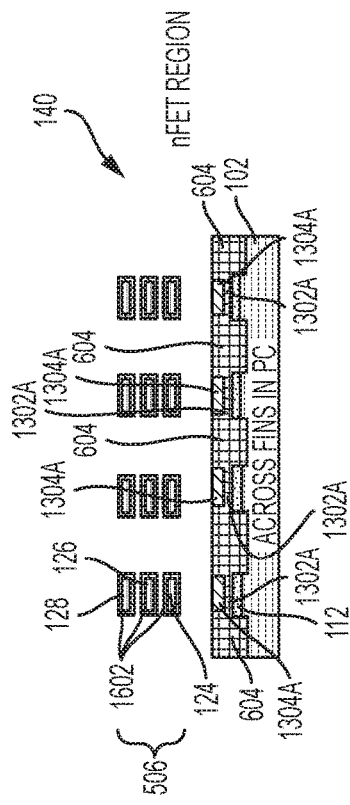
FIG. 18A
FIG. 18B
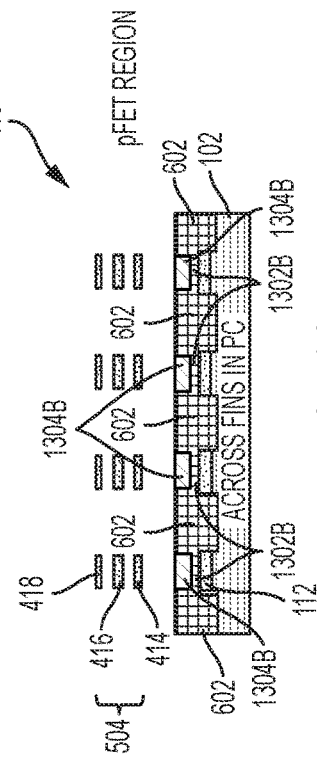
FIG. 18C
FIG. 18D

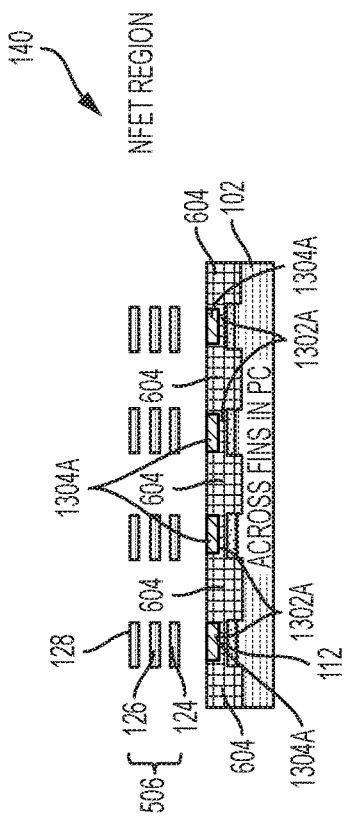
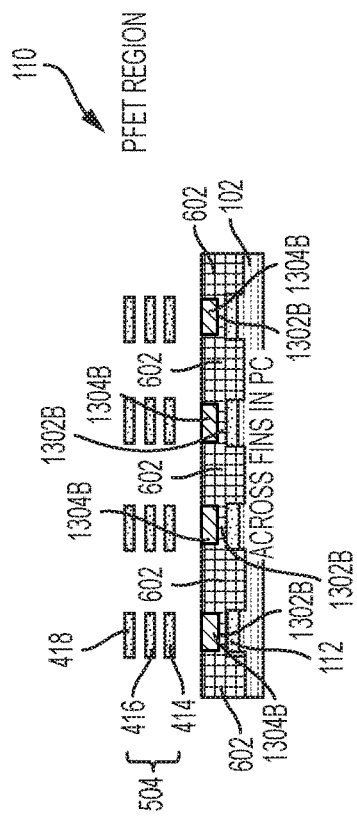
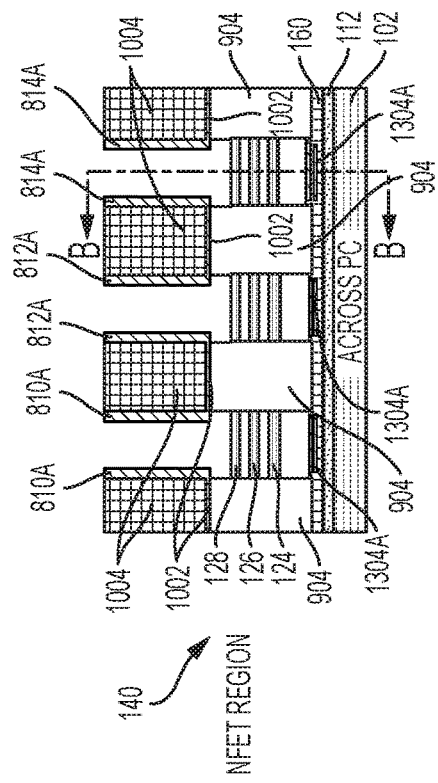
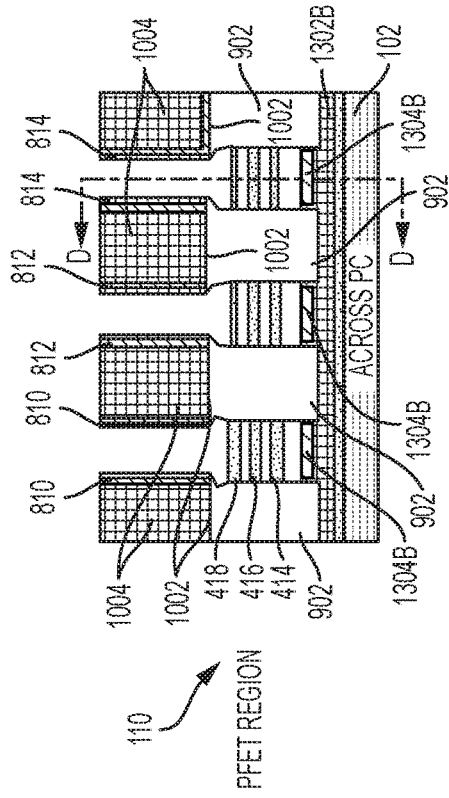
FIG. 19A
FIG. 19B
FIG. 19C
FIG. 19D

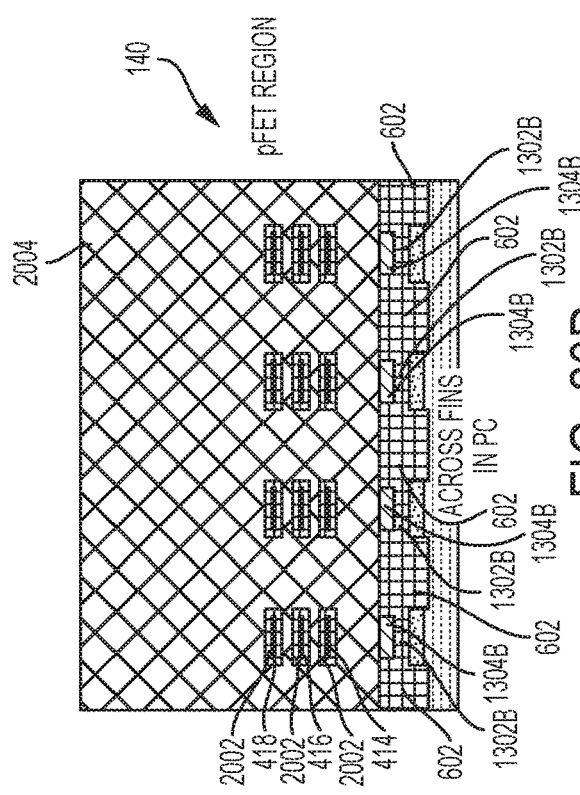
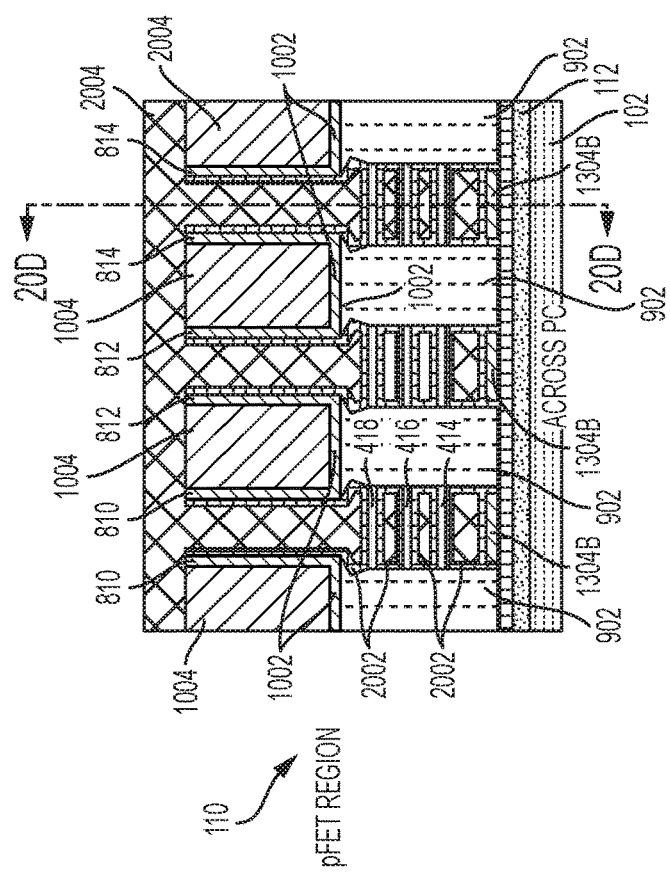
FIG. 20C
FIG. 20D

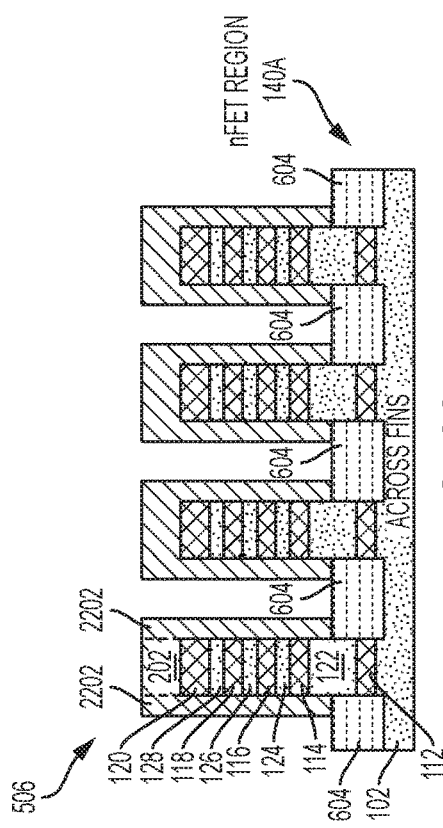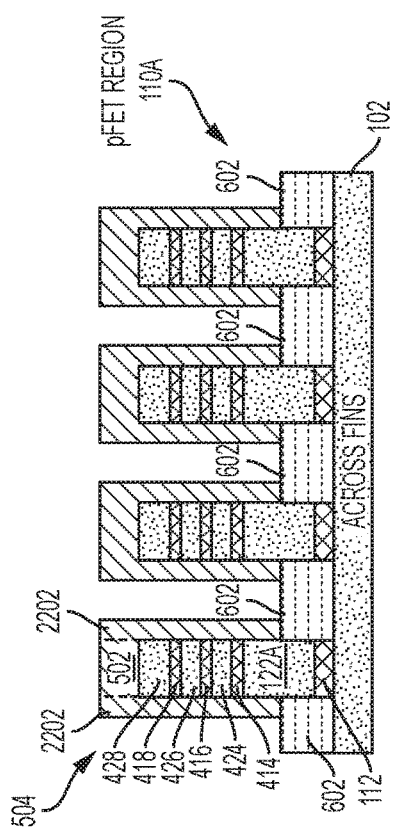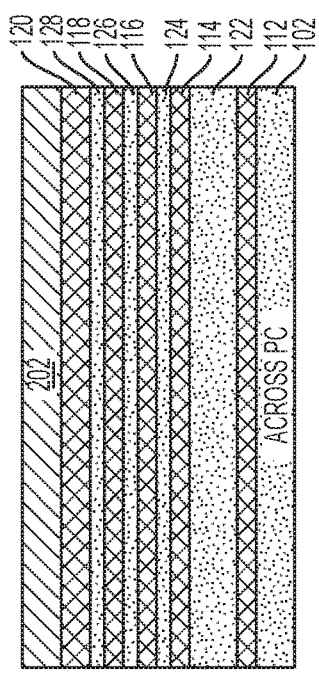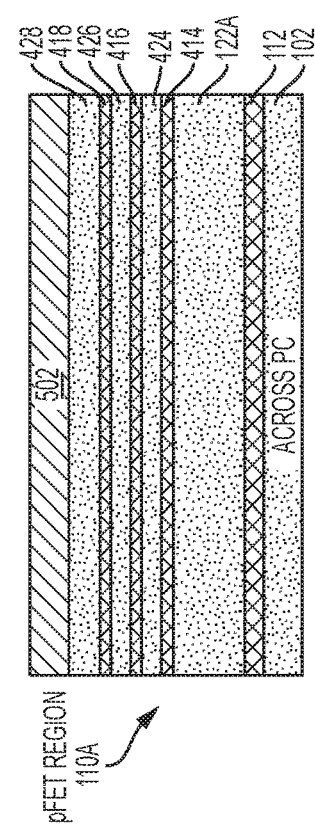

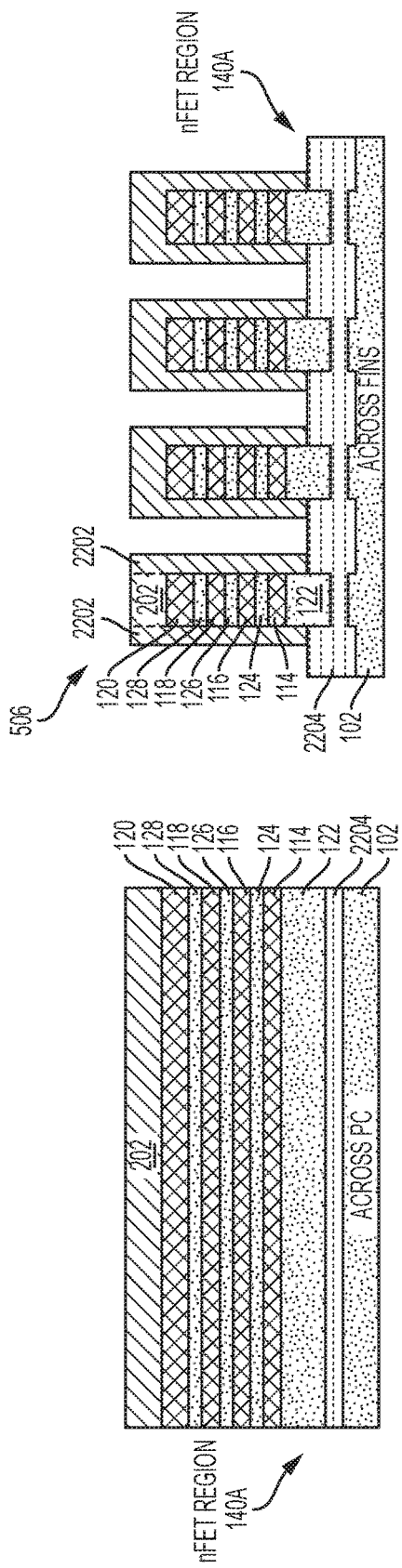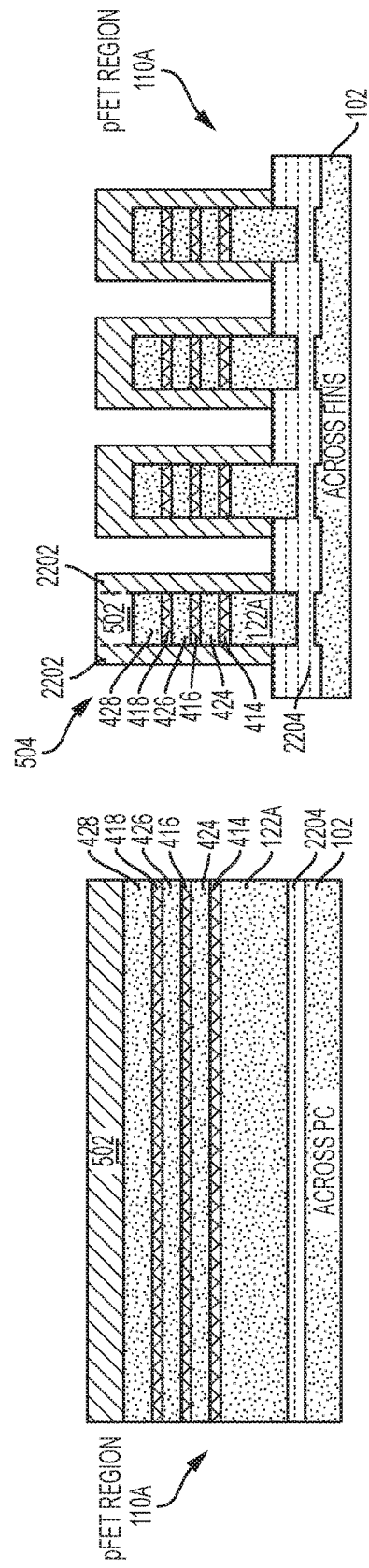

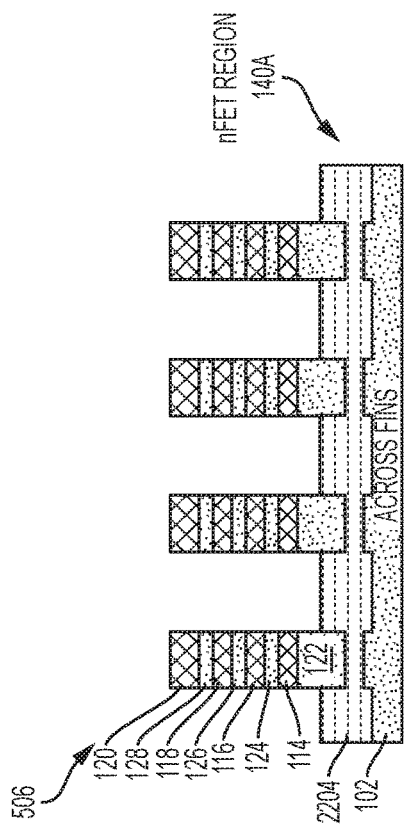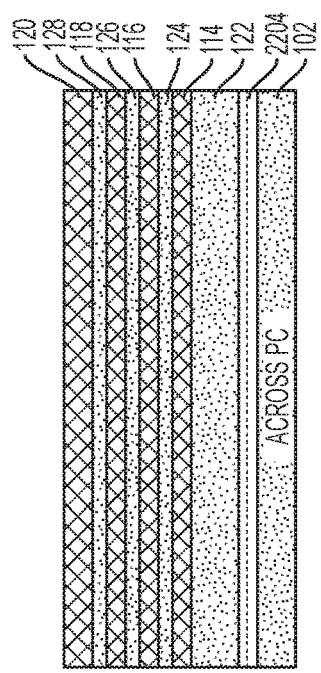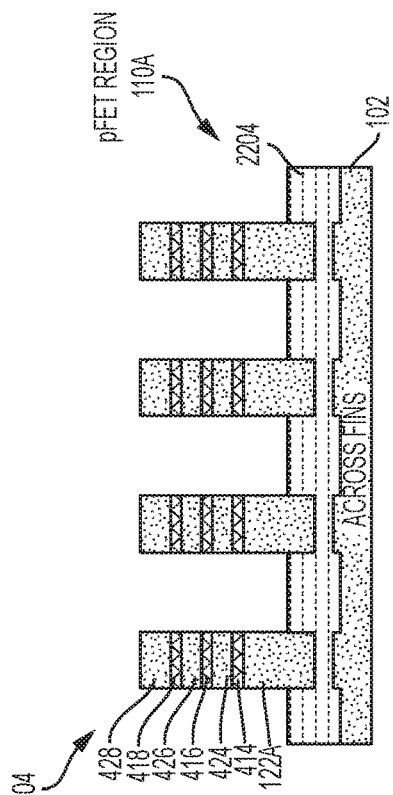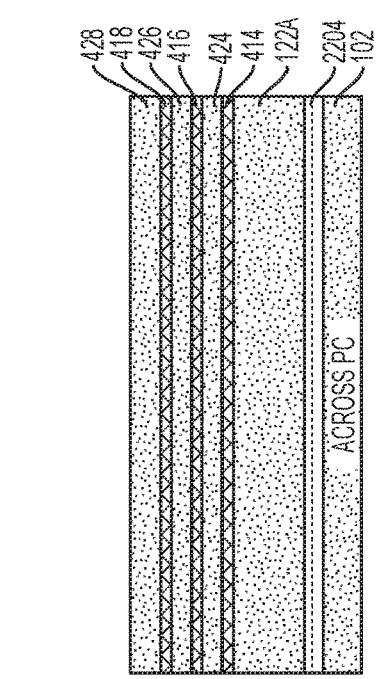
FIG. 24A / FIG. 24B / FIG. 24C / FIG. 24D

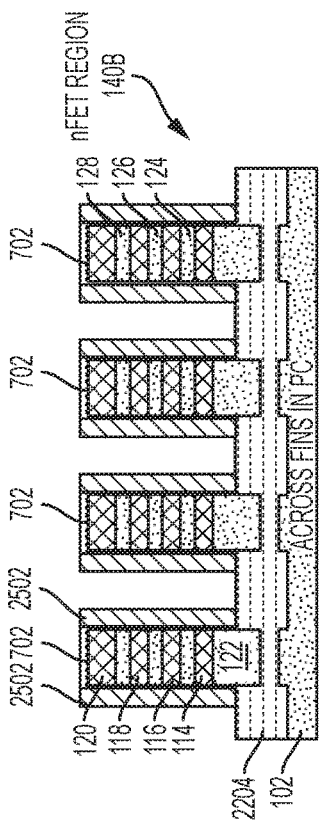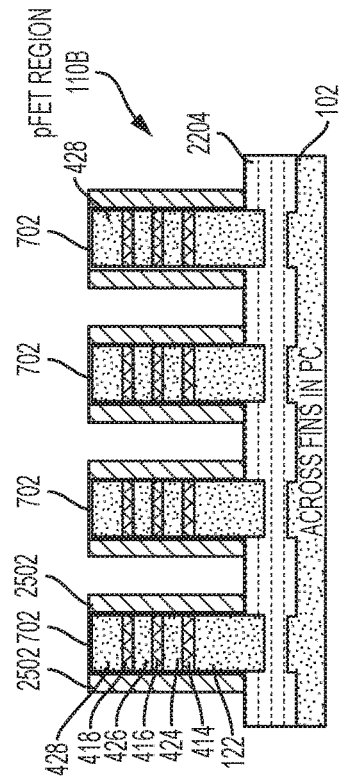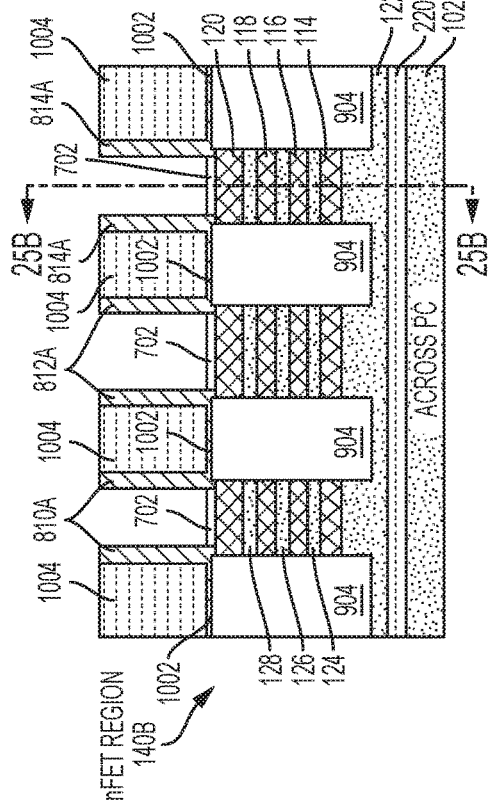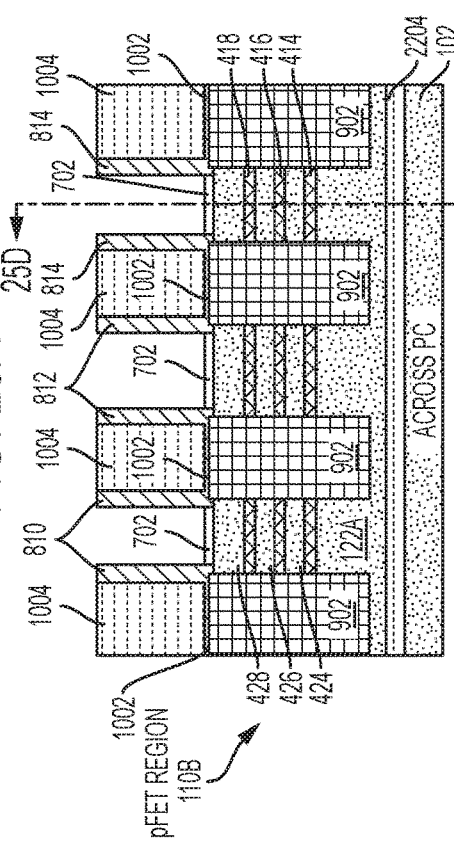

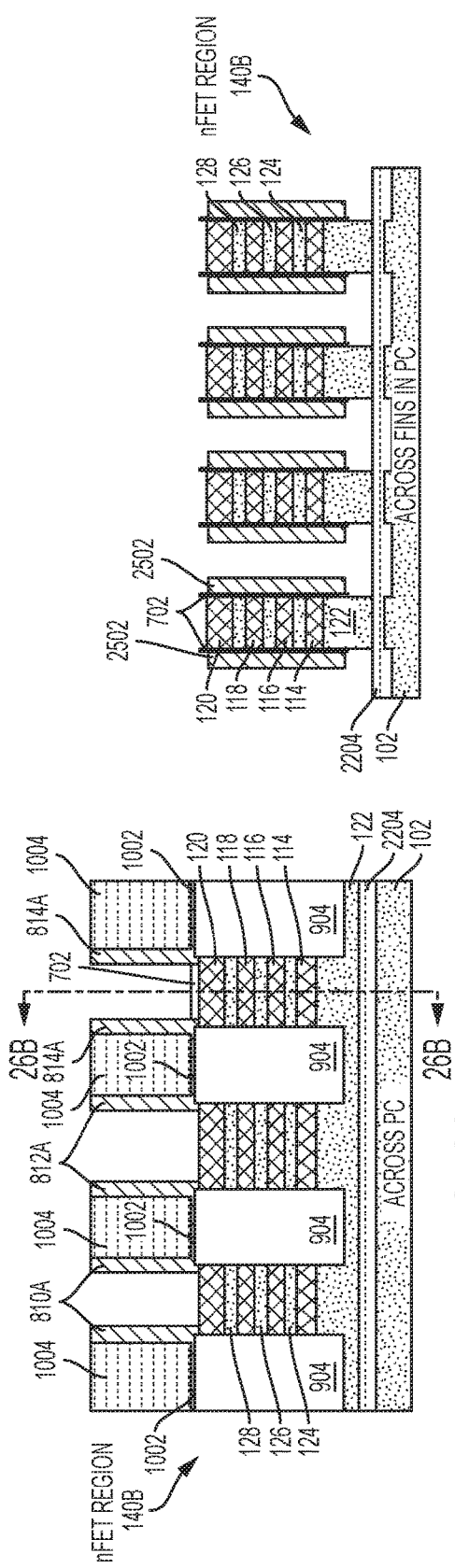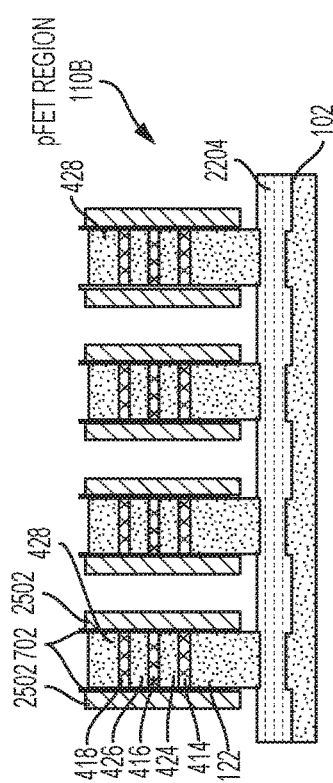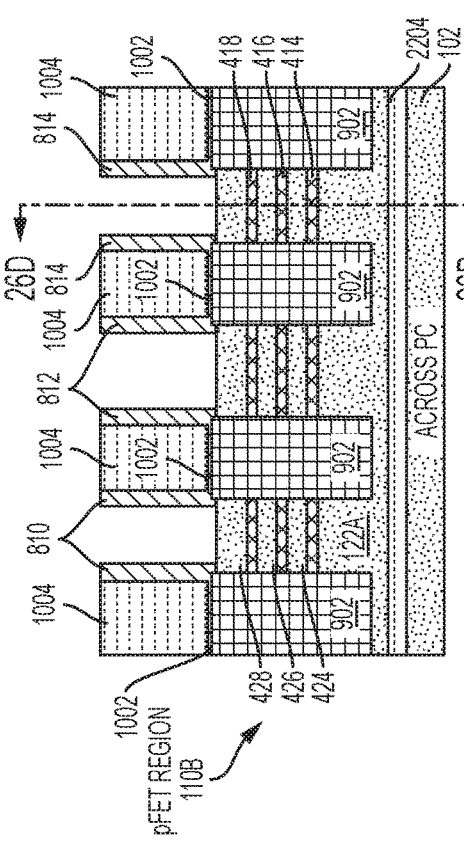
FIG. 26A
FIG. 26B
FIG. 26C
FIG. 26D

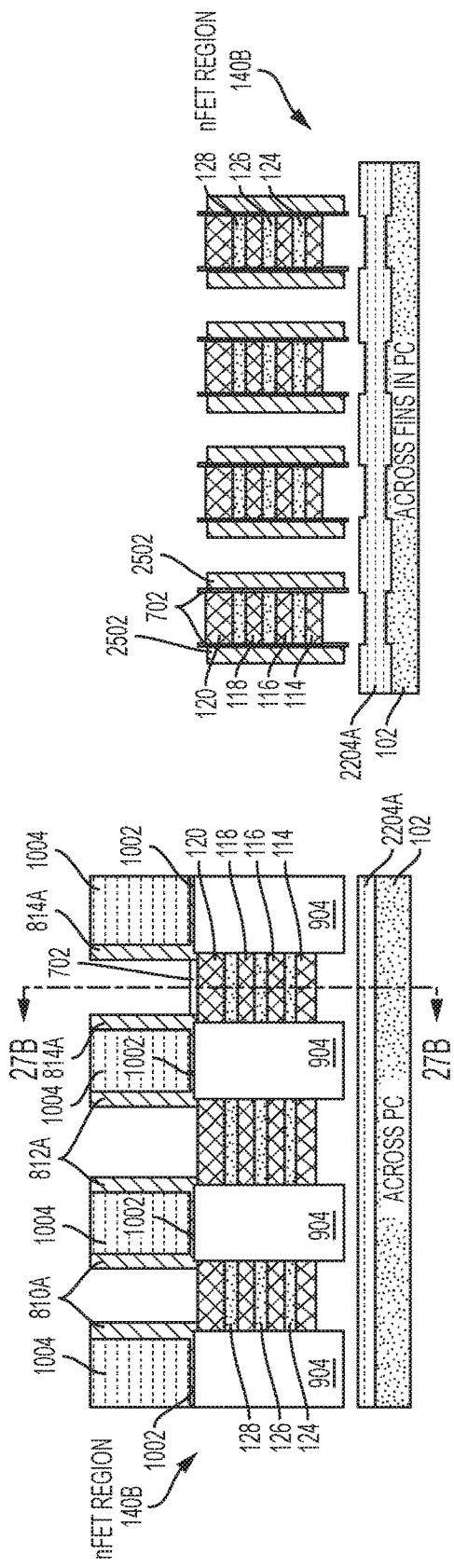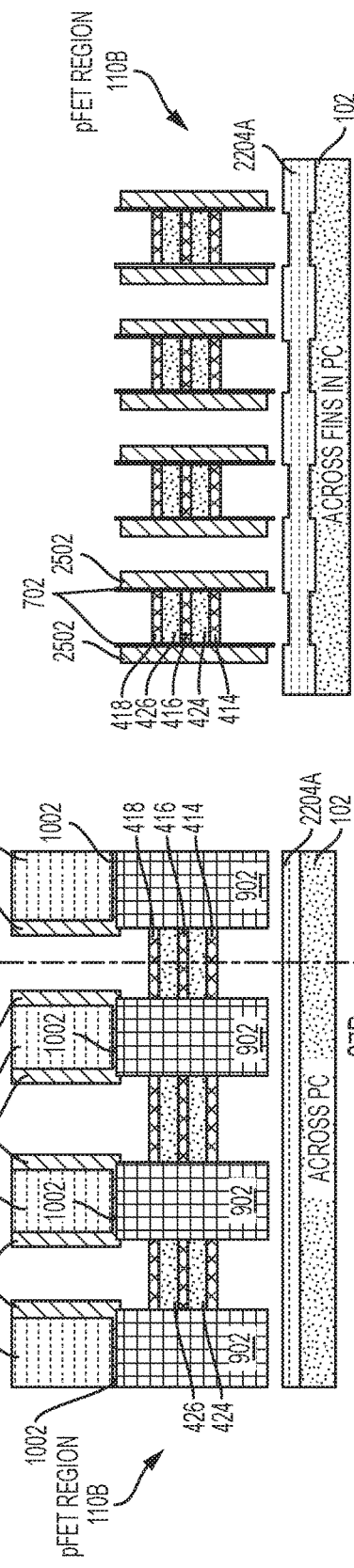

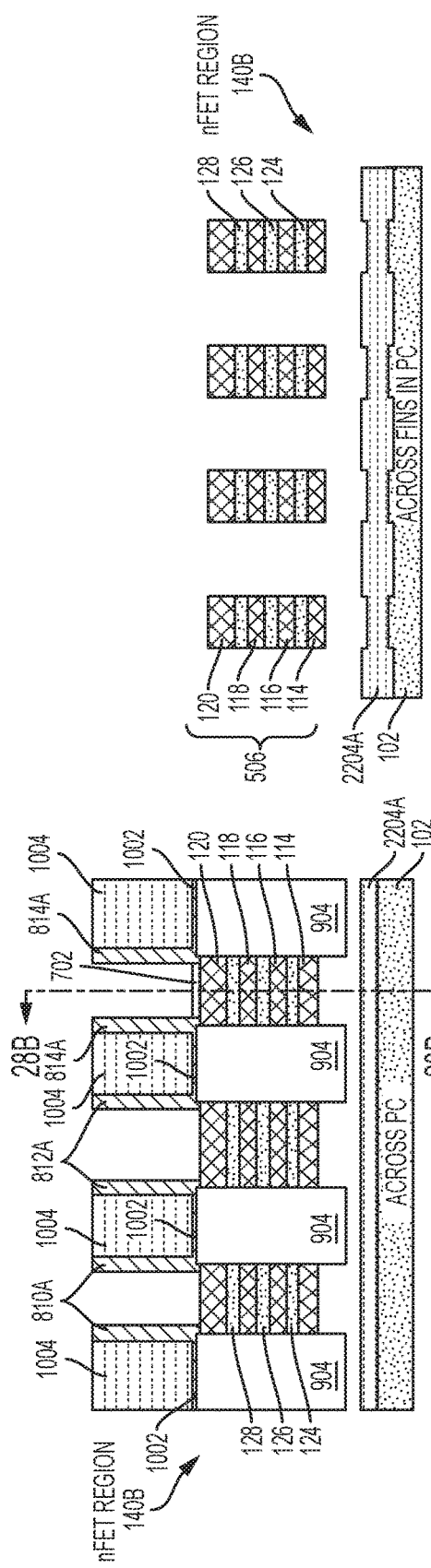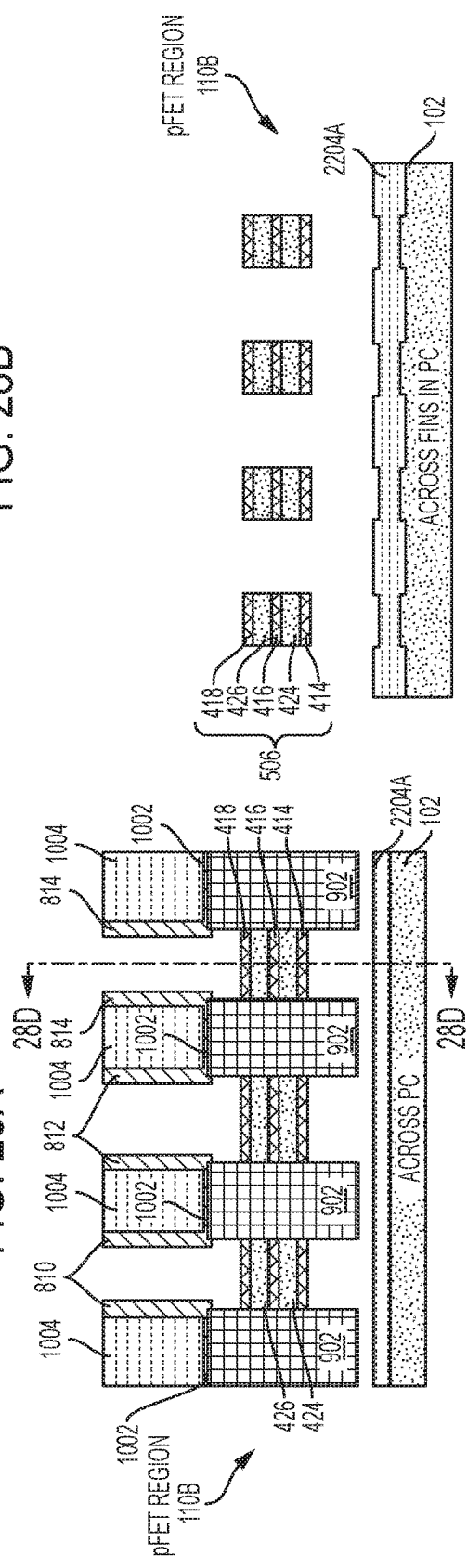

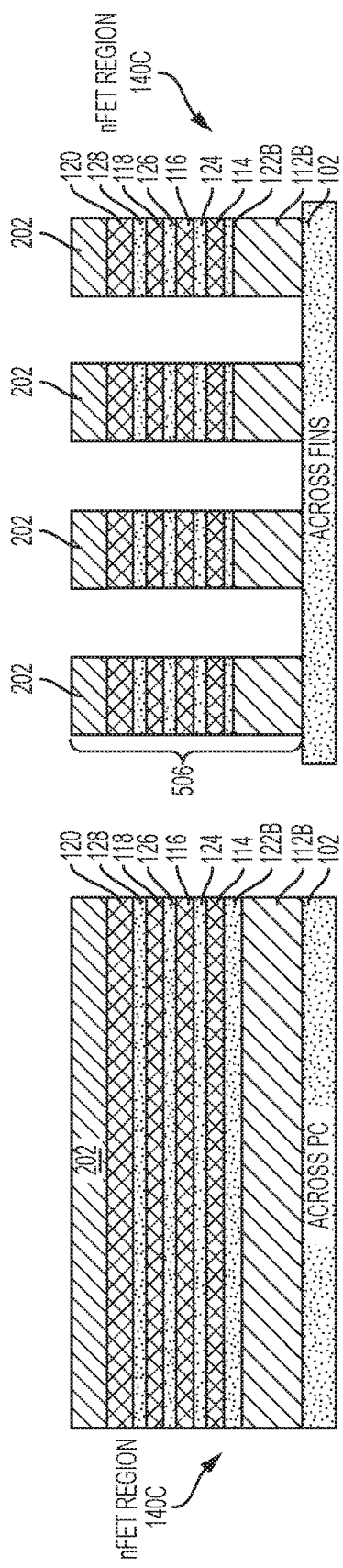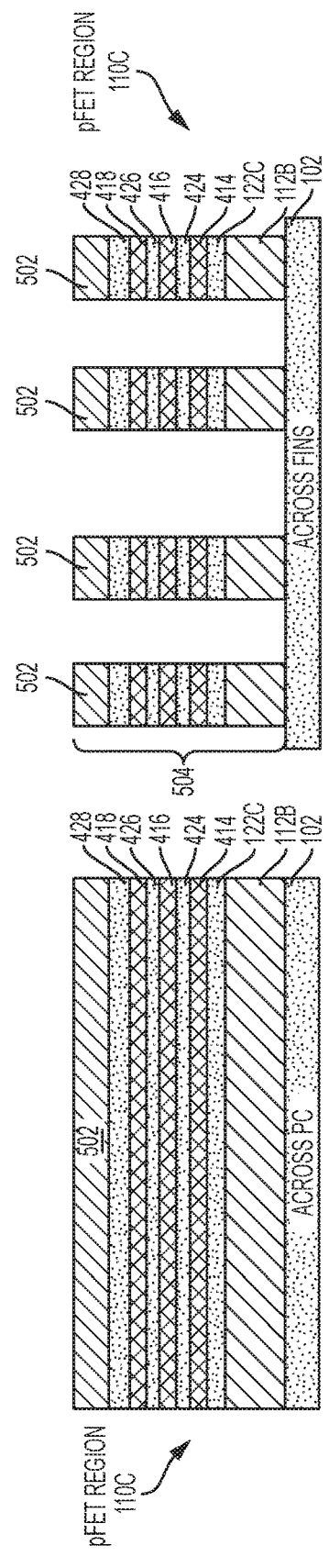

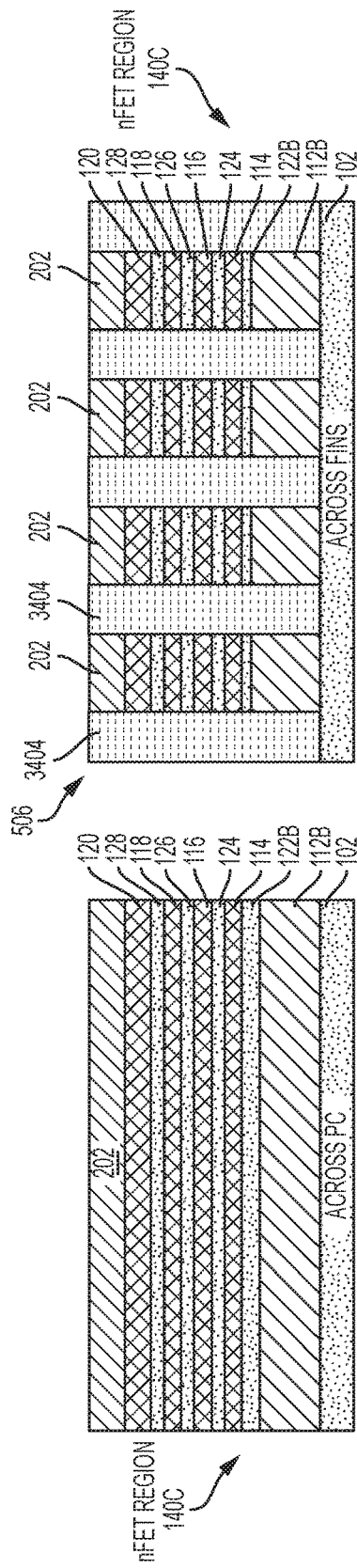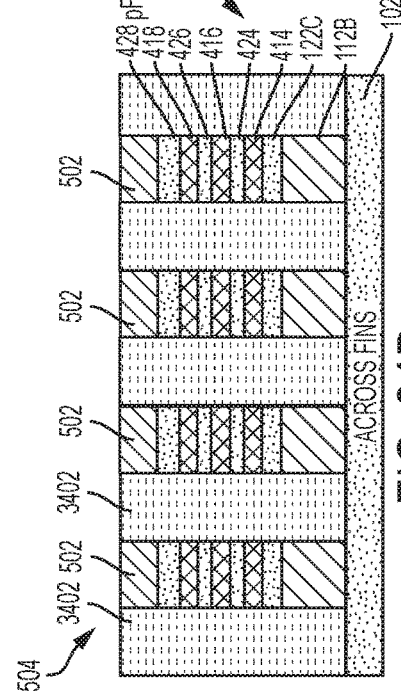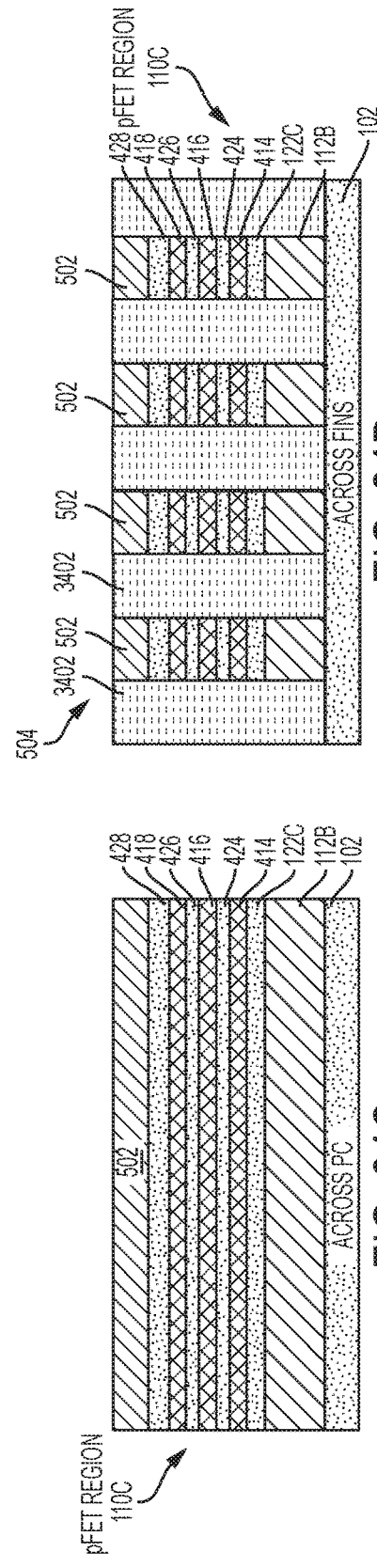

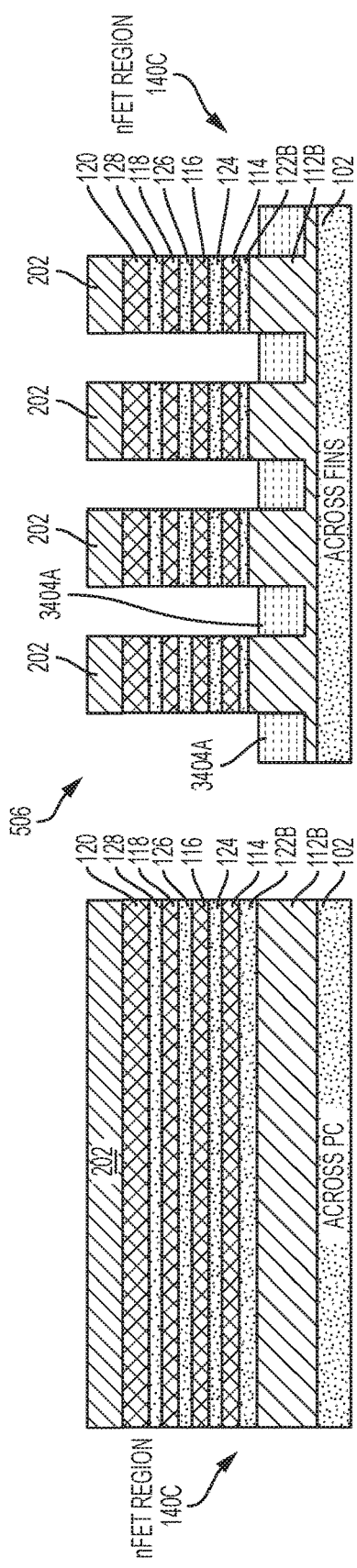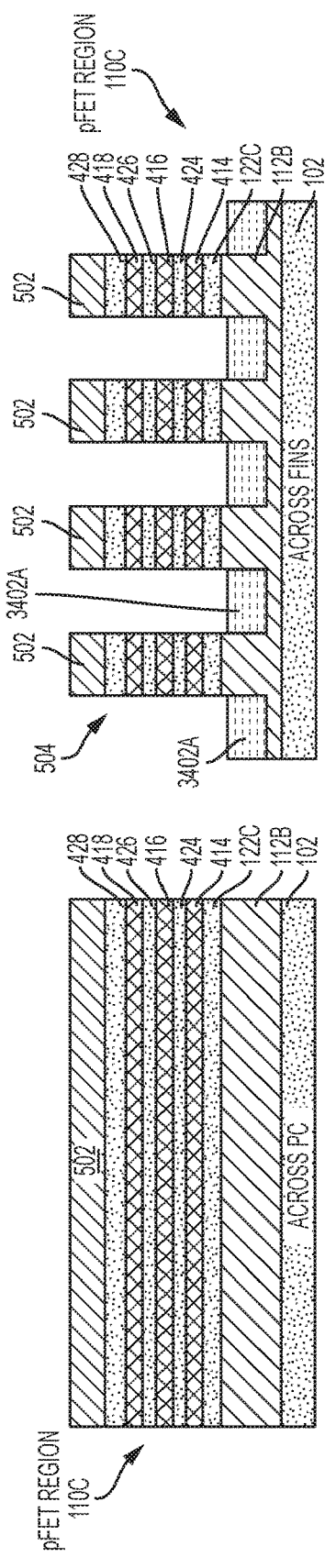

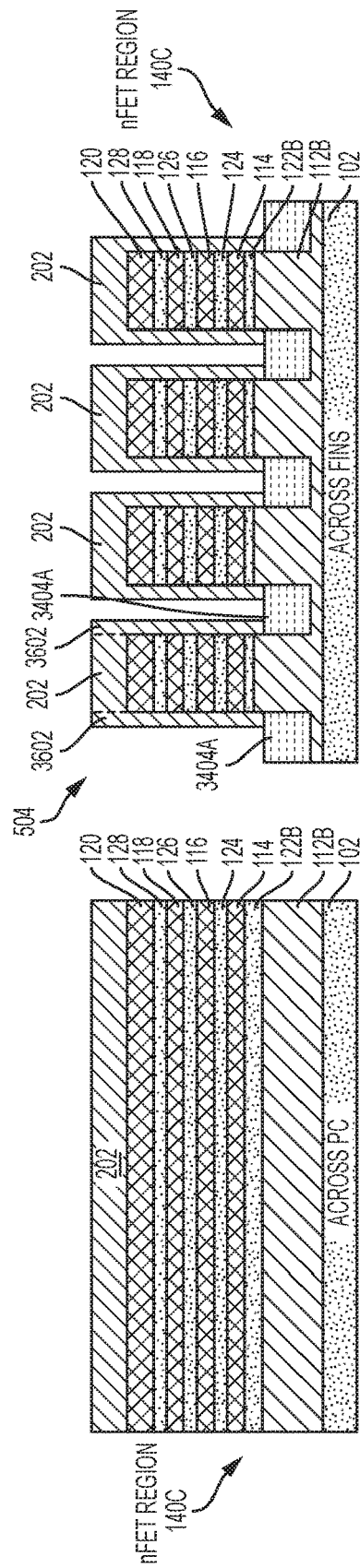
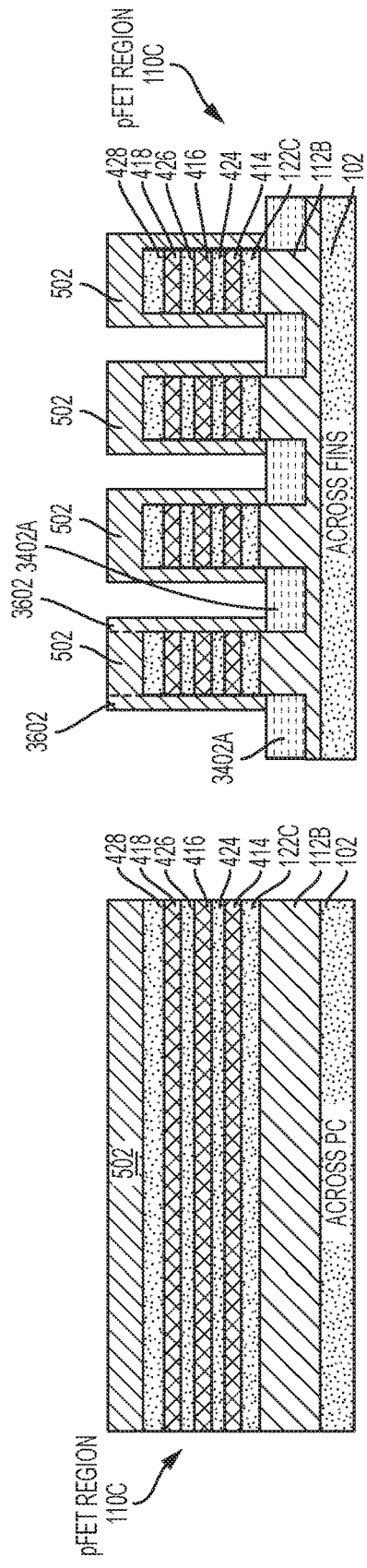

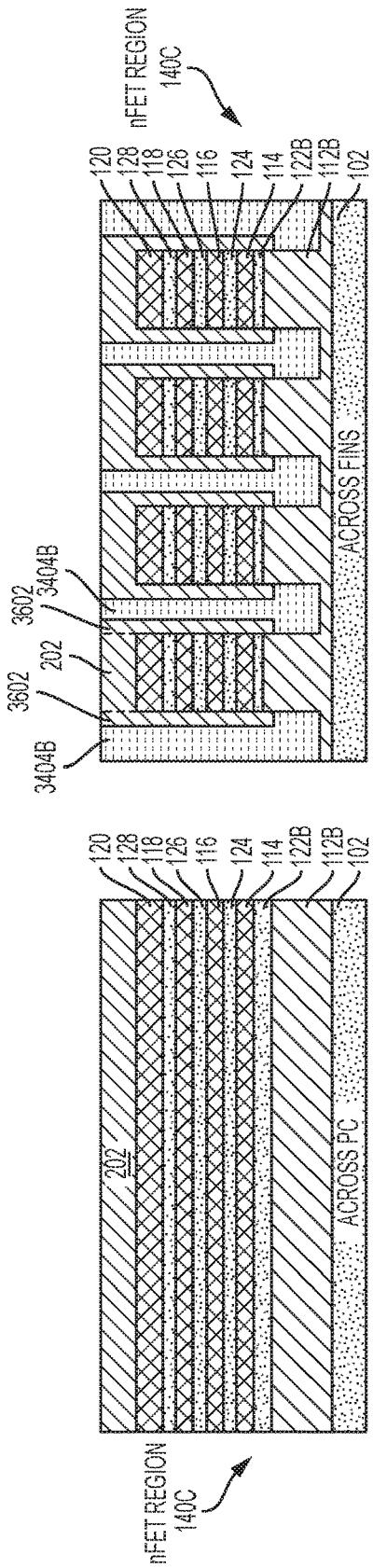
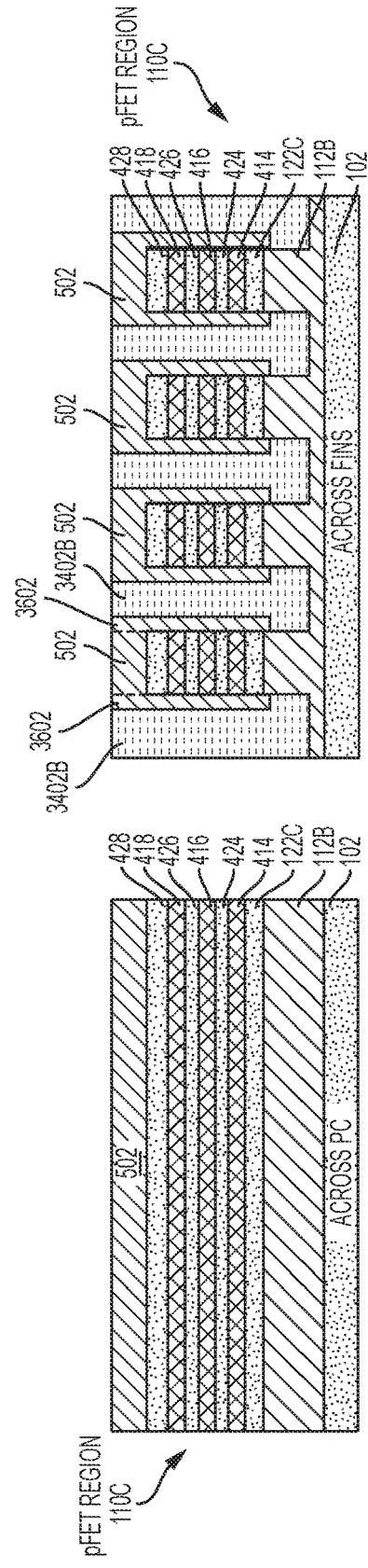

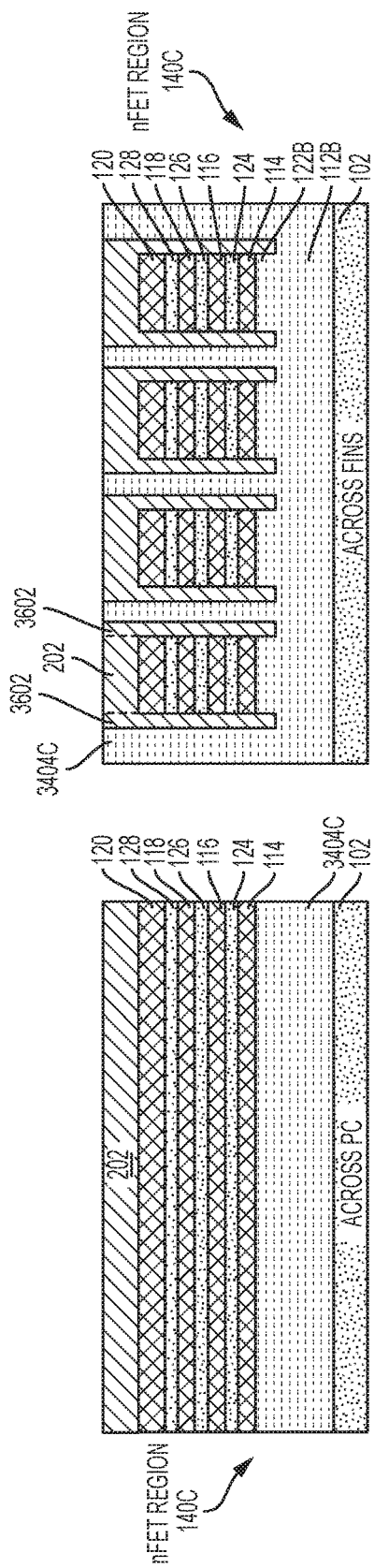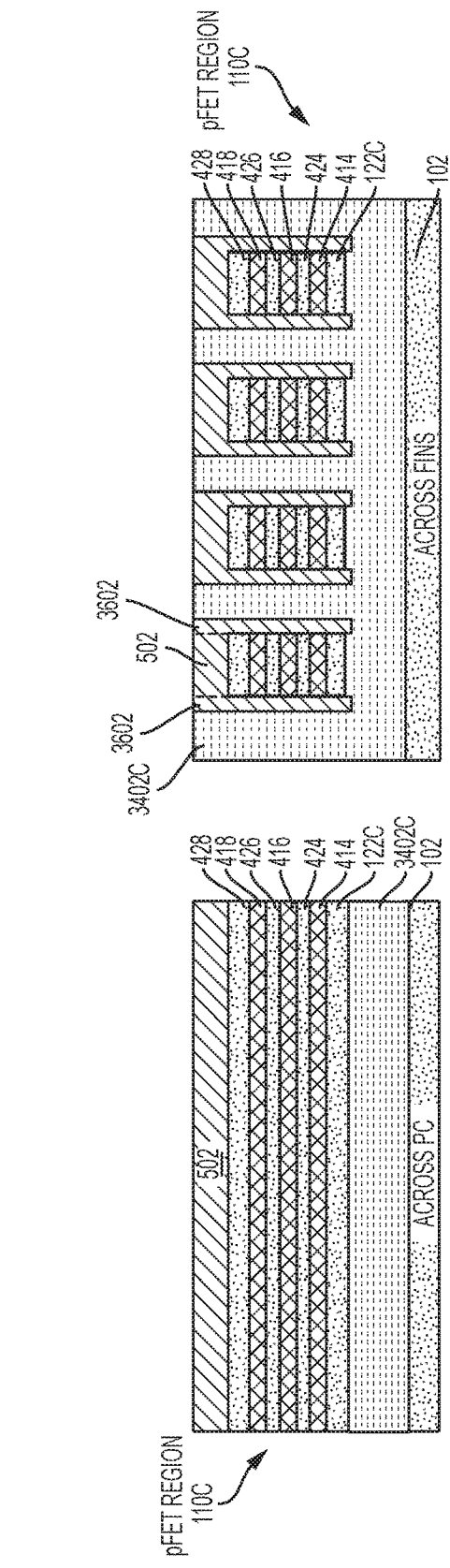

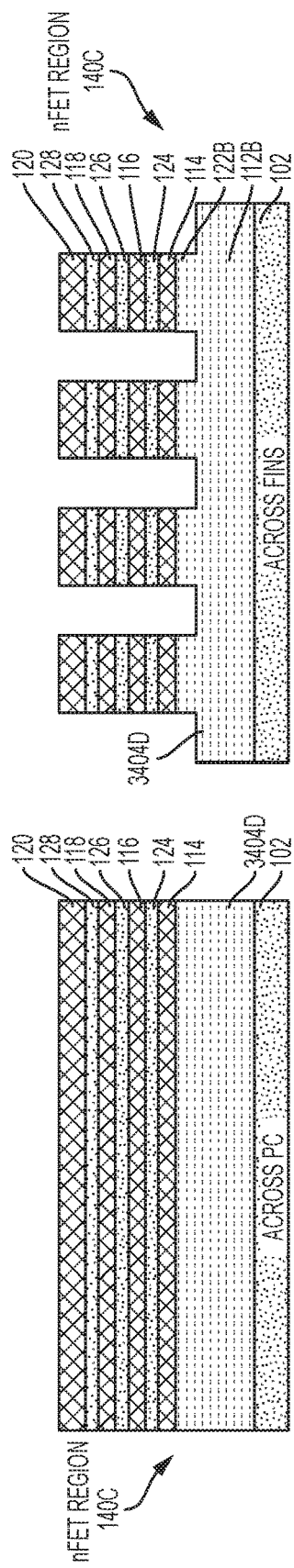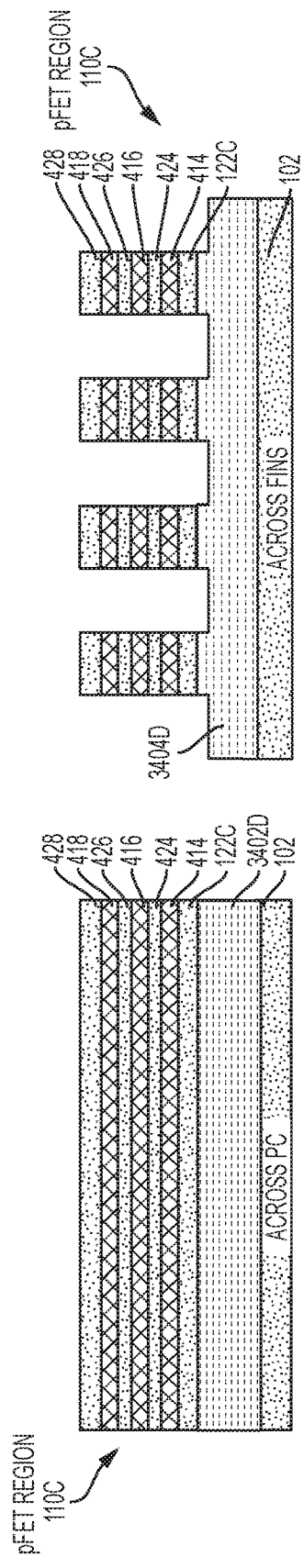

INTEGRATING AND ISOLATING NFET AND PFET NANOSHEET TRANSISTORS ON A SUBSTRATE

BACKGROUND

The present invention relates in general to semiconductor devices and their fabrication. More specifically, the present invention relates to a co-integrated fabrication process for forming vertically stacked and isolated n-type and p-type nanosheet/nanowire transistors on the same substrate.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions. Nanosheet transistor configurations enable fuller depletion in the nanosheet channel regions and reduce short-channel effects.

SUMMARY

Embodiments of the invention are directed to a method of opening an insulation region during fabrication of a nanosheet channel field effect transistor (FET). A non-limiting example of the method includes forming a first sacrificial nanosheet across from a major surface of a substrate. The method further includes forming a first nanosheet stack on an opposite side of the first sacrificial nanosheet from the major surface of the substrate, wherein the first nanosheet stack includes alternating channel nanosheets and sacrificial stack nanosheets. The method further includes exposing a surface area of the first sacrificial nanosheet, as well as exposing surface areas of the alternating channel nanosheets and surface areas of the alternating sacrificial stack nanosheets, wherein the exposed surface area of the first sacrificial nanosheet is greater than each of the exposed surface areas of the alternating channel nanosheets and the sacrificial stack nanosheets. The method further includes opening the insulation region by applying an etchant to the exposed surface area of the first sacrificial nanosheet, the exposed surface areas of the alternating channel nanosheets, and the exposed surface areas of the alternating sacrificial stack nanosheets, wherein the etchant is configured to include an etchant selectivity, wherein the etchant selectivity is based at least in part on the type of material to which the etchant is applied, and wherein the etchant selectivity is further based at least in part on the amount of surface area to which the etchant is applied.

Embodiments of the invention are directed to methods of opening insulation regions during the fabrication of nanosheet channel field effect transistors (FETs). A non-limiting example of the method includes forming a substrate that includes a major surface having a first region and a second region. The method further includes forming a sacrificial nanosheet across from the major surface of the substrate, wherein the sacrificial nanosheet includes a first sacrificial nanosheet across from the first region and a second sacrificial nanosheet across from the second region. The method further includes forming a nanosheet stack on an opposite side of the sacrificial nanosheet from the major surface of the substrate, wherein the nanosheet stack includes a first nanosheet stack on an opposite side of the first sacrificial nanosheet from the first region, wherein the nanosheet stack further includes a second nanosheet stack on an opposite side of the second sacrificial nanosheet from the second region, wherein the first nanosheet stack includes alternating first channel nanosheets and first sacrificial stack nanosheets, and wherein the second nanosheet stack includes alternating second channel nanosheets and second sacrificial stack nanosheets. The method further includes exposing a surface area of the first sacrificial nanosheet, exposing a surface area of the second sacrificial nanosheet, exposing surface areas of the alternating first channel nanosheets and surface areas of the alternating first sacrificial stack nanosheets of the first nanosheet stack, and exposing surface areas of the alternating second channel nanosheets and surface areas of the alternating second sacrificial stack nanosheets of the second nanosheet stack. The exposed surface area of the first sacrificial nanosheet is greater than the exposed surface areas of each of the alternating first channel nanosheets and each of the alternating first sacrificial stack nanosheets of the first nanosheet stack. The exposed surface area of the second sacrificial nanosheet is greater than the exposed surface areas of each of the alternating second channel nanosheets and each of the alternating second sacrificial stack nanosheets of the second nanosheet stack. The method further includes opening the insulation regions by applying an etchant to the exposed surface areas of the first sacrificial nanosheet, the second sacrificial nanosheet, the alternating first channel nanosheets and first sacrificial stack nanosheets of the first nanosheet stack, and the alternating second channel nanosheets and second sacrificial stack nanosheets. The etchant is configured to include an etchant selectivity, wherein the etchant selectivity is based at least in part on the type of material to which the etchant is applied, and wherein the etchant selectivity is further based at least in part on the amount of surface area to which the etchant is applied.

Embodiments of the invention are directed to a method of forming an insulation region during fabrication of a nanosheet channel field effect transistor (FET). A non-limiting example of the method includes forming a first sacrificial nanosheet across from a major surface of a substrate, as well as forming a first nanosheet stack on an opposite side of the first sacrificial nanosheet from the major surface of the substrate, wherein the first nanosheet stack includes alternating channel nanosheets and sacrificial stack nanosheets. The method further includes converting the first sacrificial nanosheet to a dielectric oxide, wherein the insulation region includes the dielectric oxide.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 2A depicts a cross-sectional view of the semiconductor device in the nFET region of the semiconductor wafer after a fabrication stage according to one or more embodiments of the present invention;

FIG. 2B depicts a cross-sectional view of the semiconductor device shown in FIG. 2A rotated clockwise by 90 degrees;

FIG. 2C depicts a cross-sectional view of the semiconductor device in the pFET region of the semiconductor wafer after a fabrication stage according to one or more embodiments of the present invention;

FIG. 2D depicts a cross-sectional view of the semiconductor device shown in FIG. 2C rotated clockwise by 90 degrees;

FIG. 3A depicts a cross-sectional view of the semiconductor device in the nFET region of the semiconductor wafer after a fabrication stage according to one or more embodiments of the present invention;

FIG. 3B depicts a cross-sectional view of the semiconductor device shown in FIG. 3A rotated clockwise by 90 degrees;

FIG. 3C depicts a cross-sectional view of the semiconductor device in the pFET region of the semiconductor wafer after a fabrication stage according to one or more embodiments of the present invention;

FIG. 3D depicts a cross-sectional view of the semiconductor device shown in FIG. 3C rotated clockwise by 90 degrees;

FIG. 5A depicts a cross-sectional view of the semiconductor device in the nFET region of the semiconductor wafer after a fabrication stage according to one or more embodiments of the present invention;

FIG. 5B depicts a cross-sectional view of the semiconductor device shown in FIG. 5A rotated clockwise by 90 degrees;

FIG. 5C depicts a cross-sectional view of the semiconductor device in the pFET region of the semiconductor wafer after a fabrication stage according to one or more embodiments of the present invention;

FIG. 5D depicts a cross-sectional view of the semiconductor device shown in FIG. 5C rotated clockwise by 90 degrees;

FIG. 6A depicts a cross-sectional view of the semiconductor device in the nFET region of the semiconductor wafer after a fabrication stage according to one or more embodiments of the present invention;

FIG. 6B depicts a cross-sectional view of the semiconductor device shown in FIG. 6A rotated clockwise by 90 degrees;

FIG. 6C depicts a cross-sectional view of the semiconductor device in the pFET region of the semiconductor wafer after a fabrication stage according to one or more embodiments of the present invention;

FIG. 6D depicts a cross-sectional view of the semiconductor device shown in FIG. 6C rotated clockwise by 90 degrees;

FIG. 7A depicts a cross-sectional view of the semiconductor device in the nFET region of the semiconductor wafer after a fabrication stage according to one or more embodiments of the present invention;

FIG. 7B depicts a cross-sectional view taken along line B-B of the semiconductor device shown in FIG. 7A;

FIG. 7C depicts a cross-sectional view of the semiconductor device in the pFET region of the semiconductor wafer after a fabrication stage according to one or more embodiments of the present invention;

FIG. 7D depicts a cross-sectional view taken along line D-D of the semiconductor device shown in FIG. 7C;

FIG. 9A depicts a cross-sectional view of the semiconductor device in the nFET region of the semiconductor wafer after a fabrication stage according to one or more embodiments of the present invention;

FIG. 9B depicts a cross-sectional view taken along line B-B of the semiconductor device shown in FIG. 9A;

FIG. 9C depicts a cross-sectional view of the semiconductor device in the pFET region of the semiconductor wafer after a fabrication stage according to one or more embodiments of the present invention;

FIG. 9D depicts a cross-sectional view taken along line D-D of the semiconductor device shown in FIG. 9C;

FIG. 10A depicts a cross-sectional view of the semiconductor device in the nFET region of the semiconductor wafer after a fabrication stage according to one or more embodiments of the present invention;

FIG. 10B depicts a cross-sectional view taken along line B-B of the semiconductor device shown in FIG. 10A;

FIG. 10C depicts a cross-sectional view of the semiconductor device in the pFET region of the semiconductor wafer after a fabrication stage according to one or more embodiments of the present invention;

FIG. 10D depicts a cross-sectional view taken along line D-D of the semiconductor device shown in FIG. 10C;

FIG. 11A depicts a cross-sectional view of the semiconductor device in the nFET region of the semiconductor wafer after a fabrication stage according to one or more embodiments of the present invention;

FIG. 11B depicts a cross-sectional view taken along line B-B of the semiconductor device shown in FIG. 11A;

FIG. 11C depicts a cross-sectional view of the semiconductor device in the pFET region of the semiconductor wafer after a fabrication stage according to one or more embodiments of the present invention;

FIG. 11D depicts a cross-sectional view taken along line D-D of the semiconductor device shown in FIG. 11C;

FIG. 13A depicts a cross-sectional view of the semiconductor device in the nFET region of the semiconductor wafer after a fabrication stage according to one or more embodiments of the present invention;

FIG. 13B depicts a cross-sectional view taken along line B-B of the semiconductor device shown in FIG. 13A;

FIG. 13C depicts a cross-sectional view of the semiconductor device in the pFET region of the semiconductor wafer after a fabrication stage according to one or more embodiments of the present invention;

FIG. 13D depicts a cross-sectional view taken along line D-D of the semiconductor device shown in FIG. 13C;

FIG. 14A depicts a cross-sectional view of the semiconductor device in the nFET region of the semiconductor wafer after a fabrication stage according to one or more embodiments of the present invention;

FIG. 14B depicts a cross-sectional view taken along line B-B of the semiconductor device shown in FIG. 14A;

FIG. 14C depicts a cross-sectional view of the semiconductor device in the pFET region of the semiconductor wafer after a fabrication stage according to one or more embodiments of the present invention;

FIG. 14D depicts a cross-sectional view taken along line D-D of the semiconductor device shown in FIG. 14C;

FIG. 15A depicts a cross-sectional view of the semiconductor device in the pFET region of the semiconductor wafer after a fabrication stage according to one or more embodiments of the present invention;

FIG. 15B depicts a cross-sectional view taken along line B-B of the semiconductor device shown in FIG. 15A;

FIG. 15C depicts a cross-sectional view of the semiconductor device in the pFET region of the semiconductor wafer after a fabrication stage according to one or more embodiments of the present invention;

FIG. 15D depicts a cross-sectional view taken along line D-D of the semiconductor device shown in FIG. 15C;

FIG. 16A depicts a cross-sectional view of the semiconductor device in the nFET region of the semiconductor wafer after a fabrication stage according to one or more embodiments of the present invention;

FIG. 16B depicts a cross-sectional view taken along line B-B of the semiconductor device shown in FIG. 16A;

FIG. 16C depicts a cross-sectional view of the semiconductor device in the pFET region of the semiconductor wafer after a fabrication stage according to one or more embodiments of the present invention;

FIG. 16D depicts a cross-sectional view taken along line D-D of the semiconductor device shown in FIG. 16C;

FIG. 18A depicts a cross-sectional view of the semiconductor device in the nFET region of the semiconductor wafer after a fabrication stage according to one or more embodiments of the present invention;

FIG. 18B depicts a cross-sectional view taken along line B-B of the semiconductor device shown in FIG. 18A;

FIG. 18C depicts a cross-sectional view of the semiconductor device in the pFET region of the semiconductor wafer after a fabrication stage according to one or more embodiments of the present invention;

FIG. 18D depicts a cross-sectional view taken along line D-D of the semiconductor device shown in FIG. 18C;

FIG. 19A depicts a cross-sectional view of the semiconductor device in the nFET region of the semiconductor wafer after a fabrication stage according to one or more embodiments of the present invention;

FIG. 19B depicts a cross-sectional view taken along line B-B of the semiconductor device shown in FIG. 19A;

FIG. 19C depicts a cross-sectional view of the semiconductor device in the pFET region of the semiconductor wafer after a fabrication stage according to one or more embodiments of the present invention;

FIG. 19D depicts a cross-sectional view taken along line D-D of the semiconductor device shown in FIG. 19C;

FIG. 20C depicts a cross-sectional view of the semiconductor device in the pFET region of the semiconductor wafer after a fabrication stage according to one or more embodiments of the present invention;

FIG. 20D depicts a cross-sectional view taken along line D-D of the semiconductor device shown in FIG. 20C;

FIGS. 22A to 24D depict an additional semiconductor device fabrication methodology according to embodiments of the invention in which:

FIG. 22A depicts a cross-sectional view of the semiconductor device in the nFET region of the semiconductor wafer after a fabrication stage according to one or more embodiments of the present invention;

FIG. 22B depicts a cross-sectional view of the semiconductor device shown in FIG. 22A rotated clockwise by 90 degrees;

FIG. 22C depicts a cross-sectional view of the semiconductor device in the pFET region of the semiconductor wafer after a fabrication stage according to one or more embodiments of the present invention;

FIG. 22D depicts a cross-sectional view of the semiconductor device shown in FIG. 22C rotated clockwise by 90 degrees;

FIG. 23A depicts a cross-sectional view of the semiconductor device in the nFET region of the semiconductor wafer after a fabrication stage according to one or more embodiments of the present invention;

FIG. 23B depicts a cross-sectional view of the semiconductor device shown in FIG. 23A rotated clockwise by 90 degrees;

FIG. 23C depicts a cross-sectional view of the semiconductor device in the pFET region of the semiconductor wafer after a fabrication stage according to one or more embodiments of the present invention;

FIG. 23D depicts a cross-sectional view of the semiconductor device shown in FIG. 23C rotated clockwise by 90 degrees;

FIG. 24A depicts a cross-sectional view of the semiconductor device in the nFET region of the semiconductor wafer after a fabrication stage according to one or more embodiments of the present invention;

FIG. 24B depicts a cross-sectional view of the semiconductor device shown in FIG. 24A rotated clockwise by 90 degrees;

FIG. 24C depicts a cross-sectional view of the semiconductor device in the pFET region of the semiconductor wafer after a fabrication stage according to one or more embodiments of the present invention;

FIG. 24D depicts a cross-sectional view of the semiconductor device shown in FIG. 24C rotated clockwise by 90 degrees;

FIGS. 25A to 28D depict an additional semiconductor device fabrication methodology according to embodiments of the invention in which:

FIG. 25A depicts a cross-sectional view of the semiconductor device in the nFET region of the semiconductor wafer after a fabrication stage according to one or more embodiments of the present invention;

FIG. 25B depicts a cross-sectional view taken along line B-B of the semiconductor device shown in FIG. 25A;

FIG. 25C depicts a cross-sectional view of the semiconductor device in the pFET region of the semiconductor wafer after a fabrication stage according to one or more embodiments of the present invention;

FIG. 25D depicts a cross-sectional view taken along line D-D of the semiconductor device shown in FIG. 25C;

FIG. 26A depicts a cross-sectional view of the semiconductor device in the nFET region of the semiconductor wafer after a fabrication stage according to one or more embodiments of the present invention;

FIG. 26B depicts a cross-sectional view taken along line B-B of the semiconductor device shown in FIG. 26A;

FIG. 26C depicts a cross-sectional view of the semiconductor device in the pFET region of the semiconductor wafer after a fabrication stage according to one or more embodiments of the present invention;

FIG. 26D depicts a cross-sectional view taken along line D-D of the semiconductor device shown in FIG. 26C;

FIG. 27A depicts a cross-sectional view of the semiconductor device in the nFET region of the semiconductor wafer after a fabrication stage according to one or more embodiments of the present invention;

FIG. 27B depicts a cross-sectional view taken along line B-B of the semiconductor device shown in FIG. 27A;

FIG. 27C depicts a cross-sectional view of the semiconductor device in the pFET region of the semiconductor wafer after a fabrication stage according to one or more embodiments of the present invention;

FIG. 27D depicts a cross-sectional view taken along line D-D of the semiconductor device shown in FIG. 27C;

FIG. 28A depicts a cross-sectional view of the semiconductor device in the nFET region of the semiconductor wafer after a fabrication stage according to one or more embodiments of the present invention;

FIG. 28B depicts a cross-sectional view taken along line B-B of the semiconductor device shown in FIG. 28A;

FIG. 28C depicts a cross-sectional view of the semiconductor device in the pFET region of the semiconductor wafer after a fabrication stage according to one or more embodiments of the present invention;

FIG. 28D depicts a cross-sectional view taken along line D-D of the semiconductor device shown in FIG. 28C;

FIGS. 29A to 39D depict an additional semiconductor device fabrication methodology according to embodiments of the invention in which:

FIG. 29A depicts a cross-sectional view of a semiconductor device in an nFET region of a semiconductor wafer after a fabrication stage according to one or more embodiments of the present invention;

FIG. 30C depicts a cross-sectional view of the semiconductor device in the pFET region of the semiconductor wafer after a fabrication stage according to one or more embodiments of the present invention;

FIG. 30D depicts a cross-sectional view of the semiconductor device shown in FIG. 30C rotated clockwise by 90 degrees;

FIG. 31A depicts a cross-sectional view of the semiconductor device in the nFET region of the semiconductor wafer after a fabrication stage according to one or more embodiments of the present invention;

FIG. 31B depicts a cross-sectional view of the semiconductor device shown in FIG. 31A rotated clockwise by 90 degrees;

FIG. 31C depicts a cross-sectional view of the semiconductor device in the pFET region of the semiconductor wafer after a fabrication stage according to one or more embodiments of the present invention;

FIG. 31D depicts a cross-sectional view of the semiconductor device shown in FIG. 31C rotated clockwise by 90 degrees;

FIG. 32A depicts a cross-sectional view of the semiconductor device in the nFET region of the semiconductor wafer after a fabrication stage according to one or more embodiments of the present invention;

FIG. 32B depicts a cross-sectional view of the semiconductor device shown in FIG. 32A rotated clockwise by 90 degrees;

FIG. 32C depicts a cross-sectional view of the semiconductor device in the pFET region of the semiconductor wafer after a fabrication stage according to one or more embodiments of the present invention;

FIG. 32D depicts a cross-sectional view of the semiconductor device shown in FIG. 32C rotated clockwise by 90 degrees;

FIG. 33A depicts a cross-sectional view of the semiconductor device in the nFET region of the semiconductor wafer after a fabrication stage according to one or more embodiments of the present invention;

FIG. 33B depicts a cross-sectional view of the semiconductor device shown in FIG. 33A rotated clockwise by 90 degrees;

Figure 1A:
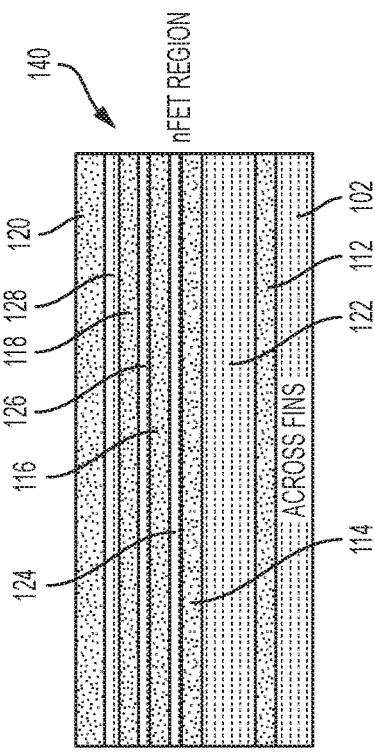
FIG. 1A depicts a cross-sectional view of a semiconductor device in an nFET region of a semiconductor wafer after a fabrication stage according to one or more embodiments of the present invention.

FIG. 33C depicts a cross-sectional view of the semiconductor device in the pFET region of the semiconductor wafer after a fabrication stage according to one or more embodiments of the present invention;

FIG. 33D depicts a cross-sectional view of the semiconductor device shown in FIG. 33C rotated clockwise by 90 degrees;

FIG. 34A depicts a cross-sectional view of the semiconductor device in the nFET region of the semiconductor wafer after a fabrication stage according to one or more embodiments of the present invention;

FIG. 34B depicts a cross-sectional view of the semiconductor device shown in FIG. 34A rotated clockwise by 90 degrees;

FIG. 34C depicts a cross-sectional view of the semiconductor device in the pFET region of the semiconductor wafer after a fabrication stage according to one or more embodiments of the present invention;

FIG. 34D depicts a cross-sectional view of the semiconductor device shown in FIG. 34C rotated clockwise by 90 degrees;

FIG. 35A depicts a cross-sectional view of the semiconductor device in the nFET region of the semiconductor wafer after a fabrication stage according to one or more embodiments of the present invention;

FIG. 35B depicts a cross-sectional view taken along line B-B of the semiconductor device shown in FIG. 35A;

FIG. 35C depicts a cross-sectional view of the semiconductor device in the pFET region of the semiconductor wafer after a fabrication stage according to one or more embodiments of the present invention;

FIG. 35D depicts a cross-sectional view taken along line D-D of the semiconductor device shown in FIG. 35C;

FIG. 36A depicts a cross-sectional view of the semiconductor device in the nFET region of the semiconductor wafer after a fabrication stage according to one or more embodiments of the present invention;

FIG. 36B depicts a cross-sectional view taken along line B-B of the semiconductor device shown in FIG. 36A;

FIG. 36C depicts a cross-sectional view of the semiconductor device in the pFET region of the semiconductor wafer after a fabrication stage according to one or more embodiments of the present invention;

FIG. 36D depicts a cross-sectional view taken along line D-D of the semiconductor device shown in FIG. 36C;

FIG. 37A depicts a cross-sectional view of the semiconductor device in the nFET region of the semiconductor wafer after a fabrication stage according to one or more embodiments of the present invention;

FIG. 37B depicts a cross-sectional view taken along line B-B of the semiconductor device shown in FIG. 37A;

FIG. 37C depicts a cross-sectional view of the semiconductor device in the pFET region of the semiconductor wafer after a fabrication stage according to one or more embodiments of the present invention;

FIG. 37D depicts a cross-sectional view taken along line D-D of the semiconductor device shown in FIG. 37C;

FIG. 38A depicts a cross-sectional view of the semiconductor device in the nFET region of the semiconductor wafer after a fabrication stage according to one or more embodiments of the present invention;

FIG. 38B depicts a cross-sectional view taken along line B-B of the semiconductor device shown in FIG. 38A;

FIG. 38C depicts a cross-sectional view of the semiconductor device in the pFET region of the semiconductor wafer after a fabrication stage according to one or more embodiments of the present invention;

FIG. 38D depicts a cross-sectional view taken along line D-D of the semiconductor device shown in FIG. 38C;

FIG. 39A depicts a cross-sectional view of the semiconductor device in the nFET region of the semiconductor wafer after a fabrication stage according to one or more embodiments of the present invention;

FIG. 39B depicts a cross-sectional view taken along line B-B of the semiconductor device shown in FIG. 39A;

FIG. 39C depicts a cross-sectional view of the semiconductor device in the pFET region of the semiconductor wafer after a fabrication stage according to one or more embodiments of the present invention; and FIG. 39D depicts a cross-sectional view taken along line D-D of the semiconductor device shown in FIG. 39C.

DETAILED DESCRIPTION

It is understood in advance that although this invention includes a detailed description of exemplary GAA nanosheet FET architectures, embodiments of the invention are not limited to the particular FET architectures described in this specification. Rather, embodiments of the present invention are capable of being implemented in conjunction with any other type of nanosheet/nanowire FET architecture now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions.

A semiconductor wafer includes multiple FETs, with each FET having a source, a drain, a channel and a gate. The channel connects the source and the drain, and electrical current flows through the channel from the source to the drain. Electrical current flow is induced in the channel by a voltage applied at the gate. The size of an FET is related to the electrical conductivity of the FET channel material. If the channel material has relatively high conductivity, the FET can be made correspondingly smaller. One method of forming a relatively small FET is to form the channel as a series of nanostructures using nanosheets or nanowires.

Gate-all-around (GAA) nanosheet channel FETs enable feature scaling beyond current planar CMOS technology. In its basic form, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are silicon (Si) and the sacrificial nanosheets are silicon germanium (SiGe). For p-type FETs, the channel nanosheets are SiGe and the sacrificial nanosheets are Si. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. For example, controlling punch-through leakage currents can be difficult in nanosheet channel FETs because it is difficult to form punch-through stopper junctions in a nanosheet channel FET architecture. Additionally, it can be difficult to integrate silicon channel nFET and silicon germanium channel pFET structures on the same substrate for a variety of reasons, including, for example, the fact that the chemistries used in the processes to release sacrificial silicon from silicon germanium for pFET devices are different from the chemistries that are used to release sacrificial silicon germanium from silicon for nFET devices. Another reason it can be difficult to integrate silicon channel nFET and silicon germanium channel pFET structures on the same substrate is the different gate stack architectures that can be required for nFET and pFET threshold voltages.

Turning now to an overview of aspects of the present invention, embodiments described herein provide fabrication methodologies and resulting devices for stacked nanowire transistors having sufficient dielectric isolation to address punch-through or leakage currents, nFET channels and pFET channels formed on the same wafer, the capability to provide the same gate architectures for nFET and pFET regions/devices, and the capability to provide different nFET and pFET gate architectures having different threshold voltages.

In one or more embodiments of the present invention, the semiconductor device fabrication methodology includes processes to form or open a cavity region (or insulation region) between a major surface of the substrate and the nanosheet channels using a novel process referred to herein as a "thick silicon selective etch." According to exemplary embodiments of the thick silicon selective etch process, a first sacrificial nanosheet layer is formed over a substrate, and a nanosheet stack of alternating sacrificial nanosheets and channel nanosheets is formed over the sacrificial nanosheet layer. The thickness dimension of the first sacrificial nanosheet layer is selected to be larger than the thickness dimension of each of the alternating sacrificial nanosheets and channel nanosheets of the nanosheet stack. For example, according to embodiments of the present invention, the thickness dimension of the first sacrificial nanosheet layer is approximately 30 nm, the thickness of each of the alternating sacrificial nanosheets and channel nanosheets of the nanosheet stack is approximately 5 nm. A surface area of the first sacrificial nanosheet is exposed, and surface areas of each of the alternating sacrificial nanosheets and channel nanosheets of the nanosheet stack are exposed. Because the first sacrificial nanosheet is thicker than each of the alternating nanosheets of the nanosheet stack (e.g., 6 times thicker), the exposed surface area of the first sacrificial nanosheet is greater than each exposed surface area of the alternating sacrificial nanosheets and channel nanosheets of the nanosheet stack.

Thus, according to embodiments of the present invention, by providing a selected nanosheet (e.g., the first sacrificial nanosheet) that is thicker than each alternating nanosheet that forms the nanosheet stack, and by exposing more surface area of the thicker nanosheets than other nanosheets, an etch process that is selective to (i.e., "faster" for) certain materials (e.g., silicon) and/or the amount of exposed surface area can be applied at this stage of the fabrication process to completely remove the thicker nanosheet (e.g., the first sacrificial nanosheet) without substantially disturbing the thinner alternating nanosheets that form the nanosheet stack. A suitable etchant for removing to the thicker nanosheet without substantially disturbing the thinner nanosheets that form the nanosheet stack includes but is not limited to various ammonia-based etchants (e.g., $NH_4OH$ or equivalents thereof). Selectivity, as used in the present description, refers to the tendency of a process operation to impact a particular material. One example of low selectivity is a relatively slow etch rate. One example of a higher or greater selectivity is a relatively faster etch rate.

The above-described cavity (or insulation) region can be filled with a dielectric to provide isolation. Various example fabrication methodologies are described herein for forming the dielectric region. Additionally, the various fabrication methodologies described herein form stacked nanowire transistors having sufficient dielectric isolation to address punch-through or leakage currents, nFET channels and pFET channels formed on the same wafer, the capability to provide the same gate architectures for nFET and pFET regions/devices, and the capability to provide different nFET and pFET gate architectures having different threshold voltages. More specifically, FIGS. 1A to 21 describe processes for fabricating a semiconductor device according to embodiments of the invention, wherein, in addition to the above-described features, device isolation is provided later in the fabrication processes. FIGS. 22A to 24D describe processes for fabricating a semiconductor device according to embodiments of the invention, wherein, in addition to the above-described features, device isolation is provided earlier in the fabrication processes. FIGS. 25A to 28D describe processes for fabricating a semiconductor device according to embodiments of the invention, wherein, in addition to the above-described features, device isolation is provided even earlier in the fabrication processes. FIGS. 29A to 39D describe processes for fabricating a semiconductor device according to embodiments of the invention, wherein, in addition to the above-described features, greater device isolation is provided earlier in the fabrication processes.

Figure 21:
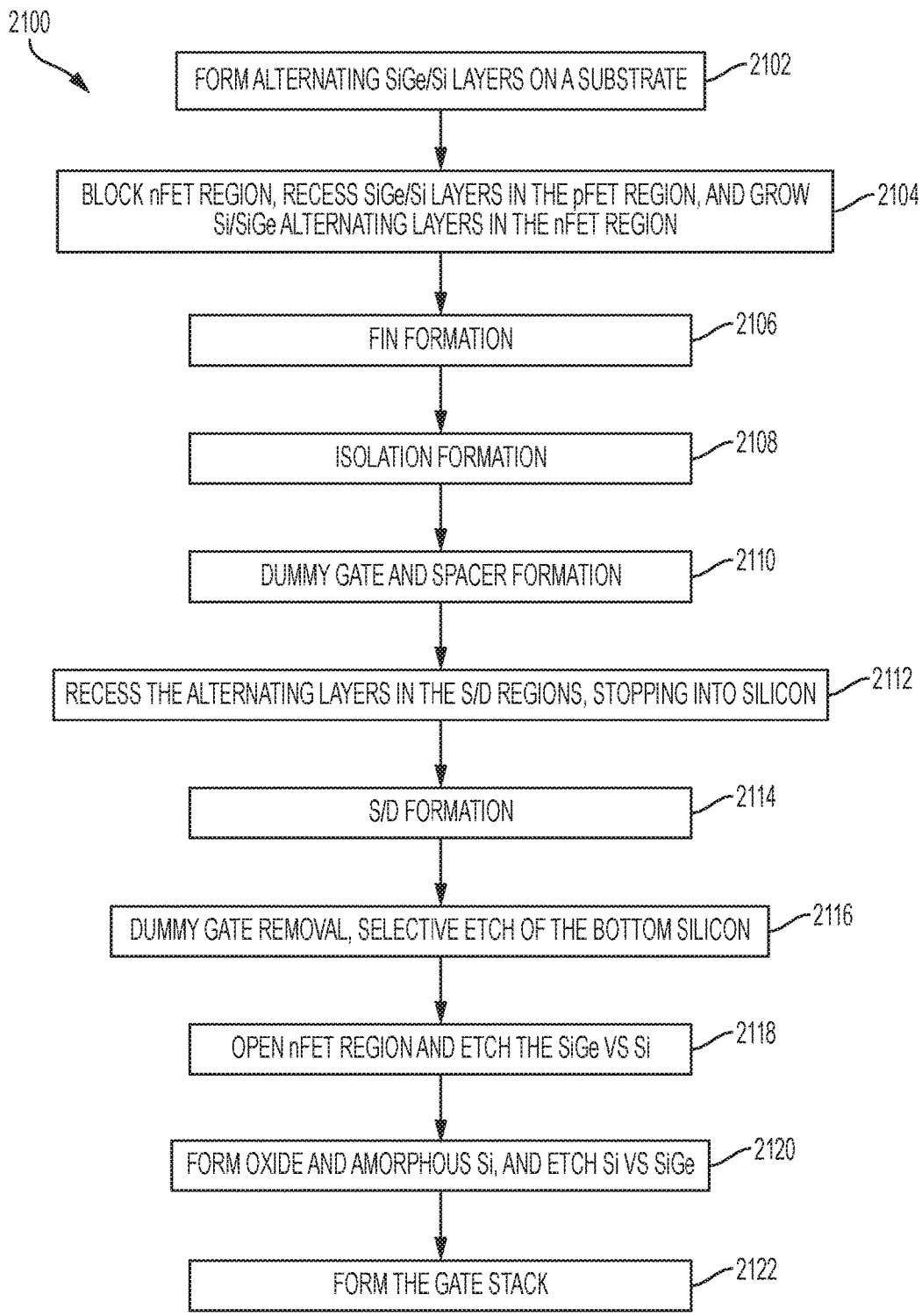
FIG. 21 is a flow diagram illustrating a methodology according to one or more embodiments.

Turning now to a more detailed description of embodiments of the present invention, FIGS. 1A-20D are diagrams illustrating nFET and pFET GAA nanosheet FET devices after various stages of a fin-first, wire-last replacement gate fabrication methodology according to one or more embodiments of the present invention. FIGS. 1A through 20D depict views of a substrate after stages of forming pFET semiconductor devices and nFET semiconductor devices on the same substrate according to one or more embodiments of the present invention. FIG. 21 depicts a methodology 2100 of forming pFET semiconductor devices and nFET semiconductor devices on the same substrate according to one or more embodiments of the present invention. The following describes aspects of the present invention with reference to the structures shown in FIGS. 1A through 20D and the methodology 2100 shown in FIG. 21.

Figure 1B:
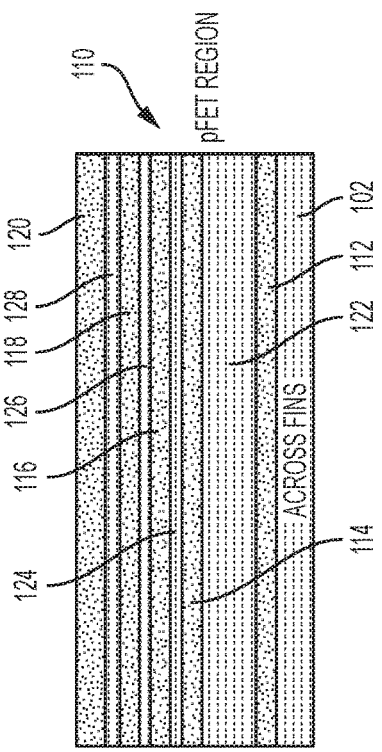
FIG. 1B depicts a cross-sectional view of the semiconductor device shown in FIG. 1A rotated clockwise by 90 degrees.
Figure 1C:
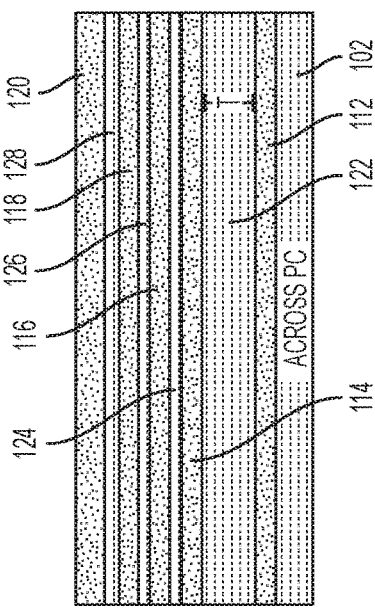
FIG. 1C depicts a cross-sectional view of a semiconductor device in a pFET region of the semiconductor wafer after a fabrication stage according to one or more embodiments of the present invention.
Figure 1D:
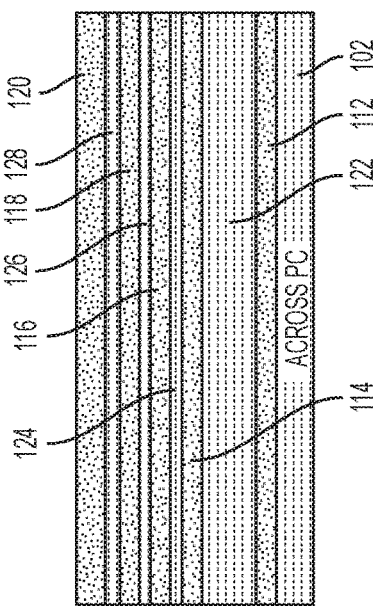
FIG. 1D depicts a cross-sectional view of the semiconductor device shown in FIG. 1C rotated clockwise by 90 degrees.

A general description of the various drawing views will now be provided. FIGS. 1A, 1B, 1C, and 1D depict cross-sectional views of portions a silicon wafer after an initial fabrication stage for forming an nFET device and a pFET device on the same silicon substrate according to embodiments of the present invention. More specifically, FIG. 1A depicts a cross-section of an nFET region 140 viewed across what will be the gate of the ultimate nFET structure, FIG. 1B depicts a cross-section of the nFET region 140 viewed across what will be the fins of the ultimate nFET structure, FIG. 1C depicts a cross-section of the pFET region 110 viewed across what will be the gate of the ultimate pFET structure, and FIG. 1D depicts a cross-section of the pFET region 110 viewed across what will be the fins of the ultimate nFET structure. Additionally, FIG. 1B is the cross-section of the nFET region 140 shown in FIG. 1A rotated clockwise by 90 degrees. FIG. 1D is the cross-section of the pFET region 110 shown in FIG. 1C rotated clockwise by 90 degrees. Although one nFET region 140 and one pFET region 110 are depicted in the figures, it is contemplated that in practice multiple nFET regions and pFET regions can be provided on the silicon substrate 102.

The view of the nFET region 140 shown in FIG. 1A is maintained throughout FIGS. 2A, 3A, 4A, 5A, and 6A. Similarly, the view of the nFET region 140 shown in FIG. 1B is maintained throughout FIGS. 2B, 3B, 4B, 5B, and 6B. Similarly, the view of the pFET region 110 shown in FIG. 1C is maintained throughout FIGS. 2C, 3C, 4C, 5C, and 6C. Finally, the view of the pFET region 110 shown in FIG. 1D is maintained throughout FIGS. 2D, 3D, 4D, 5D, and 6D.

FIGS. 7A, 7B, 7C, and 7D depict cross-sectional views of portions of the silicon wafer after additional fabrication stages for forming the nFET device and the pFET device on the same silicon substrate according to embodiments of the present invention. More specifically, FIG. 7A depicts a cross-sectional view of the nFET device in the nFET region 140 of the semiconductor wafer after a fabrication stage according to one or more embodiments of the present invention. FIG. 7B depicts a cross-sectional view taken along line B-B of the nFET device shown in FIG. 7A. FIG. 7C depicts a cross-sectional view of the pFET device in the pFET region 110 of the semiconductor wafer after a fabrication stage according to one or more embodiments of the present invention. FIG. 7D depicts a cross-sectional view taken along line D-D of the pFET device shown in FIG. 7C.

The view of the nFET region 140 shown in FIG. 7A is maintained throughout FIGS. 8A, 9A, 10A, 11A, 12A, 13A, 14A, 15A, 16A, 17A, 18A, 19A, and 20A. Similarly, the view of the nFET region 140 shown in FIG. 7B is maintained throughout FIGS. 8B, 9B, 10B, 11B, 12B, 13B, 14B, 15B, 16B, 17B, 18B, 19B, and 20B. Similarly, the view of the pFET region 110 shown in FIG. 7C is maintained throughout FIGS. 8C, 9C, 10C, 11C, 12C, 13C, 14C, 15C, 16C, 17C, 18C, 19C, and 20C. Finally, the view of the pFET region 110 shown in FIG. 7D is maintained throughout FIGS. 8D, 9D, 10D, 11D, 12D, 13D, 14D, 15D, 16D, 17D, 18D, 19D, and 20D.

Turning now to a more detailed description of aspects of the invention, at initial stages of the described fabrication processes, the nFET region 140 and the pFET region 110 are the same, and, accordingly, the cross-sections depicted in FIGS. 1A, 1B, 1C and 1D are the same. As shown in FIG. 1A, an alternating series of sacrificial silicon germanium nanosheet layers 112, 114, 116, 118, 120 and silicon nanosheet layers 122, 124, 126, 128 are formed in a stack on a bulk silicon substrate 102. (Block 2102). Specifically, moving in the direction from bottom to top, the first silicon germanium nanosheet 112 is formed over the silicon substrate 102, and the first silicon nanosheet layer 122 is formed over the first silicon germanium nanosheet 112. According to embodiments of the present invention, and for reasons that will be explained in greater detail later in this detailed description, the first silicon nanosheet layer 122 is formed to a thickness dimension (T) that is greater than the thickness dimension of the first silicon germanium nanosheet 112, which will function as an etch stop layer. According to embodiments of the present invention, and for reasons that will be explained in greater detail later in this detailed description, the next three silicon nanosheet layers 124, 126, 128 are each formed to a thickness dimension that is less than the thickness dimension of the next three silicon germanium nanosheet layers 114, 116, 118. The last (or top) silicon germanium nanosheet layer 120, which functions as a sacrificial cap, is formed to a thickness dimension that is greater than the thickness dimension of silicon germanium nanosheet layers 114, 116, 118.

In one or more embodiments, the alternating series of sacrificial silicon germanium nanosheet layers 112, 114, 116, 118, 120 and silicon nanosheet layers 122, 124, 126, 128 are formed by epitaxially growing one layer and then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

As depicted in FIGS. 2A, 2B, 2C and 2D, a nitride hard mask 202 has been deposited over the sacrificial cap silicon germanium nanosheet layer 120, which covers the pFET region 110 (shown in FIGS. 2C and 2D) and the nFET region 140 (shown in FIGS. 2A and 2B). As depicted in FIGS. 2A and 2B, a mask block 204 has been deposited over the sacrificial cap silicon germanium nanosheet layer 120 to cover the nFET region 140 but not cover the pFET region 110.

As depicted in FIGS. 3C and 3D, the portion of the nitride hard mask 202 that is over the pFET region 110 has been removed, and the alternating series of silicon germanium nanosheet layers 114, 116, 118, 120 and silicon nanosheet layers 122, 124, 126, 128 have been recessed, stopping partly into the first silicon nanosheet layer 122. Nanosheet layers in the nFET region 140 remain intact during the above-described removal and recess processes because, as shown in FIGS. 3A and 3B, they are protected by the block mask 204. (Block 2104).

Figure 4A:
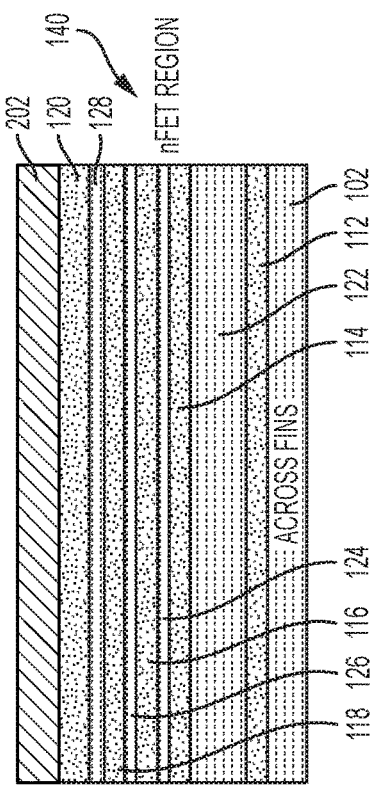
FIG. 4A depicts a cross-sectional view of the semiconductor device in the nFET region of the semiconductor wafer after a fabrication stage according to one or more embodiments of the present invention.
Figure 4B:
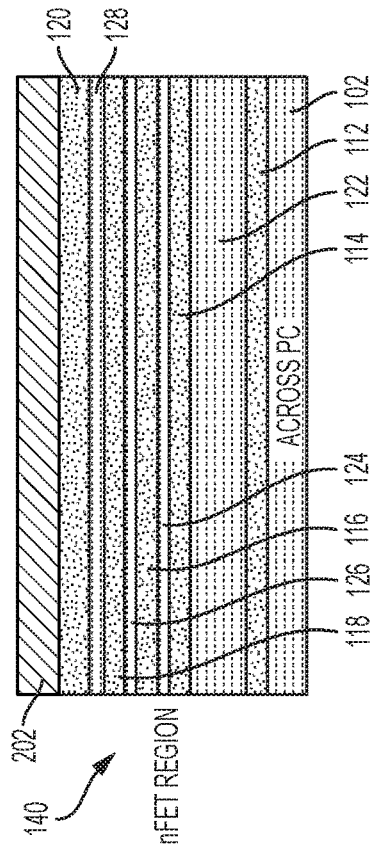
FIG. 4B depicts a cross-sectional view of the semiconductor device shown in FIG. 4A rotated clockwise by 90 degrees.
Figure 4C:
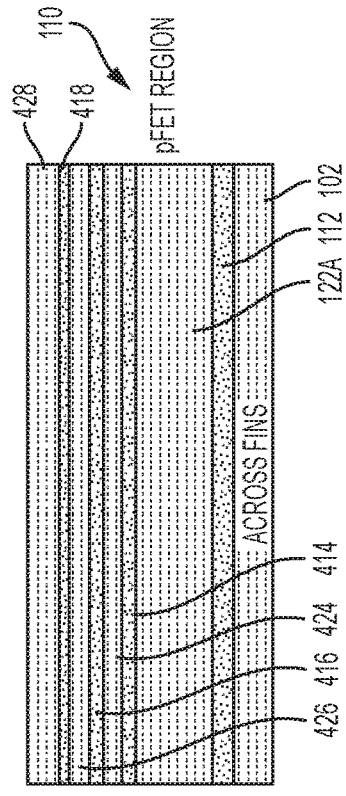
FIG. 4C depicts a cross-sectional view of the semiconductor device in the pFET region of the semiconductor wafer after a fabrication stage according to one or more embodiments of the present invention.
Figure 4D:
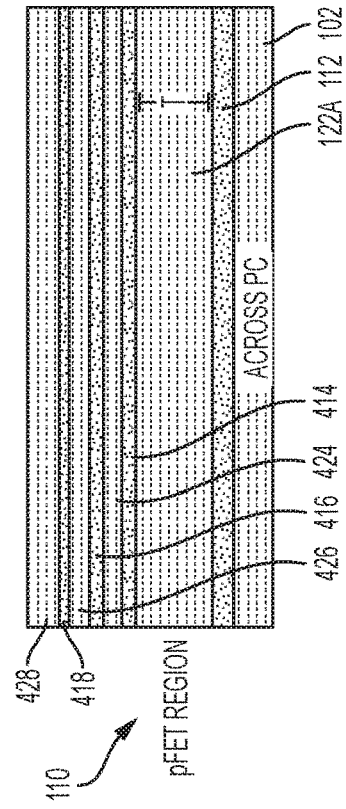
FIG. 4D depicts a cross-sectional view of the semiconductor device shown in FIG. 4C rotated clockwise by 90 degrees.

As depicted in FIGS. 4A and 4B, the block mask 204 covering the nFET region 140 has been stripped away. As depicted in FIGS. 4C and 4D, the first silicon nanosheet layer 122 has been re-grown to form, in the pFET region 110, a new first silicon nanosheet layer 122A and a new alternating series of silicon germanium nanosheet layers 414, 416, 418 and sacrificial silicon nanosheet layers 424, 426, 428 formed in a stack on the new first silicon nanosheet layer 122A. Specifically, moving in the direction from bottom to top, the first silicon germanium nanosheet 112 is formed over the silicon substrate 102, and the first silicon nanosheet layer 122A is formed over the first silicon germanium nanosheet 112. According to embodiments of the present invention, and for reasons that will be explained in greater detail later in this detailed description, the first silicon nanosheet layer 122A is formed to a thickness dimension (T) that is greater than the thickness dimension of the first silicon germanium nanosheet 112, which will function as an etch stop layer. According to embodiments of the present invention, and for reasons that will be explained in greater detail later in this detailed description, the next three silicon nanosheet layers 424, 426, 428 are each formed to a thickness dimension that is greater than the thickness dimension of the next three silicon germanium nanosheet layers 414, 416, 418. The last (or top) silicon nanosheet layer 428, which functions as a sacrificial cap, is formed to a thickness dimension that is greater than the thickness dimensions of silicon nanosheet layers 424, 426.

As depicted in FIGS. 5C and 5D, a new nitride hard mask 502 has been deposited over the sacrificial cap silicon nanosheet layer 428 in the pFET region 140. As best shown in FIGS. 5B and 5D, known processing techniques have been applied to the pFET region 110 and the nFET region 140 to form a plurality of fin-shaped regions 504 in the pFET region 110 and a plurality of fin-shaped regions 506 in the nFET region 140 (Block 2106). As shown in FIG. 5D, each of the fin-shaped regions 504 in the pFET region 110 includes an alternating series of silicon nanosheet layers 122A, 424, 426, 428 and silicon germanium nanosheet layers 414, 416, 418 formed in a stack. As shown in FIG. 5B, each of the fin-shaped regions 506 in the nFET region 140 includes an alternating series of sacrificial silicon germanium nanosheet layers 112, 114, 116, 118, 120 and silicon nanosheet layers 122, 124, 126, 128 formed in a stack.

The process to form the fin-shaped regions 504 shown in FIG. 5D includes patterning the nitride hard mask 502 into the desired dimensions of the plurality of individual fin-shaped regions 504. The patterning of the hard mask 502 is commensurate with a desired footprint and location of fin-shaped region 504, which will be used to form the channel regions of the ultimate pFET semiconductor device that will be formed in the pFET region 110. According to an exemplary embodiment, a resist film (not shown) is deposited on the hard mask 502 and patterned with the footprint and location of each of fin-shaped regions 504. In one example, RIE is used to form the hard masks 502 and the fin-shaped regions 504.

Similar to the process used to form the fin-shaped regions 504 shown in FIG. 5D, the process to form the fin-shaped regions 506 shown in FIG. 5B includes patterning the nitride hard mask 202 into the desired dimensions of the plurality of individual fin-shaped regions 506. The patterning of the hard mask 202 is commensurate with a desired footprint and location of fin-shaped region 506, which will be used to form the channel regions of the nFET semiconductor device that will be formed in the nFET region 140. According to an exemplary embodiment, a resist film (not shown) is deposited on the hard mask 202 and patterned with the footprint and location of each of fin-shaped region 506. In one example, RIE is used to form the hard masks 202 and the fin-shaped regions 506.

As depicted in FIGS. 6B and 6D, one or more dielectric materials (e.g., an oxide) are deposited in trenches between the fin-shaped regions 504, 506, and then one or more recess and planarization techniques (e.g., chemical mechanical planarization (CMP)) are applied to recess and planarize the dielectric materials to a selected level and form shallow trench isolation (STI) regions 602, 604 in the pFET region 110 and the nFET region 140, respectively (Block 2108). More specifically, as depicted in FIG. 6D, one or more dielectric materials (e.g., an oxide) are deposited in the trenches between the fin-shaped regions 504, and then one or more recess and planarization techniques (e.g., CMP) are applied to recess and planarize the dielectric materials to a selected level and form STI regions 602 in the pFET region 110. The selected level of the STI regions 602 is within the first silicon nanosheets 122A and above the first silicon germanium nanosheets 112 of the pFET region 110. Similarly, as depicted in FIG. 6B, one or more dielectric materials (e.g., an oxide) are deposited in the trenches between the fin-shaped regions 506, and then one or more recess and planarization techniques (e.g., CMP) are applied to recess and planarize the dielectric materials to a selected level and form STI regions 604 in the nFET region 140. The selected level of the STI regions 604 is within the first silicon nanosheets 122 and above the first silicon germanium nanosheets 112 of the nFET region 140.

In FIGS. 7A, 7B, 7C and 7D, dummy gates have been patterned and formed in the pFET region 110 and the nFET region 140 (Block 2110). In the pFET region 110, as best shown in FIG. 7D, the hard masks 502 have been removed, and a very thin gate dielectric layer 702 is deposited over the fin-shaped regions 504. Amorphous silicon (a-Si) is deposited over the pFET region 110, and then planarized to a desired level. A bi-layer hard mask, which is formed from a nitride layer 720 and an oxide layer 722, is deposited over the amorphous silicon. The hard mask 720, 722 is then patterned, and an etching process is applied to form dummy gates 730, 732, 734, which are best shown in FIG. 7C.

In the nFET region 140, as best shown in FIG. 7B, the hard masks 202 have been removed, and the very thin gate dielectric layer 702 has been deposited over the fin-shaped regions 506. The amorphous silicon (a-Si) is deposited over the nFET region 140, and then planarized to a desired level. The hard mask 720, 722 is deposited over the amorphous silicon. The hard mask 720, 722 is then patterned, and an etching process is applied to form dummy gates 730A, 732A, 734A, which are best shown in FIG. 7A. In one or more embodiments, substantially the same fabrication processes are used to form the very thin gate dielectric layer 702, the amorphous silicon 710, the bi-layer hard mask formed from nitride layer 720 and oxide layer 722, and the dummy gates 730, 732, 734, 730A, 732A, 734A in the pFET region 110 and the nFET region 140.

Figure 8A:
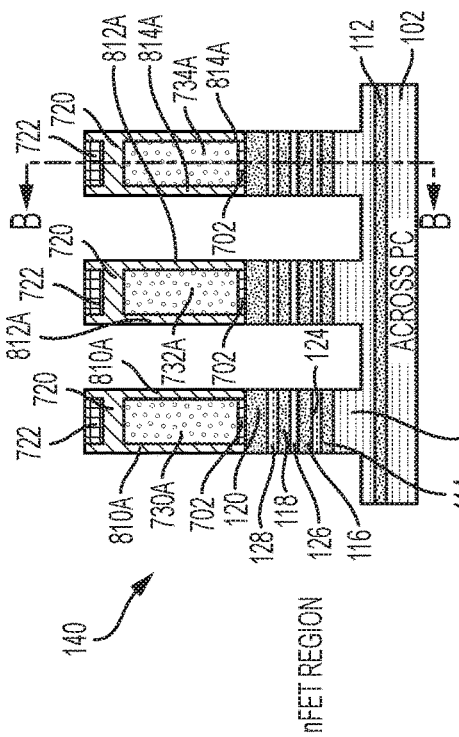
FIG. 8A depicts a cross-sectional view of the semiconductor device in the nFET region of the semiconductor wafer after a fabrication stage according to one or more embodiments of the present invention.
Figure 8B:
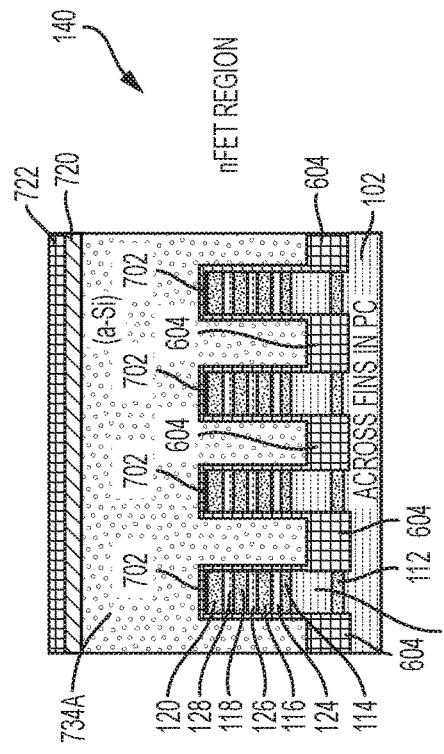
FIG. 8B depicts a cross-sectional view taken along line B-B of the semiconductor device shown in FIG. 8A.
Figure 8C:
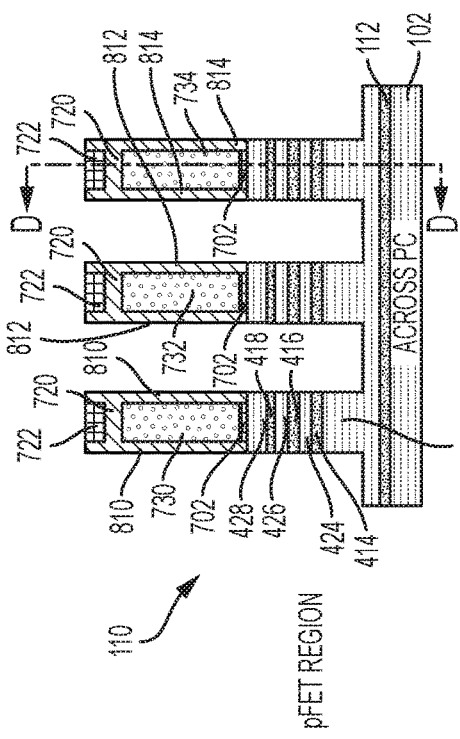
FIG. 8C depicts a cross-sectional view of the semiconductor device in the pFET region of the semiconductor wafer after a fabrication stage according to one or more embodiments of the present invention.
Figure 8D:
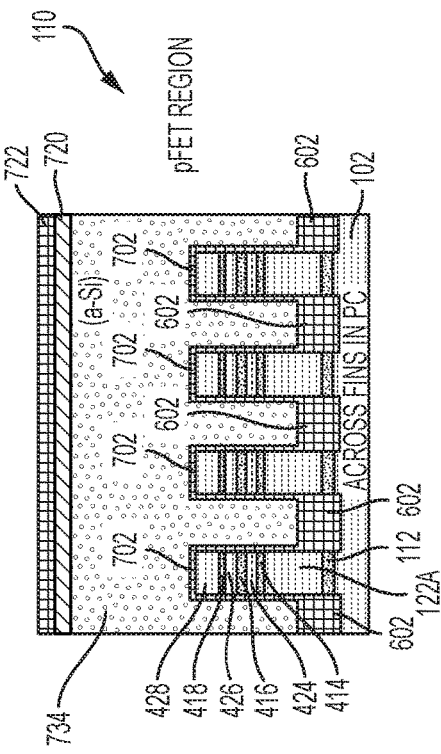
FIG. 8D depicts a cross-sectional view taken along line D-D of the semiconductor device shown in FIG. 8C.

As best shown in FIG. 8C, offset spacers 810, 812, 814 are formed along the dummy gates 730, 732, 734 in the pFET region 110, and then a recess is applied to fin-shaped regions 504 (Block 2110). Offset spacers 810, 812, 814 can be formed using a spacer pull down formation process. Offset spacers 810, 812, 814 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE). The recess that is applied to fin-shaped regions 506 is stopped at a level that is into the first silicon nanosheet layers 122A but before the top level of the first silicon germanium nanosheet layer 112.

Similar to the pFET region 110, as best shown in FIG. 8A, offset spacers 810A, 812A, 814A are formed along the dummy gates 730A, 732A, 734A in the nFET region 140, and then a recess is applied to fin-shaped regions 506. Offset spacers 810A, 812A, 814A can be formed using a spacer pull down formation process. Offset spacers 810A, 812A, 814A can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE) (Block 2112). The recess that is applied to fin-shaped regions 506 is stopped at a level that is into the first silicon nanosheet layers 122 but before the top level of the first silicon germanium nanosheet layer 112. In one or more embodiments, substantially the same fabrication processes are used to form the offset spacers 810, 812, 814, 810A, 812A, 814A and recess the fin-shaped regions 504, 506 in the pFET region 110 and the nFET region 140.

As best shown in FIG. 9C, raised source/drain (S/D) regions 902 have been epitaxially grown over a horizontal surface of the first silicon nanosheet layers 122A and extending vertically along opposite sidewalls of the fin-shaped regions 504 in the pFET region 110 (Block 2114). To grow the S/D regions 902, the nFET region 140 is block masked, and then S/D regions 902 are grown using, for example, an epitaxial process of the type previously described herein. The S/D regions 902 are epitaxially formed with the appropriate in-situ doping to create the necessary junctions of the semiconductor device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which includes a contact between a p-type piece of silicon, rich in holes, and an n-type piece of silicon, rich in electrons. N-type and p-type FETs are formed by providing different types of dopants in selected regions of the device to form the necessary junction(s). N-type devices can be formed by providing, for example, arsenic (As) or phosphorous (P) as the dopant, and p-type devices can be formed by providing, for example, boron (B) as the dopant. Because, p-type FET devices will be formed in the pFET region 110, S/D regions 902 are epitaxially formed with appropriate doping to create the necessary junctions of a p-type FET semiconductor device.

As best shown in FIG. 9A, raised source/drain (S/D) regions 904 have been epitaxially grown over a horizontal surface of the first silicon nanosheet layers 122 and extending vertically along opposite sidewalls of the fin-shaped regions 506 in the nFET region 140. To grow the S/D regions 904, the pFET region 110 is block masked, and then S/D regions 904 are grown using, for example, an epitaxial process of the type previously described herein. Similar to the formation of the S/D regions 902, the S/D regions 904 are epitaxially formed with appropriate in-situ doping to create the necessary junctions of the semiconductor device. As previously noted herein, n-type and p-type FETs are formed by providing different types of dopants in selected regions of the device to form the necessary junction(s). N-type devices can be formed by providing, for example, arsenic (As) or phosphorous (P) as the dopant, and p-type devices can be formed by providing, for example, boron (B) as the dopant. Because, n-type FET devices will be formed in the nFET region 140, S/D regions 904 are epitaxially formed with appropriate doping to create the necessary junctions of an n-type FET semiconductor device.

As best shown in FIGS. 10A and 10C, a thin nitride layer 1002 has been deposited over the S/D regions 902, 904, and an oxide fill 1004 is deposited to fill in the spaces between the dummy gates 730, 732, 734 (or more specifically the offset spacers 810, 812, 814) in the pFET region 110, as well as the spaces between the dummy gates 730A, 732A, 734A (or more specifically the offset spacers 810A, 812A, 814A) in the nFET region 140. The oxide fill 1004 is then polished back using, for example, a CMP, which removes the bi-layer hard mask 720, 722 and planarizes the top surface of the oxide fill 1004 with the top surfaces of the dummy gates 730, 732, 734 in the pFET region 110, and also planarizes the top surface of the oxide fill 1004 with the top surfaces of the dummy gates 730A, 732A, 734A in the nFET region 140.

As depicted in FIGS. 11A, 11B, 11C, and 11D, the dummy gates 730, 732, 734, 730A, 732A, 734A have been removed (Block 2116). More specifically, FIGS. 11C and 11D depict that the dummy gates 730, 732, 734 have been removed in the pFET region 110, and FIGS. 11A and 11B depict that the dummy gates 730A, 732A, 734A have been removed in the nFET region 140. The dummy gates 730, 732, 734, 730A, 732A, 734A can be removed using any suitable known etching process, e.g., ammonia (Nh$_4$OH) or RIE. The thin gate dielectric layer 702 can be removed using any suitable technique, e.g., chemical oxide removal, chemical oxide removal (COR), or HF-based chemistry.

Figure 12B:
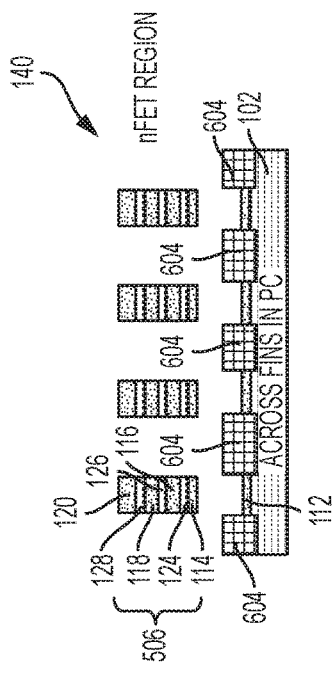
FIG. 12B depicts a cross-sectional view taken along line B-B of the semiconductor device shown in FIG. 12A.
Figure 12D:
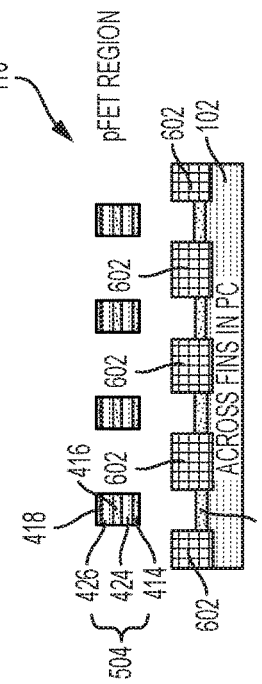
FIG. 12D depicts a cross-sectional view taken along line D-D of the semiconductor device shown in FIG. 12C.
Figure 12A:
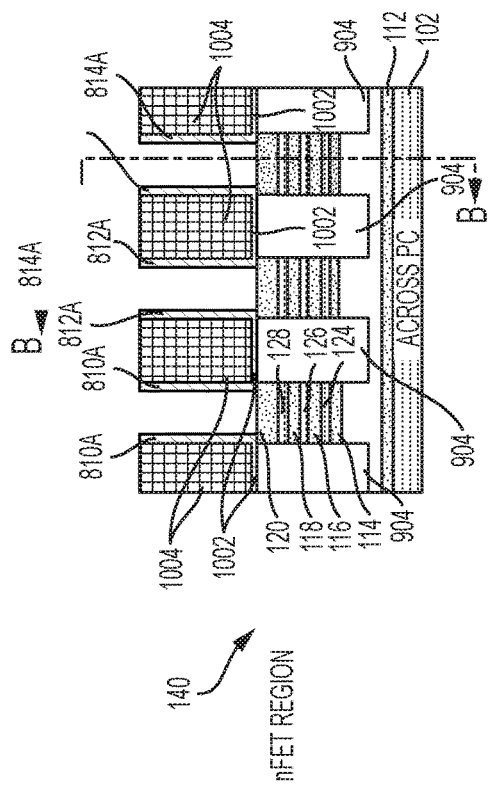
FIG. 12A depicts a cross-sectional view of the semiconductor device in the nFET region of the semiconductor wafer after a fabrication stage according to one or more embodiments of the present invention.
Figure 12C:
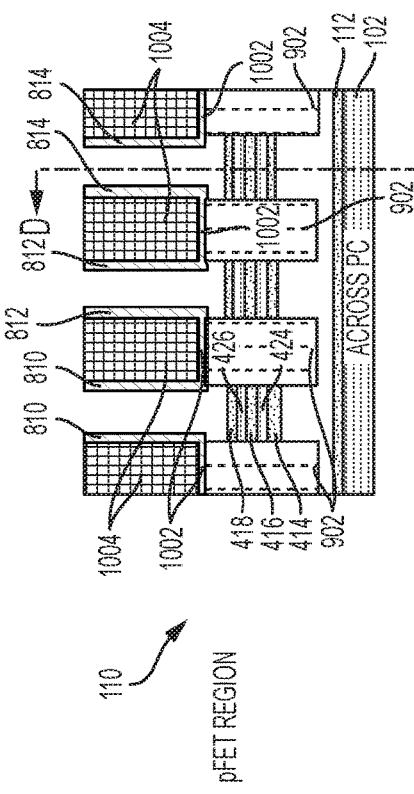
FIG. 12C depicts a cross-sectional view of the semiconductor device in the pFET region of the semiconductor wafer after a fabrication stage according to one or more embodiments of the present invention.

As depicted in FIGS. 12A, 12B, 12C, and 12D, the very thin gate dielectric layer 702 has been removed from over the top and two of the four sidewalls of the fin-shaped regions 504, 506. More specifically, FIGS. 12C and 12D show that the very thin gate dielectric layer 702 has been removed from over the top and two of the four sidewalls of the fin-shaped regions 504 in the pFET region 110, and FIGS. 12A and 12B show that the very thin gate dielectric layer 702 has been removed from over the top and two of the four sidewalls of the fin-shaped regions 506 in the nFET region 140. In the pFET region 110, as best shown in FIGS. 12C and 12D, with the gate dielectric layer 702 and the dummy gates 730, 732, 734 removed (as depicted in FIGS. 11C and 11D), the fin-shaped regions 504 are protected on two sides by the S/D regions 902 but are exposed on two sides and the top. Similarly, in the nFET region 140, as best shown in FIGS. 12A and 12B, with the gate dielectric layer 702 and the dummy gates 730A, 732A, 734A removed (as depicted in FIGS. 11A and 11B), the fin-shaped regions 506 are protected on two sides by the S/D regions 904 but are exposed on two sides and the top.

As further depicted in FIGS. 12C and 12D, the first silicon nanosheet 122A in the pFET region 110, along with the sacrificial cap silicon nanosheets 428, have been removed. As further depicted in FIGS. 12A and 12B, the first silicon nanosheet 122 in the nFET region 140 has been removed (Block 2116). According to embodiments of the present invention, the removal of the first silicon nanosheet layer 122A, the sacrificial cap silicon nanosheets 428, and the first silicon nanosheet layer 122 are accomplished using a process referred to herein as a "thick silicon selective etch." As previously described herein, the thickness of the first silicon nanosheet layer 122A, the sacrificial cap silicon nanosheets 428, and the first silicon nanosheet layer 122 are intentionally selected to greater than the thickness of the silicon nanosheets 124, 136, 128, 424, 426. As a non-limiting example, the thickness of each of the silicon nanosheets 124, 136, 128, 424, 426 can be approximately 5 nanometers (nm), and the thickness of each of the first silicon nanosheet layer 122A, the sacrificial cap silicon nanosheets 428, and the first silicon nanosheet layer 122 can be approximately 30 nm. Thus, according to embodiments of the present invention, by providing selected nanosheets that are thicker than other nanosheet, and by exposing more surface area of the thicker layers than other nanosheets, an etch process that is selective to (i.e., "faster" for) both certain materials (e.g., silicon) and the amount of exposed surface area can be applied at this stage of the fabrication process to completely remove the thicker silicon nanosheets (e.g., silicon nanosheets 122A, 428, 122) without substantially disturbing the thinner silicon nanosheet (e.g., silicon nanosheets 124, 136, 128, 424, 426). Accordingly, a suitable etchant for removing to the thicker silicon nanosheets 122A, 428, 122 without substantially disturbing the thinner silicon nanosheet 124, 136, 128, 424, 426 includes but is not limited to various ammonia-based etchants (e.g., NH$_4$OH or equivalents thereof).

FIGS. 13A, 13B, 13C and 13D depict the results of initial fabrication processes to co-integrate the silicon and silicon germanium channels of the pFET region 110 and the nFET region 140. As best shown in FIGS. 13A, 13B, 13C and 13D, oxide and nitride depositions are performed to fill oxide/nitride into the spaces that were occupied by the silicon nanosheets 122A, 428, 122, as well as the exposed surfaces of the fin-shaped regions 504, 506 and the oxide fill regions 1004, resulting in first oxide regions 1302 and first nitride regions 1304. As best shown in FIG. 13D, the first nitride region 1302 pinches off at the bottom of the fin-shaped regions 504. As best shown in FIG. 13B, the first nitride region 1302 pinches off at the bottom of the fin-shaped regions 506.

As best shown in FIGS. 14C and 14D, the pFET region 110 is blocked, and, as best shown in FIGS. 14A and 14B, an isotropic etch (i.e., etchant that etches vertically and horizontally) is applied to remove most of the first nitride region 1304 and the first oxide region 1302 from the nFET region 140. The isotropic etch is stopped to leave first nitride region 1304A and first oxide region 1302A in the nFET region 140 as depicted in FIG. 14B.

As best shown in FIGS. 15C and 15D, the pFET region 110 remains blocked, and, as best shown in FIGS. 15A and 15B, a selective etch (e.g., a hydrochloric acid (HCl)) is applied to remove the sacrificial silicon germanium nanosheet layers 114, 116, 118, 120 from the fin-shaped regions 506 of the nFET region 140 (Block 2118). The first nitride region 1304A and the first oxide region 1302A in the nFET region 140 protect the first silicon germanium nanosheet layer 112 from being removed as depicted in FIG. 15B.

As best shown in FIGS. 16C and 16D, after a subsequent fabrication operation, the pFET region 110 remains blocked, and, as best shown in FIGS. 16A and 16B, an oxide 1602 (e.g., silicon dioxide) is deposited in the nFET region 140. As best shown in FIGS. 16A, 16B, 16C and 16D, after the oxide 1602 has been deposited in the nFET region 140, the pFET region 110 is unblocked, and amorphous silicon 1604 is deposited over the nFET region 140 and the pFET region 110.

Figure 17B:
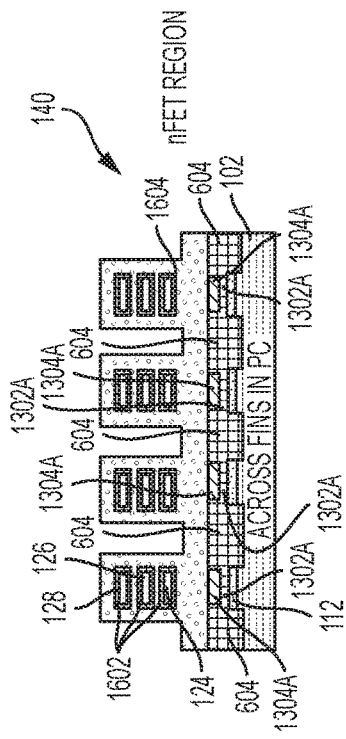
FIG. 17B depicts a cross-sectional view taken along line B-B of the semiconductor device shown in FIG. 17A.
Figure 17D:
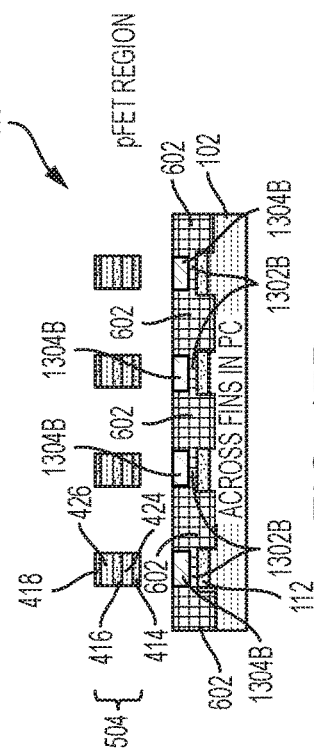
FIG. 17D depicts a cross-sectional view taken along line D-D of the semiconductor device shown in FIG. 17C.
Figure 17A:
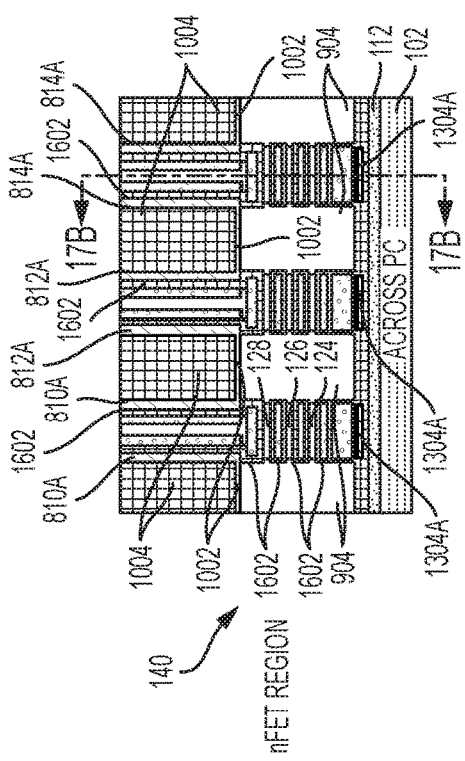
FIG. 17A depicts a cross-sectional view of the semiconductor device in the nFET region of the semiconductor wafer after a fabrication stage according to one or more embodiments of the present invention.
Figure 17C:
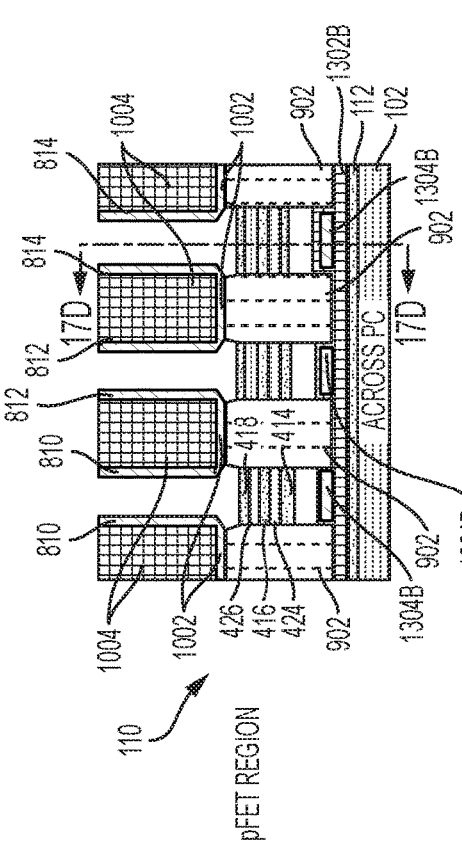
FIG. 17C depicts a cross-sectional view of the semiconductor device in the pFET region of the semiconductor wafer after a fabrication stage according to one or more embodiments of the present invention.
Figure 20B:
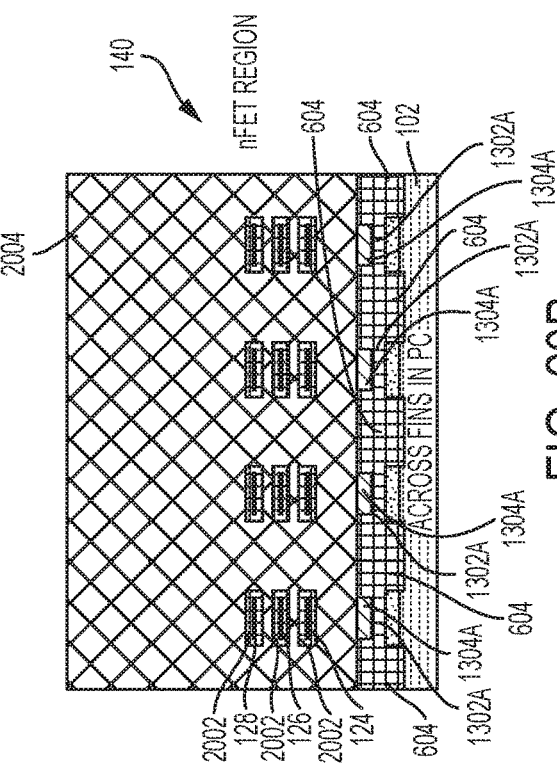
FIG. 20B depicts a cross-sectional view taken along line B-B of the semiconductor device shown in FIG. 20A.
Figure 20A:
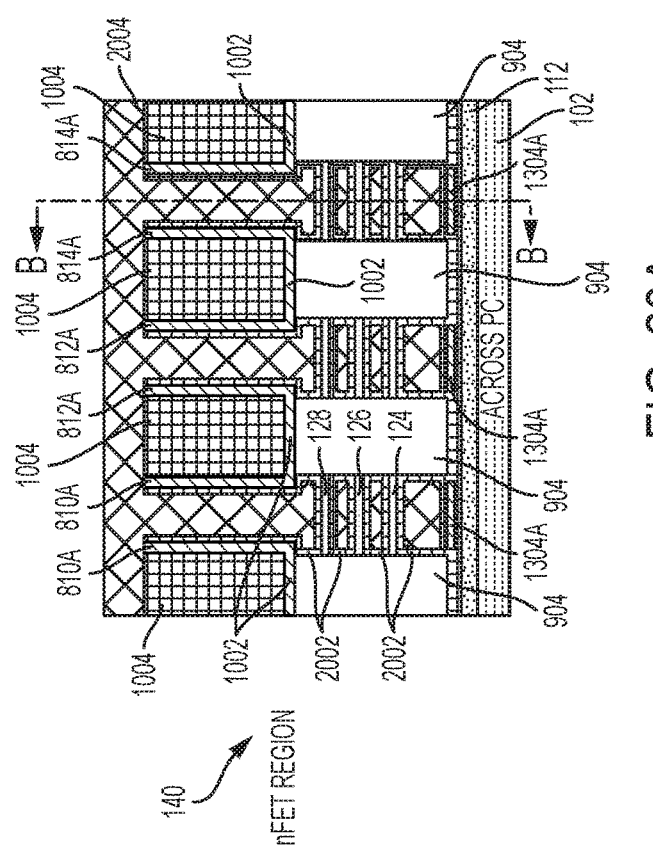
FIG. 20A depicts a cross-sectional view of the semiconductor device in the nFET region of the semiconductor wafer after a fabrication stage according to one or more embodiments of the present invention.

As best shown in FIGS. 17A and 17B, after a subsequent fabrication operation, the nFET region 140 remains protected by the amorphous silicon 1604, the nFET region 140 is blocked, and, as best shown in FIGS. 17C and 17D, amorphous silicon 1604, oxide 1302 and nitride 1304 have been removed in the pFET region 110 to expose sidewalls of the fin-shaped regions 504. According to one or more embodiments, the amorphous silicon 1604 is removed in the pFET region 110 using ammonium (e.g., NH$_4$OH or equivalents thereof). According to one or more embodiments, an isotropic etch (i.e., etchant that etches vertically and horizontally) is applied to remove most of the first nitride region 1304 and the first oxide region 1302 from the pFET region 110. The isotropic etch is stopped to leave first nitride region 1302B and the first oxide region 1302B in the pFET region 110 as depicted in FIG. 17D.

In FIGS. 18A, 18B, 18C and 18D, after a subsequent fabrication, the nFET region 140 is unblocked, and an ammonium etch (e.g., NH$_4$OH or equivalents thereof) is applied to the pFET region 110 and the nFET region 140 for a sufficient duration to completely remove the unprotected silicon (i.e., amorphous silicon 1604 in the nFET region 140, as well as the sacrificial silicon layers 424, 426 in the pFET region 110) from the nFET region 140 and the pFET region 110 (Block 2120). The silicon nanosheets 124, 126, 128 in the nFET region 140 are protected by oxide 1602 and SD regions 904, so the silicon nanosheets 124, 126, 128 are not removed by the ammonium etch.

FIGS. 19A, 19B, 19C and 19D depict the pFET region 110 and the nFET region 140 after oxide 1602 has been removed from around the top, bottom and sidewalls of the silicon nanosheets 124, 126, 128 in the nFET region 140, which is best shown in FIGS. 19A and 19B. After the fabrication stage depicted in FIGS. 19A, 19B, 19C and 19D, the silicon germanium nanosheets 414, 416, 418 that are necessary for forming a pFET device have been formed between S/D regions 902 in the pFET region 110, and the silicon nanosheets 124, 126, 128 that are necessary for forming a nFET device have been formed between S/D regions 904 in the nFET region 140. Accordingly, fabrication operations of the embodiments described herein allow for the efficient and effective formation, on the same substrate, of the necessary silicon germanium nanosheets 414, 416, 418 for forming a pFET device, along with the formation of the necessary silicon nanosheets 124, 126, 128 for forming an nFET device.

At this stage of the exemplary fabrication operations, a gate stack can be effectively and efficiently formed in the pFET region 110 and the nFET region 140 (Block 2122). The results of a gate formation in the pFET region 110 and the nFET region 140 is shown in FIGS. 20A, 20B, 20C, 20D. Forming the gate near the end of the fabrication operations is known generally as a gate-late fabrication process. Applying a known gate-late formation processes, a gate dielectric material 2002 (e.g., a high-K dielectric) is deposited followed by a metal liner (not shown) (e.g., a work-function metal) and a gate metal 2004 to complete the gate formation. In one or more embodiments, the metal liner can be, for example, TiN or TaN, and the gate metal 2004 can be aluminum or tungsten.

As an alternative to forming the same gate stack structure in the pFET region 110 and the nFET region 140, the gate structure formed in the pFET region 110 can be different than the gate structure formed in nFET region 140. In an exemplary approach, a first gate dielectric and a first gate stack are formed over the pFET region 110 and the nFET region 140. One of the pFET region 110 or the nFET region 140 is blocked. Subsequently, the first gate dielectric and the first gate stack are stripped from the uncovered region (either the pFET region 110 or the nFET region 140) and replaced with a second gate dielectric and a second gate stack.

FIGS. 22A to 24D depict alternative embodiments of the invention in which an additional layer of isolation under the nanosheet channels is provided, and in which the additional layer of isolation is formed earlier in the fabrication process. For the embodiments of the invention depicted in FIGS. 22A to 24D, the fabrication processes depicted in FIGS. 1A through 6D are repeated. After the operations shown in FIGS. 6A, 6B, 6C and 6D, the fabrication process moves to FIGS. 22A, 22B, 22C and 22D. To distinguish this portion of the embodiments, the pFET region and the nFET region will be identified as pFET region 110A and nFET region 140A.

FIGS. 22A, 22B, 22C, 22D deposit a thin liner of nitride (e.g., SiN) everywhere, and then a directional etch is applied to form sidewall spacers 2202 along sidewalls of the channel nanosheets 506, 504. The nitride protects the channel nanosheets 506, 504 from a subsequent oxidation operation.

In FIGS. 23A, 23B, 23C, 23D, the bottom SiGe layer 112 (shown in FIGS. 22A, 22B, 22C, 22D) is selectively oxidized using known selective oxidation processes to form a thicker oxidation layer 2204 underneath the channel nanosheets 506, 504.

In FIGS. 24A, 24B, 24C, 24D, the protective nitride layers 202, 503 and sidewalls 2202 are removed completely by applying an etch that is selective to the nitride over the oxide and over the silicon channel nanosheets 504, 506. The remaining operations proceed in the same manner as shown in FIGS. 7A through 20D, except, with the addition of the process operations shown in FIGS. 22A to 24D, the SiGe layer 112 has been oxidized to provide additional isolation under the nanosheet channels 504, 506. In some embodiments of the invention, the thicker oxidation layer 2204 provides sufficient device isolation and the thick silicon selective etch operation can be made optional.

FIGS. 25A to 28D depict alternative embodiments of the invention in which an additional layer of isolation under the nanosheet channels is provided, and in which the additional layer of isolation is formed earlier in the fabrication process. For the embodiments of the invention depicted in FIGS. 25A to 28D, the fabrication processes depicted in FIGS. 1A through 6D are repeated. After the operations shown in FIGS. 6A, 6B, 6C and 6D, the fabrication process moves to FIGS. 22A through 24D. After the operations shown in FIG. 24D, the operations in FIGS. 7A to 11D are applied with appropriate modification to the structure shown in FIGS. 22A through 22D. After the operations shown in FIG. 11D (as applied to FIGS. 22A through 22D), the methodology moves to FIGS. 25A through 28D. To distinguish this portion of the embodiments, the pFET region and the nFET region will be identified as pFET region 110B and nFET region 140B.

In FIGS. 25A, 25B, 25C, 25D, a thin liner of nitride (e.g., SiN) is deposited everywhere, and then a directional etch is applied to form the nitride into sidewall spacers 2502 over the thin dielectric 702. The nitride protects the channel nanosheets 506, 504 from a subsequent operations.

In FIGS. 26B, 26D, the oxide 2204 is recessed to form oxide 2204A and expose portions of the thick silicon layers 122, 122A. As further depicted in FIGS. 27C and 27D, the first silicon nanosheet 122A in the pFET region 110B, along with the sacrificial cap silicon nanosheets 428, have been removed. As further depicted in FIGS. 27A and 27B, the first silicon nanosheet 122 in the nFET region 140B has been removed. According to embodiments of the present invention, the removal of the first silicon nanosheet layer 122A, the sacrificial cap silicon nanosheets 428, and the first silicon nanosheet layer 122 are accomplished using a process referred to herein as a "thick silicon selective etch." As previously described herein, the thickness of the first silicon nanosheet layer 122A, the sacrificial cap silicon nanosheets 428, and the first silicon nanosheet layer 122 are intentionally selected to greater than the thickness of the silicon nanosheets 124, 136, 128, 424, 426. As a non-limiting example, the thickness of each of the silicon nanosheets 124, 136, 128, 424, 426 can be approximately 5 nanometers (nm), and the thickness of each of the first silicon nanosheet layer 122A, the sacrificial cap silicon nanosheets 428, and the first silicon nanosheet layer 122 can be approximately 30 nm. Thus, according to embodiments of the present invention, by providing selected nanosheets that are thicker than other nanosheet, and by exposing more surface area of the thicker layers than other nanosheets, an etch process that is selective to (i.e., "faster" for) both certain materials (e.g., silicon) and the amount of exposed surface area can be applied at this stage of the fabrication process to completely remove the thicker silicon nanosheets (e.g., silicon nanosheets 122A, 428, 122) without substantially disturbing the thinner silicon nanosheet (e.g., silicon nanosheets 124, 136, 128, 424, 426). Accordingly, a suitable etchant for removing to the thicker silicon nanosheets 122A, 428, 122 without substantially disturbing the thinner silicon nanosheet 124, 136, 128, 424, 426 includes but is not limited to various ammonia-based etchants (e.g., $NH_4OH$ or equivalents thereof).

In FIGS. 28B, 28D, the sidewalls 2502 and thin oxide layer 702 have been removed. After the operations shown in FIGS. 28A, 28B, 28C, 28D, the operations shown in FIGS. 13A to 20D are applied with appropriate modifications to account for the structure of the nanosheet device after the operations shown in FIGS. 28A, 28B, 28C, 28D.

FIGS. 29A to 39D depict alternative embodiments of the invention in which an additional thicker layer of isolation under the nano sheet channels is provided, and in which the additional thicker layer of isolation is formed even earlier in the fabrication process. For the embodiments of the invention depicted in FIGS. 29A to 39D, after the process depicted in FIGS. 29A-39D, the fabrication processes depicted in FIGS. 7A through 20D are repeated and applied to the semiconductor device as configured after the operation shown in FIGS. 39A through 39D. To distinguish this portion of the embodiments, the pFET region and the nFET region will be identified as pFET region 110C and nFET region 140C.

Figure 29A:
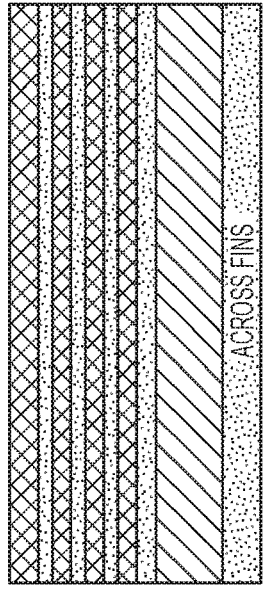
Figure 29B:
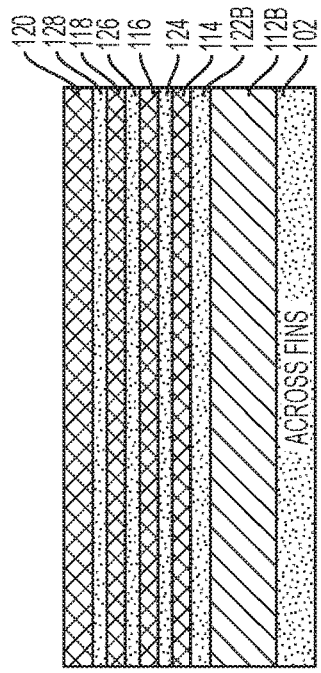
FIG. 29B depicts a cross-sectional view of the semiconductor device shown in FIG. 29A rotated clockwise by 90 degrees.
Figure 29C:
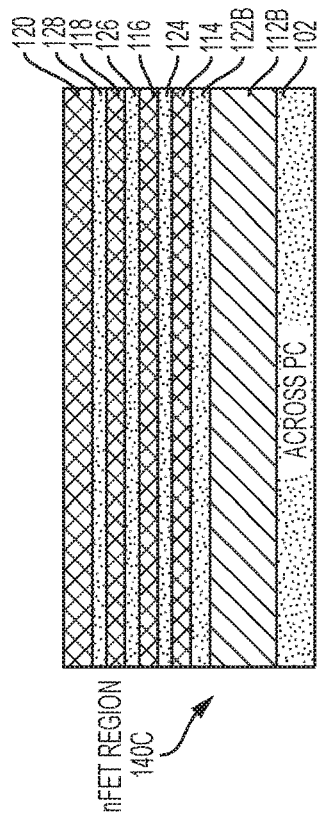
FIG. 29C depicts a cross-sectional view of a semiconductor device in a pFET region of the semiconductor wafer after a fabrication stage according to one or more embodiments of the present invention.
Figure 29D:
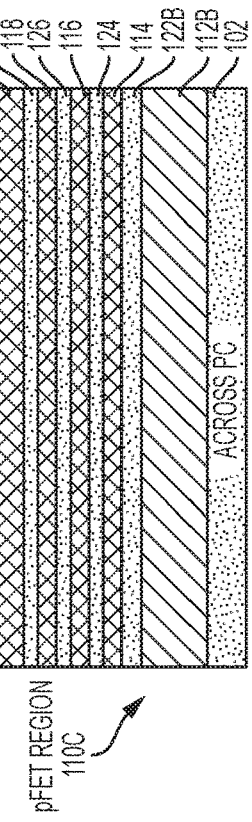
FIG. 29D depicts a cross-sectional view of the semiconductor device shown in FIG. 29C rotated clockwise by 90 degrees.

Turning now to a more detailed description of the embodiment depicted in FIGS. 29A through 39D, at initial stages of the described fabrication processes, the nFET region 140C and the pFET region 110C are the same, and, accordingly, the cross-sections depicted in FIGS. 29A, 29B, 29C and 29D are the same. As shown in FIG. 29A, an alternating series of sacrificial silicon germanium nanosheet layers 112B, 114, 116, 118, 120 and silicon nanosheet layers 122B, 124, 126, 128 are formed in a stack on the bulk silicon substrate 102. Specifically, moving in the direction from bottom to top, the first silicon germanium nanosheet 112B is formed over the silicon substrate 102, and the first silicon nanosheet layer 122B is formed over the first silicon germanium nanosheet 112B. According to embodiments of the present invention, the first silicon nanosheet layer 122B is formed to a thickness dimension (T) that is less than the thickness dimension of the first silicon germanium nanosheet 112B. According to embodiments of the present invention, the next three silicon nanosheet layers 124, 126, 128 are each formed to a thickness dimension that is less than the thickness dimension of the next three silicon germanium nanosheet layers 114, 116, 118. The last (or top) silicon germanium nanosheet layer 120, which functions as a sacrificial cap, is formed to a thickness dimension that is greater than the thickness dimension of silicon germanium nanosheet layers 114, 116, 118. In some embodiments of the invention, the thick silicon germanium layer 112B can include a lower germanium concentration (e.g., about 50% or less) in order to avoid defects that can accompany growing a thick silicon germanium layer with a high germanium concentration.

In one or more embodiments, the alternating series of sacrificial silicon germanium nanosheet layers 112B, 114, 116, 118, 120 and silicon nanosheet layers 122B, 124, 126, 128 are formed by epitaxially growing one layer and then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

Figure 30A:
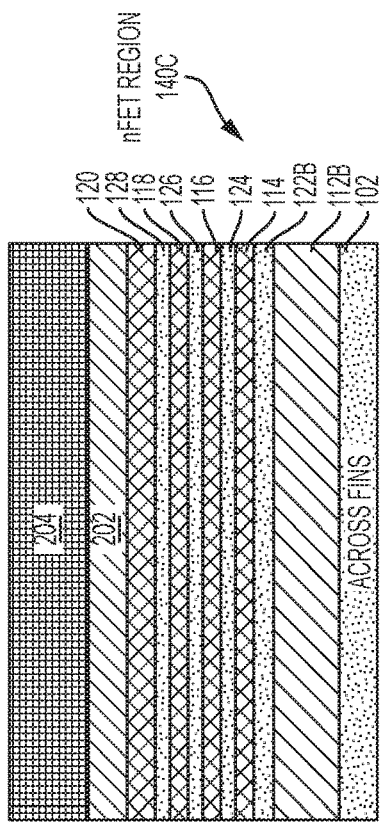
FIG. 30A depicts a cross-sectional view of the semiconductor device in the nFET region of the semiconductor wafer after a fabrication stage according to one or more embodiments of the present invention.
Figure 30B:
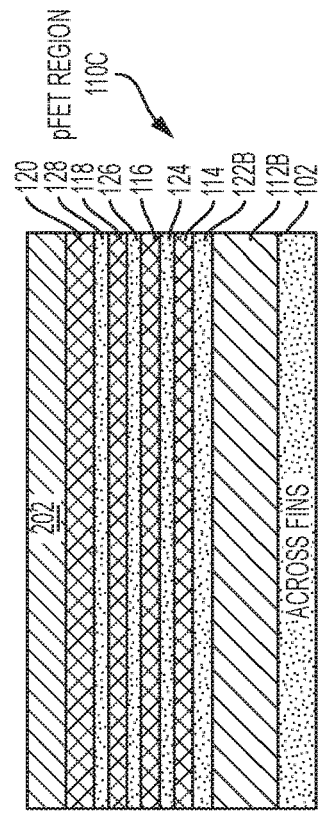
FIG. 30B depicts a cross-sectional view of the semiconductor device shown in FIG. 30A rotated clockwise by 90 degrees.
Figure 30C:
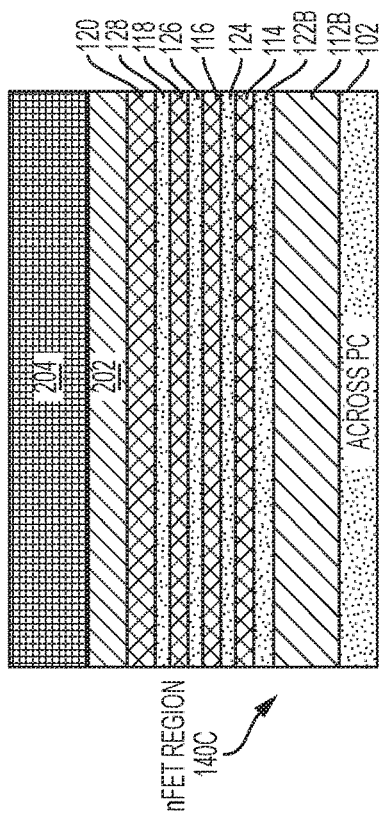
Figure 30D:
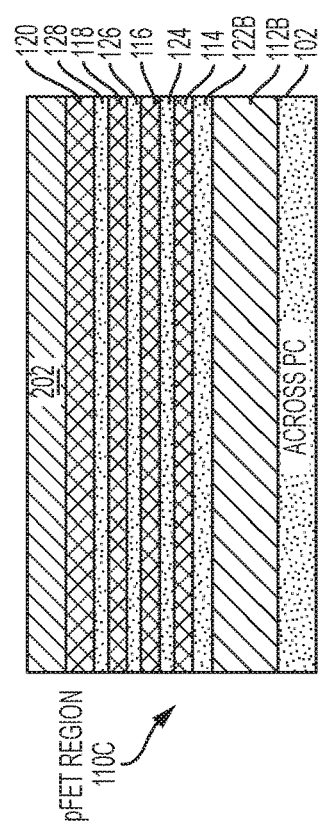

As depicted in FIGS. 30A, 30B, 30C and 30D, a nitride hard mask 202 has been deposited over the sacrificial cap silicon germanium nanosheet layer 120, which covers the pFET region 110C (shown in FIGS. 30C and 30D) and the nFET region 140C (shown in FIGS. 30A and 30B). As depicted in FIGS. 30A and 30B, a mask block 204 has been deposited over the sacrificial cap silicon germanium nanosheet layer 120 to cover the nFET region 140C but not cover the pFET region 110C.

Figure 31A:
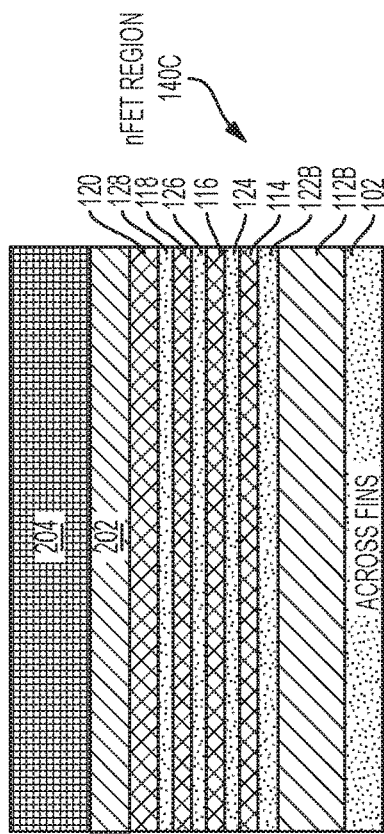
Figure 31B:
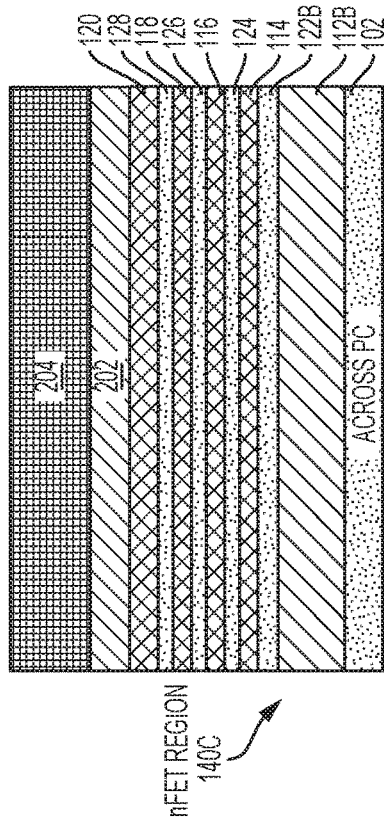
Figure 31C:
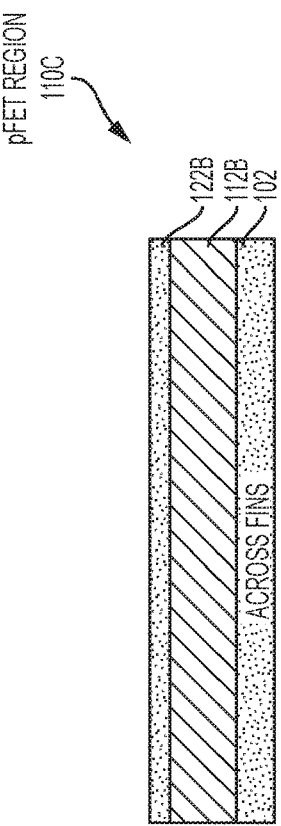
Figure 31D:
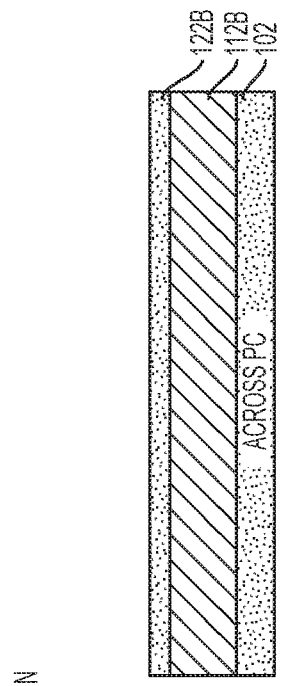

As depicted in FIGS. 31C and 31D, the portion of the nitride hard mask 202 that is over the pFET region 110 has been removed, and the alternating series of silicon germanium nanosheet layers 114, 116, 118, 120 and silicon nanosheet layers 122B, 124, 126, 128 have been recessed, stopping partly into the first silicon nanosheet layer 122B. Nanosheet layers in the nFET region 140C remain intact during the above-described removal and recess processes because, as shown in FIGS. 31A and 31B, they are protected by the block mask 204.

Figure 32B:
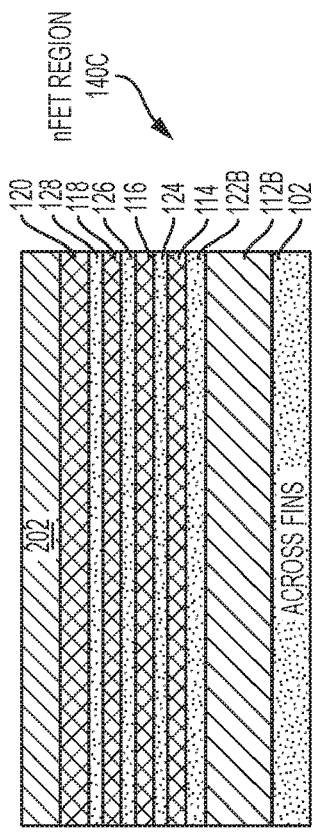
Figure 32D:
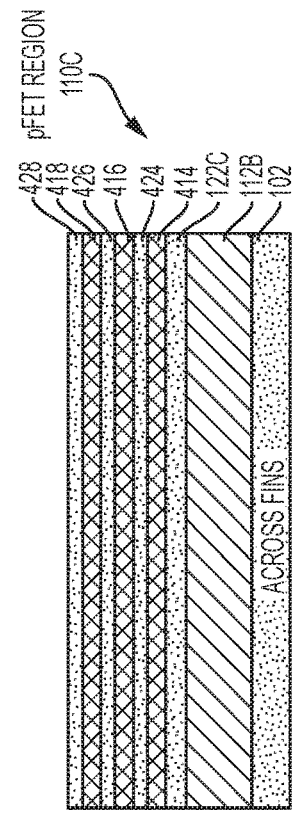
Figure 32A:
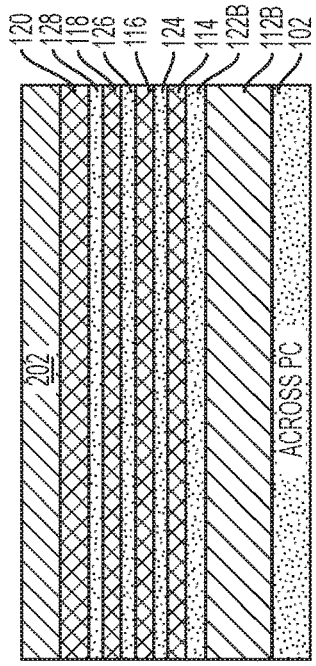
Figure 32C:
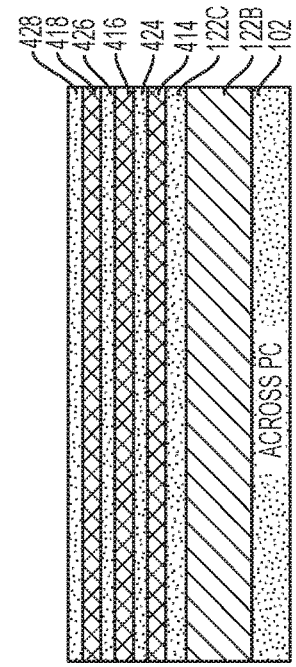

As depicted in FIGS. 32A and 32B, the block mask 204 covering the nFET region 140C has been stripped away. As depicted in FIGS. 32C and 32D, the first silicon nanosheet layer 122B has been re-grown to form, in the pFET region 110C, a new first silicon nanosheet layer 122C and a new alternating series of silicon germanium nanosheet layers 414, 416, 418 and sacrificial silicon nanosheet layers 424, 426, 428 formed in a stack on the new first silicon nanosheet layer 122C. Specifically, moving in the direction from bottom to top, the first silicon germanium nanosheet 112B is formed over the silicon substrate 102, and the first silicon nanosheet layer 122C is formed over the first silicon germanium nanosheet 112B. According to embodiments of the present invention, the first silicon nanosheet layer 122C is formed to a thickness dimension (T) that is less than the thickness dimension of the first silicon germanium nanosheet 112B. According to embodiments of the present invention, the next three silicon nanosheet layers 424, 426, 428 are each formed to a thickness dimension that is greater than the thickness dimension of the next three silicon germanium nanosheet layers 414, 416, 418. The last (or top) silicon nanosheet layer 428, which functions as a sacrificial cap, is formed to a thickness dimension that is greater than the thickness dimensions of silicon nanosheet layers 424, 426.

As depicted in FIGS. 33C and 33D, a new nitride hard mask 502 has been deposited over the sacrificial cap silicon nanosheet layer 428 in the pFET region 140C. As best shown in FIGS. 33B and 33D, known processing techniques have been applied to the pFET region 110C and the nFET region 140C to form a plurality of fin-shaped regions 504 in the pFET region 110C and a plurality of fin-shaped regions 506 in the nFET region 140C. As shown in FIG. 33D, each of the fin-shaped regions 504 in the pFET region 110C includes an alternating series of silicon nanosheet layers 122C, 424, 426, 428 and silicon germanium nanosheet layers 414, 416, 418 formed in a stack. As shown in FIG. 33B, each of the fin-shaped regions 506 in the nFET region 140C includes an alternating series of sacrificial silicon germanium nanosheet layers 112B, 114, 116, 118, 120 and silicon nanosheet layers 122B, 124, 126, 128 formed in a stack.

The process to form the fin-shaped regions 504 shown in FIG. 33D includes patterning the nitride hard mask 502 into the desired dimensions of the plurality of individual fin-shaped regions 504. The patterning of the hard mask 502 is commensurate with a desired footprint and location of fin-shaped region 504, which will be used to form the channel regions of the ultimate pFET semiconductor device that will be formed in the pFET region 110C. According to an exemplary embodiment, a resist film (not shown) is deposited on the hard mask 502 and patterned with the footprint and location of each of fin-shaped regions 504. In one example, RIE is used to form the hard masks 502 and the fin-shaped regions 504.

Similar to the process used to form the fin-shaped regions 504 shown in FIG. 33D, the process to form the fin-shaped regions 506 shown in FIG. 33B includes patterning the nitride hard mask 202 into the desired dimensions of the plurality of individual fin-shaped regions 506. The patterning of the hard mask 202 is commensurate with a desired footprint and location of fin-shaped region 506, which will be used to form the channel regions of the nFET semiconductor device that will be formed in the nFET region 140C. According to an exemplary embodiment, a resist film (not shown) is deposited on the hard mask 202 and patterned with the footprint and location of each of fin-shaped region 506. In one example, RIE is used to form the hard masks 202 and the fin-shaped regions 506.

As depicted in FIGS. 34B and 34D, one or more dielectric materials (e.g., an oxide) are deposited in trenches between the fin-shaped regions 504, 506, and then one or more recess and planarization techniques (e.g., chemical mechanical planarization (CMP)) are applied to recess and planarize the dielectric materials to a selected level and form isolation regions 3402, 3404 in the pFET region 110C and the nFET region 140C, respectively. More specifically, as depicted in FIG. 34D, one or more dielectric materials (e.g., an oxide) are deposited in the trenches between the fin-shaped regions 504, and then one or more recess and planarization techniques (e.g., CMP) are applied to recess and planarize the dielectric materials to a selected level and form isolation regions 3402 in the pFET region 110C. Similarly, as depicted in FIG. 34B, one or more dielectric materials (e.g., an oxide) are deposited in the trenches between the fin-shaped regions 506, and then one or more recess and planarization techniques (e.g., CMP) are applied to recess and planarize the dielectric materials to a selected level and form STI regions 604 in the nFET region 140C.

In FIGS. 35B and 35D, the isolation regions 3404, 3402 are further recessed until the selected level of the isolation regions 3402A is below the first silicon nanosheets 122C and within the first silicon germanium nanosheets 112B of the pFET region 110C. The selected level of the isolation regions 3404A is below the first silicon nanosheets 122B and within the first silicon germanium nanosheets 112B of the nFET region 140C.

In FIGS. 36A, 36B, 365C, 36D, a thin liner of nitride (e.g., SiN) is deposited everywhere, and then a directional etch is applied to form the nitride into sidewall spacers 3602. The nitride protects the channel nanosheets 506, 504 from a subsequent oxidation operations As depicted in FIGS. 37B and 37D, one or more dielectric materials (e.g., an oxide) are deposited in trenches between the fin-shaped regions 504, 506, and then one or more recess and planarization techniques (e.g., chemical mechanical planarization (CMP)) are applied to recess and planarize the dielectric materials to a selected level and form isolation regions 3402B, 3404B in the pFET region 110C and the nFET region 140C, respectively.

In FIGS. 38A, 38B, 38C, 38D, an oxidation operation is performed that oxidizes the thick silicon germanium layer 112B to form oxidized regions 3404C in the nFET region 140c, as well as oxidized regions 3402C in the pFET region 110C. The nitride layers 202, 502 and sidewalls 3602 protect the fin-shaped regions 504, 506 from oxidation.

In FIGS. 39A, 39B, 39C, 39D, the oxide 3404C, 3402C is recessed to form oxide 3404D, 3402D, and a selective etch is applied to remove the nitride layers 202, 502 and sidewalls 3602. Oxides 3404D, 3402D can provide full isolation of the channel and sacrificial nanosheets from the substrate prior to the formation of dummy gate structures. For the embodiments of the invention depicted in FIGS. 29A to 39D, after the process depicted in FIGS. 29A-39D, the fabrication processes depicted in FIGS. 7A through 20D are repeated and applied to the semiconductor device as configured after the operation shown in FIGS. 39A through 39D. Because the oxides 3404D, 3402D can provide full insolation, the thick silicon selective etch operation is optional in this embodiment of the invention.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

What is claimed is:

1. A method of opening an insulation region during fabrication of a nanosheet channel field effect transistor (FET), the method comprising:
    forming a first sacrificial nanosheet across from a major surface of a substrate;
    forming a first nanosheet stack on an opposite side of the first sacrificial nanosheet from the major surface of the substrate, wherein the first nanosheet stack comprises alternating channel nanosheets and sacrificial stack nanosheets;
    exposing a surface area of the first sacrificial nano sheet;
    exposing surface areas of the alternating channel nanosheets and surface areas of the alternating sacrificial stack nanosheets, wherein the exposed surface area of the first sacrificial nanosheet is greater than each of the exposed surface areas of the alternating channel nanosheets and the sacrificial stack nanosheets; and
    opening the insulation region by applying an etchant to the exposed surface area of the first sacrificial nanosheet, the exposed surface area of the alternating channel nanosheets, and the exposed surface areas of the alternating sacrificial stack nanosheets;
    wherein the etchant is configured to include an etchant selectivity;
    wherein the etchant selectivity is based at least in part on the type of material to which the etchant is applied;
    wherein the etchant selectivity is further based at least in part on the amount of surface area to which the etchant is applied.

2. The method of claim 1, wherein the first sacrificial nanosheet comprises silicon.

3. The method of claim 2, wherein:
    the alternating sacrificial stack nanosheets comprise silicon; and
    the alternating channel nanosheets comprise silicon germanium.

4. The method of claim 3, wherein the etchant comprises ammonium.

5. The method of claim 2, wherein:
    the alternating sacrificial stack nanosheets comprise silicon germanium; and
    the alternating channel nanosheets comprise silicon.

6. The method of claim 5, wherein the etchant comprises ammonium.

7. The method of claim 1, wherein applying the etchant removes the first sacrificial nanosheet.

8. The method of claim 7, wherein applying the etchant does not remove the alternating sacrificial stack nanosheets.

9. The method of claim 8, wherein applying the etchant does not remove the alternating channel nanosheets.

10. The method of claim 9 further comprising forming a dielectric material in at least a portion of a space that was occupied by the first sacrificial nano sheet.

11. The method of claim 9 further comprising converting at least one of the alternating sacrificial stack nanosheets to a dielectric oxide.

12. The method of claim 11 further comprising forming a dielectric electric material in at least a portion of a space that was occupied by the first sacrificial nanosheet, wherein an insulating dielectric comprises the dielectric oxide and the dielectric material.

13. A method of opening insulation regions during the fabrication of nanosheet channel field effect transistors (FETs), the method comprising:
    forming a substrate comprising a major surface having a first region and a second region;
    forming a sacrificial nanosheet across from the major surface of the substrate, wherein the sacrificial nanosheet comprises a first sacrificial nanosheet across from the first region and a second sacrificial nanosheet across from the second region;
    forming a nanosheet stack on an opposite side of the sacrificial nanosheet from the major surface of the substrate, wherein the nanosheet stack comprises a first nanosheet stack on an opposite side of the first sacrificial nanosheet from the first region, wherein the nanosheet stack further comprises a second nanosheet stack on an opposite side of the second sacrificial nanosheet from the second region, wherein the first nanosheet stack comprises alternating first channel nanosheets and first sacrificial stack nanosheets, wherein the second nanosheet stack comprises alternating second channel nanosheets and second sacrificial stack nanosheets;
    exposing a surface area of the first sacrificial nano sheet;
    exposing a surface area of the second sacrificial nanosheet;
    exposing surface areas of the alternating first channel nanosheets and surface areas of the alternating first sacrificial stack nanosheets;
    exposing surface areas of the alternating second channel nanosheets and surface areas of the alternating second sacrificial stack nanosheets;
    wherein the exposed surface area of the first sacrificial nanosheet is greater than the exposed surface area of each of the alternating first channel nanosheets and each of the alternating first sacrificial stack nanosheets;
    wherein the exposed surface area of the second sacrificial nanosheet is greater than the exposed surface area of each of the alternating second channel nanosheets and each of the alternating second sacrificial stack nanosheets; and
    opening the insulation regions by applying an etchant to the exposed surface areas of the first sacrificial nanosheet, the second sacrificial nanosheet, the alternating first channel nanosheets and first sacrificial stack nanosheets, and the alternating second channel nanosheets and second sacrificial stack nanosheets;
    wherein the etchant is configured to include an etchant selectivity;
    wherein the etchant selectivity is based at least in part on the type of material to which the etchant is applied;
    wherein the etchant selectivity is further based at least in part on the amount of surface area to which the etchant is applied.

14. The method of claim 13, wherein:
the first sacrificial nanosheet and the second sacrificial nanosheet comprise silicon;
the alternating first sacrificial stack nanosheets comprise silicon; and
the alternating first channel stack nanosheets of the first region comprise silicon germanium.

15. The method of claim 14, wherein:
the alternating second sacrificial stack nanosheets comprise silicon germanium; and
the alternating second channel nanosheets comprise silicon.

16. The method of claim 15, wherein the etchant comprises ammonium.

17. The method of claim 13, wherein:
the etchant removes the first sacrificial nanosheet and the second sacrificial nanosheet; and the etchant does not remove the alternating first sacrificial nanosheets, the alternating first channel stack nanosheets, the alternating second sacrificial stack nanosheets over the second region, and the alternating channel nanosheets over the second region.

18. The method of claim 13 further comprising:

forming a dielectric in at least a portion of a first space that was occupied by the first sacrificial nanosheet; and forming the dielectric in at least a portion of a second space that was occupied by the second sacrificial nanosheet.

19. The method of claim 13, wherein forming the nanosheet stack comprises:

forming the first nanosheet stack on the opposite side of the sacrificial nanosheet from the first region and the second region;

removing the first nanosheet stack on the opposite side of the sacrificial nanosheet from the second region; and forming the second nanosheet stack on the opposite side of the sacrificial nanosheet from the second region.

* * * * *